US012293999B2

(12) United States Patent
Young et al.

(10) Patent No.: US 12,293,999 B2
(45) Date of Patent: May 6, 2025

(54) 3D SEMICONDUCTOR PACKAGE INCLUDING MEMORY ARRAY

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Han-Jong Chia, Hsinchu (TW); Sheng-Chen Wang, Hsinchu (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 14 days.

(21) Appl. No.: 17/814,194

(22) Filed: Jul. 21, 2022

(65) Prior Publication Data
US 2022/0359486 A1 Nov. 10, 2022

Related U.S. Application Data

(63) Continuation of application No. 17/138,270, filed on Dec. 30, 2020, now Pat. No. 11,444,069.
(Continued)

(51) Int. Cl.
*H01L 25/065* (2023.01)
*H01L 23/00* (2006.01)
(Continued)

(52) U.S. Cl.
CPC ............ *H01L 25/18* (2013.01); *H01L 23/481* (2013.01); *H01L 24/08* (2013.01); *H01L 24/80* (2013.01);
(Continued)

(58) Field of Classification Search
CPC ....... H01L 25/18; H01L 23/481; H01L 24/08; H01L 24/80; H01L 25/0657; H01L 25/50;
(Continued)

(56) References Cited

U.S. PATENT DOCUMENTS 9,595,530 B1 3/2017 Zhou
10,651,182 B2 5/2020 Morris et al.
(Continued)

FOREIGN PATENT DOCUMENTS

CN 107658317 A 2/2018
CN 109075170 A 12/2018
(Continued)

*Primary Examiner* — Thanh Y. Tran
(74) *Attorney, Agent, or Firm* — Slater Matsil, LLP

(57) ABSTRACT

Routing arrangements for 3D memory arrays and methods of forming the same are disclosed. In an embodiment, a semiconductor device includes a memory array including a gate dielectric layer contacting a first word line and a second word line; and an oxide semiconductor (OS) layer contacting a source line and a bit line, the gate dielectric layer being disposed between the OS layer and each of the first word line and the second word line; an interconnect structure over the memory array, a distance between the second word line and the interconnect structure being less than a distance between the first word line and the interconnect structure; and an integrated circuit die bonded to the interconnect structure opposite the memory array, the integrated circuit die being bonded to the interconnect structure by dielectric-to-dielectric bonds and metal-to-metal bonds.

20 Claims, 58 Drawing Sheets

Related U.S. Application Data

(60) Provisional application No. 63/045,279, filed on Jun. 29, 2020.

(51) Int. Cl.

| | | |
|---|---|---|
| *H01L 23/48* | (2006.01) | |
| *H01L 25/00* | (2006.01) | |
| *H01L 25/18* | (2023.01) | |
| *H01L 29/24* | (2006.01) | |
| *H10B 51/20* | (2023.01) | |
| *H10B 51/30* | (2023.01) | |

(52) U.S. Cl.
CPC ........... *H01L 25/0657* (2013.01); *H01L 25/50* (2013.01); *H01L 29/24* (2013.01); *H10B 51/20* (2023.02); *H10B 51/30* (2023.02); *H01L 2224/08145* (2013.01); *H01L 2224/80895* (2013.01); *H01L 2224/80896* (2013.01); *H01L 2225/06541* (2013.01); *H01L 2924/1431* (2013.01); *H01L 2924/1441* (2013.01)

(58) Field of Classification Search
CPC ........... H01L 29/24; H01L 2224/08145; H01L 2224/80895; H01L 2224/80896; H01L 2225/06541; H01L 2924/1431; H01L 2924/1441; H10B 51/20; H10B 51/30
See application file for complete search history.

(56) References Cited

U.S. PATENT DOCUMENTS

| | | |
|---|---|---|
| 10,741,527 B2 | 8/2020 | Tagami et al. |
| 11,043,532 B2 | 6/2021 | Yokoyama et al. |
| 2002/0028541 A1 | 3/2002 | Lee et al. |
| 2010/0140679 A1 | 6/2010 | Walker |
| 2015/0179577 A1 | 6/2015 | Tobitsuka et al. |
| 2016/0141419 A1 | 5/2016 | Baenninger et al. |
| 2019/0081069 A1 | 3/2019 | Lu et al. |
| 2019/0157310 A1 | 5/2019 | Glass et al. |
| 2020/0006299 A1 | 1/2020 | Liu et al. |
| 2020/0013791 A1 | 1/2020 | Or-Bach et al. |
| 2020/0075631 A1 | 3/2020 | Dong et al. |
| 2020/0258904 A1* | 8/2020 | Kai .................. H10B 41/60 |
| 2020/0328186 A1 | 10/2020 | Liu |
| 2020/0343161 A1* | 10/2020 | Wu .................. H10B 41/40 |
| 2021/0126008 A1 | 4/2021 | Tanabe et al. |

FOREIGN PATENT DOCUMENTS

| | | |
|---|---|---|
| CN | 109119426 A | 1/2019 |
| CN | 110121779 A | 8/2019 |
| CN | 110192269 A | 8/2019 |
| CN | 110268523 A | 9/2019 |
| CN | 110970446 A | 4/2020 |
| CN | 113380829 A | 9/2021 |
| KR | 20170095801 A | 8/2017 |
| KR | 20200008157 A | 1/2020 |
| KR | 20200008606 A | 1/2020 |
| KR | 20200036771 A | 4/2020 |
| TW | 201834152 A | 9/2018 |
| TW | 201841344 A | 11/2018 |
| WO | 2019052127 A1 | 3/2019 |
| WO | 2019152226 A1 | 8/2019 |

\* cited by examiner

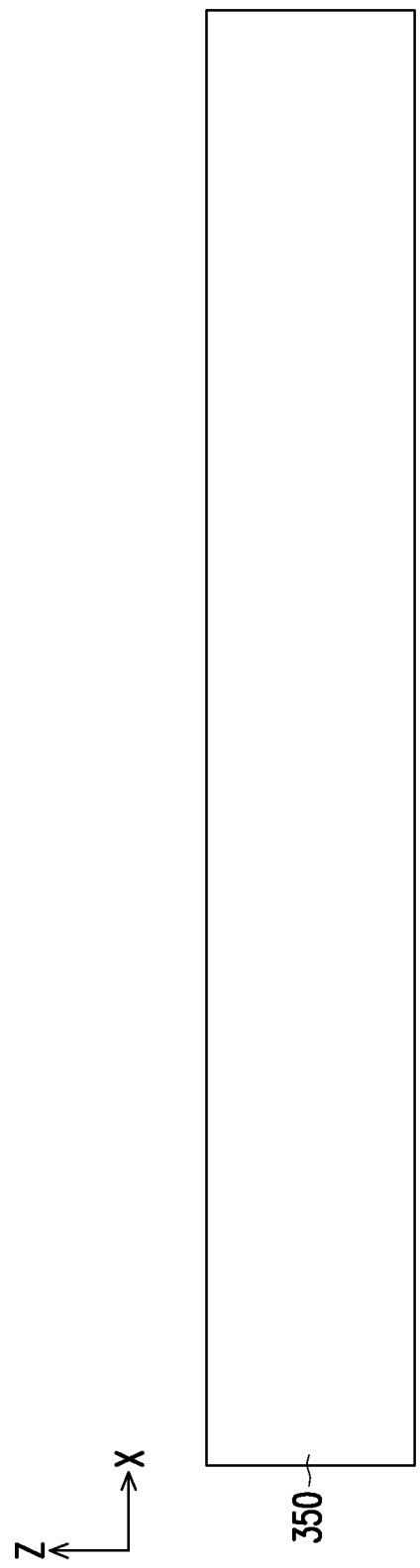

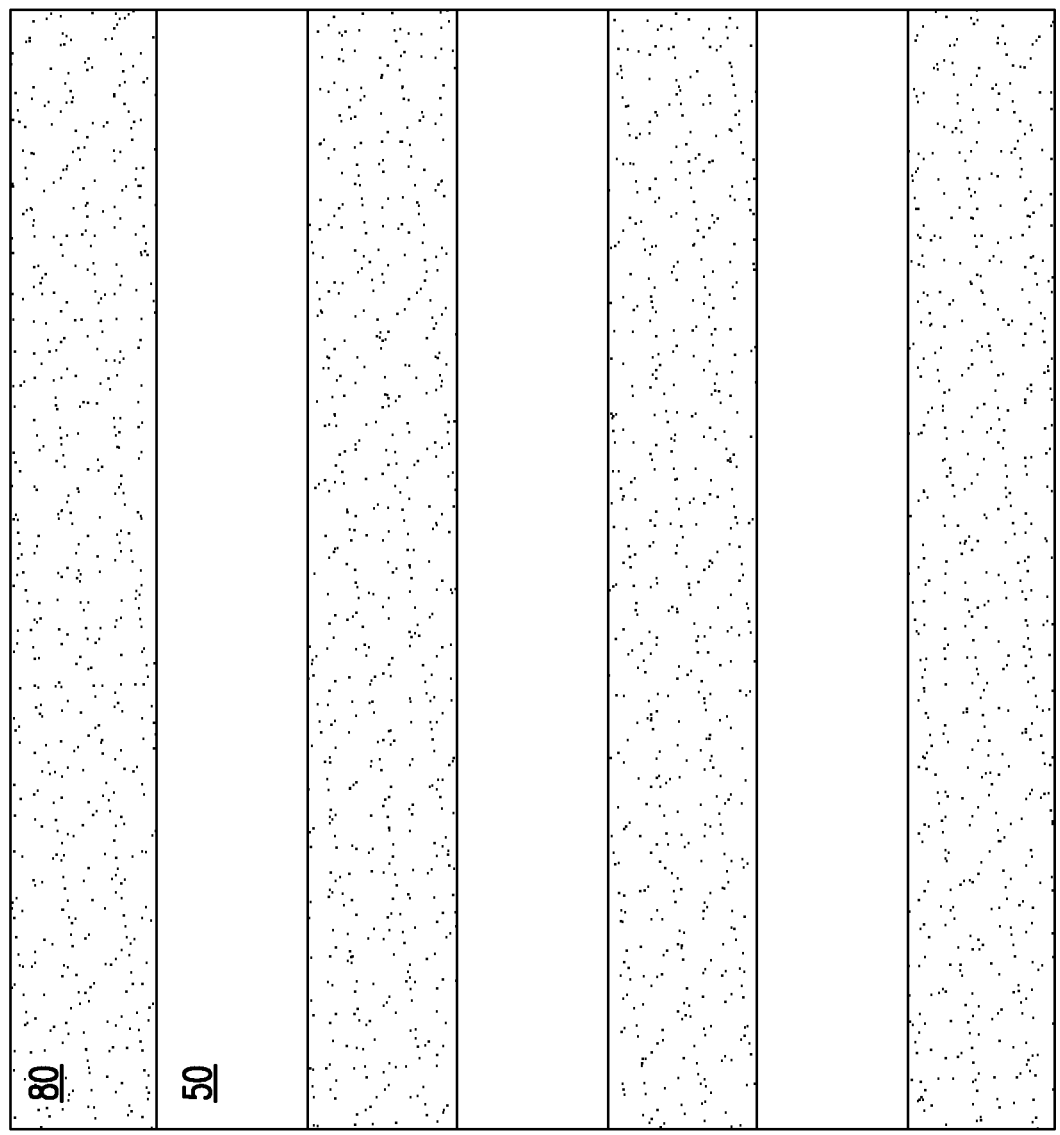

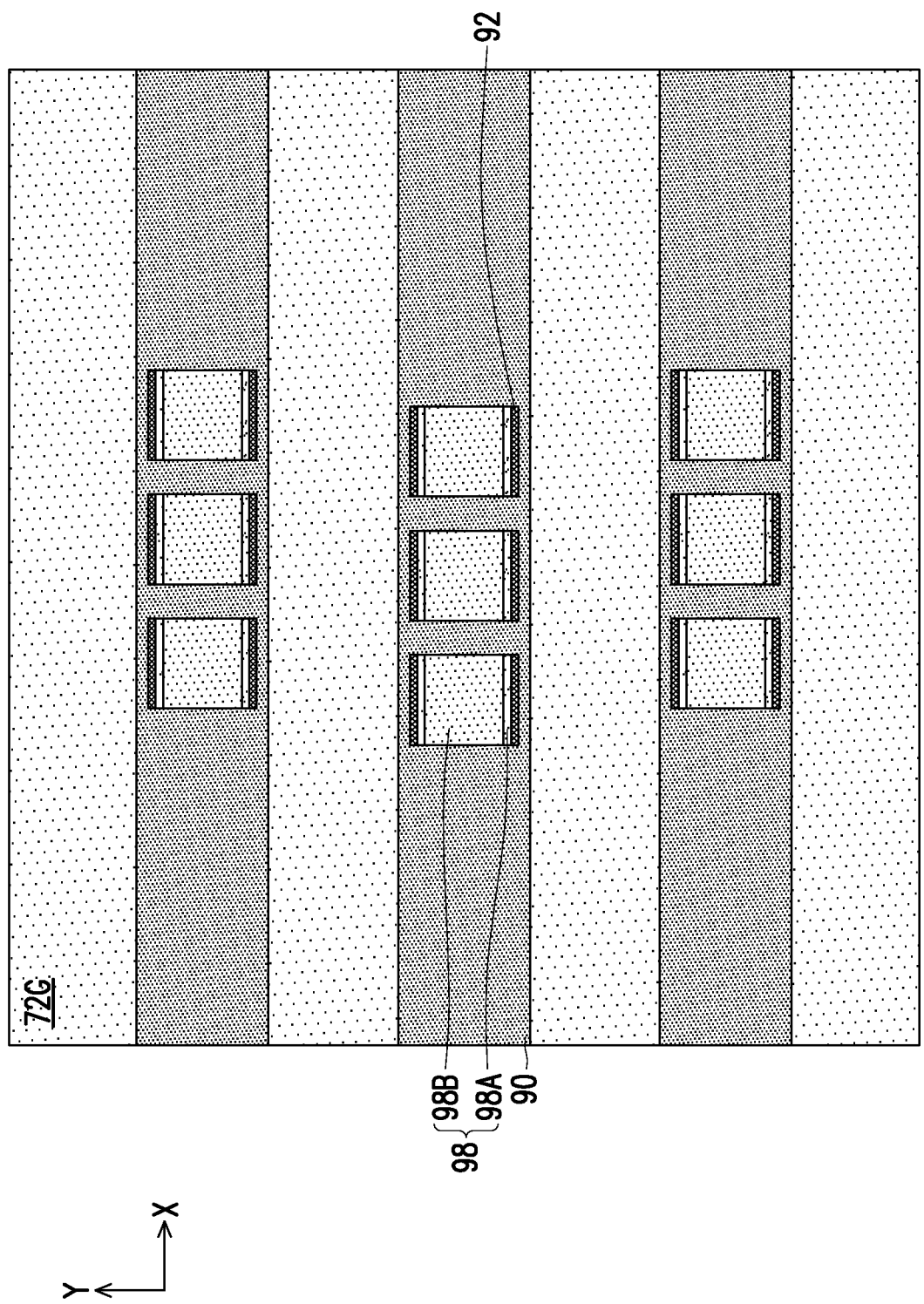

3D SEMICONDUCTOR PACKAGE INCLUDING MEMORY ARRAY

PRIORITY CLAIM AND CROSS-REFERENCE

This application is a continuation of U.S. patent application Ser. No. 17/138,270, filed on Dec. 30, 2020, and entitled "3D Semiconductor Package Including Memory Array," now U.S. Pat. No. 11,444,069, issued Sep. 13, 2022, which claims the benefit of U.S. Provisional Patent Application No. 63/045,279, filed on Jun. 29, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FERAM, or FRAM). Advantages of FERAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 8A, 8B, 9, 10A, 10B, 11A, 11B, 12A, 12B, 13A, 13B, 14A, 14B, 15A, 15B, 16A, 16B, 17A, 17B, 18A, 18B, 19A, 19B, 19C, 20A, 20B, 20C, 21, 22, 23, 24, 25, 26, 27, 28, 29, 30A, 30B, 30C, 30D, 31A, 31B, 31C, 32, 33, 34, 35, 36, and 37 illustrate varying views of manufacturing a semiconductor device including a memory array in accordance with some embodiments.

DETAILED DESCRIPTION

Figure 1A:
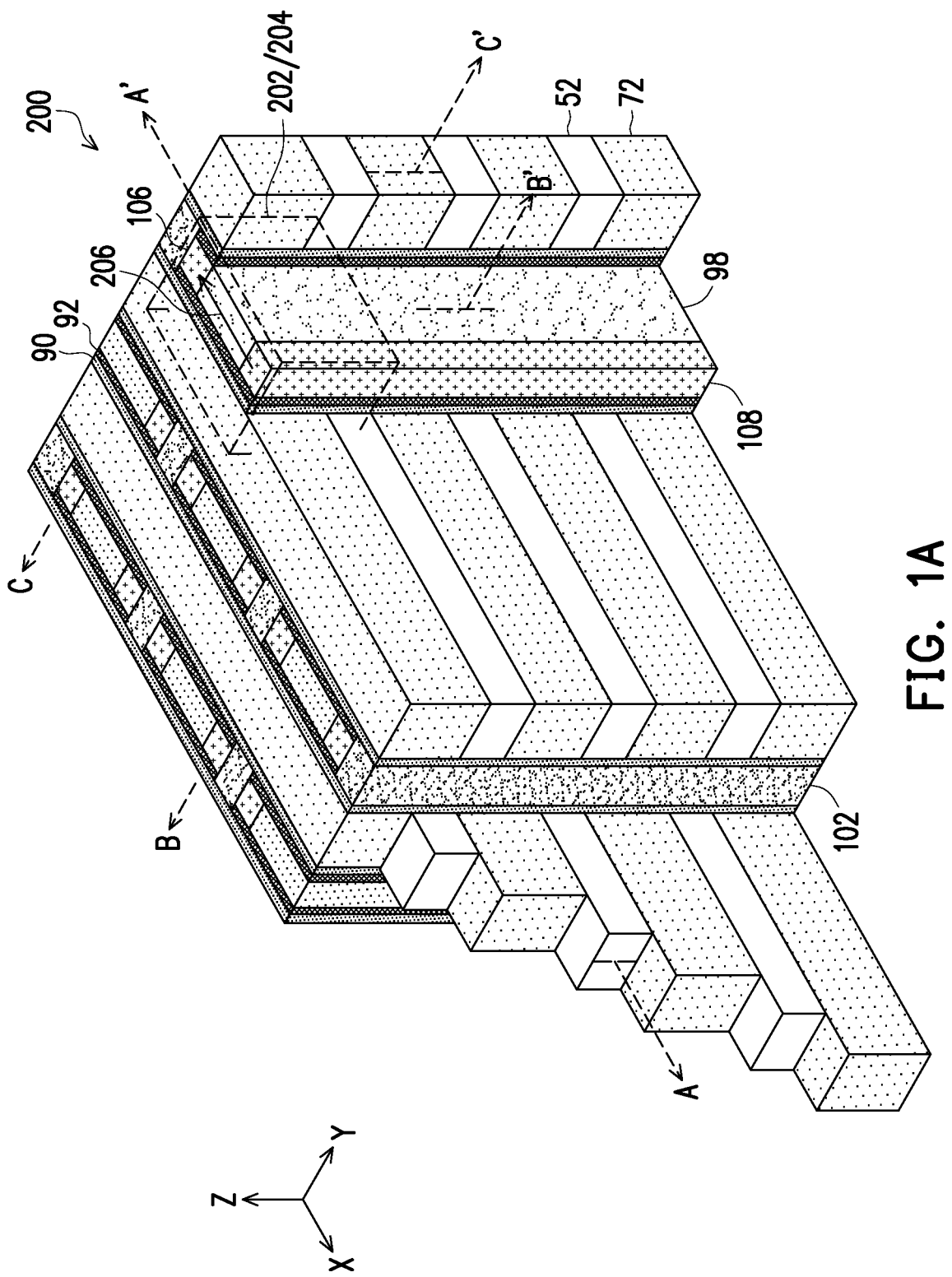
FIGS. 1A and 1B illustrate a perspective view and a circuit diagram of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for bonding a semiconductor die to a 3D memory array and a package formed by the same. The 3D memory array may include a plurality of vertically stacked memory cells. The semiconductor die may include a logic die, a peripheral die (e.g., an input/output die or the like), combinations thereof, or the like. An interconnect structure may be formed over the 3D memory array and the semiconductor die may be bonded to the interconnect structure. In some embodiments, the semiconductor die may include through substrate vias (TSVs) and a backside of the semiconductor die, including the TSVs, may be bonded to the interconnect structure. In some embodiments, a front-side interconnect structure of the semiconductor die may be bonded to the interconnect structure formed over the 3D memory array. In some embodiments, front-sides or backsides of a logic die and a peripheral die may each be bonded to the interconnect structure formed over the 3D memory array. Bonding the semiconductor die to the 3D memory array through the interconnect structure formed over the 3D memory simplifies routing between the 3D memory array and the semiconductor die, shortens the length of contacts and conductive lines used to route connections between the 3D memory array and the semiconductor die, reduces contact resistance, and improves device performance.

Figure 1B:
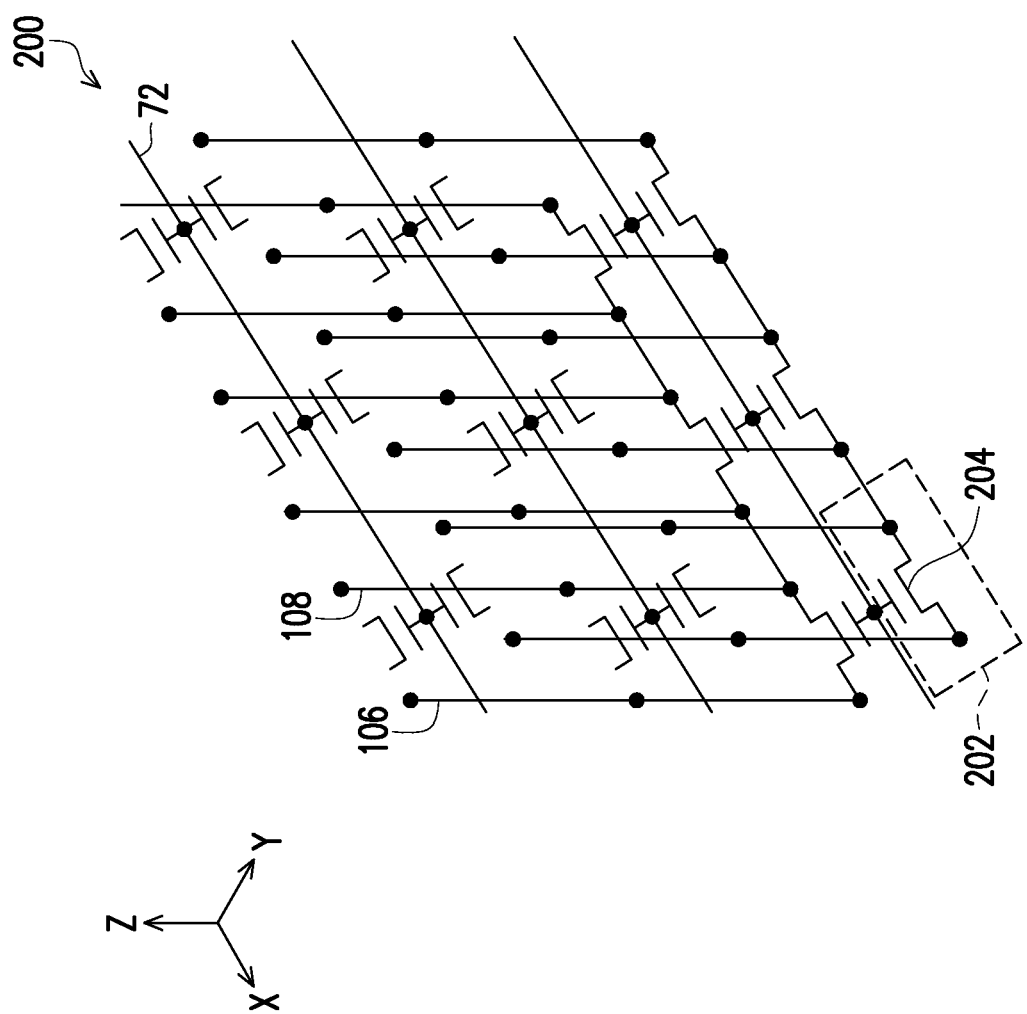

FIGS. 1A and 1B illustrate examples of a memory array 200, according to some embodiments. FIG. 1A illustrates an example of a portion of the memory array 200 in a three-dimensional view, in accordance with some embodiments, and FIG. 1B illustrates a circuit diagram of the memory array 200. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array 200 may be disposed in the interconnect layers of the semiconductor die, such as above one or more active devices (e.g., transistors) formed on a semiconductor substrate.

In some embodiments, the memory array 200 is a flash memory array, such as a NOR flash memory array or the like. Each of the memory cells 202 may include a transistor 204 with a memory film 90. The memory film 90 may serve as a gate dielectric. In some embodiments, a gate of each transistor 204 is electrically coupled to a respective word line (e.g., a conductive line 72), a first source/drain region of each transistor 204 is electrically coupled to a respective bit line (e.g., a conductive line 106), and a second source/drain region of each transistor 204 is electrically coupled to a respective source line (e.g., a conductive line 108), which electrically couples the second source/drain region to ground. The memory cells 202 in a same horizontal row of the memory array 200 may share a common word line, while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not separately illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and a plurality of conductive lines 108 (e.g., source lines). The conductive lines 106 and the conductive lines 108 may each extend in a direction perpendicular to the conductive lines 72. Dielectric materials 102 are disposed between and isolate adjacent ones of the conductive lines 106 and the conductive lines 108. Pairs of the conductive lines 106 and the conductive lines 108 along with an intersecting conductive line 72 define boundaries of each memory cell 202, and dielectric materials 98 are disposed between and isolate adjacent pairs of the conductive lines 106 and the conductive lines 108. In some embodiments, the conductive lines 108 are electrically coupled to ground. Although FIG. 1A illustrates a particular placement of the conductive lines 106 relative to the conductive lines 108, it should be appreciated that the placement of the conductive lines 106 and the conductive lines 108 may be flipped.

The memory array 200 may also include an oxide semiconductor (OS) layer 92. The OS layer 92 may provide channel regions for the transistors 204 of the memory cells 202. For example, when an appropriate voltage (e.g., higher than a respective threshold voltage ($V_{th}$) of a corresponding transistor 204) is applied through a corresponding conductive line 72, a region of the OS layer 92 that intersects the conductive line 72 may allow current to flow from the conductive lines 106 to the conductive lines 108 (e.g., in the direction indicated by arrow 206).

The memory film 90 is disposed between the conductive lines 72 and the OS layer 92, and the memory film 90 may provide gate dielectrics for the transistors 204. In some embodiments, the memory film 90 comprises a ferroelectric (FE) material, such as hafnium oxide, hafnium zirconium oxide, silicon-doped hafnium oxide, or the like. Accordingly, the memory array 200 may be referred to as a ferroelectric random access memory (FERAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

The memory film 90 may be polarized in one of two different directions. The polarization direction may be changed by applying an appropriate voltage differential across the memory film 90 and generating an appropriate electric field. The polarization may be relatively localized (e.g., generally contained within each boundaries of the memory cells 202) and continuous regions of the memory film 90 may extend across a plurality of memory cells 202. Depending on a polarization direction of a particular region of the memory film 90, a threshold voltage of a corresponding transistor 204 varies and a digital value (e.g., a 0 or a 1) can be stored. For example, when a region of the memory film 90 has a first electrical polarization direction, the corresponding transistor 204 may have a relatively low threshold voltage, and when the region of the memory film 90 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202, a write voltage is applied across a portion of the memory film 90 corresponding to the memory cell 202. The write voltage can be applied, for example, by applying appropriate voltages to a corresponding conductive line 72 (e.g., a corresponding word line) and the corresponding conductive lines 106 and conductive lines 108 (e.g., corresponding bit and source lines). By applying the write voltage across the portion of the memory film 90, a polarization direction of the region of the memory film 90 can be changed. As a result, the corresponding threshold voltage of the corresponding transistor 204 can be switched from a low threshold voltage to a high threshold voltage or vice versa and a digital value can be stored in the memory cell 202. Because the conductive lines 72 intersect the conductive lines 106 and the conductive lines 108, individual memory cells 202 may be selected for the write operation.

To perform a read operation on the memory cell 202, a read voltage (e.g., a voltage between the low and high threshold voltages) is applied to the corresponding conductive line 72 (e.g., the corresponding word line). Depending on the polarization direction of the corresponding region of the memory film 90, the transistor 204 of the memory cell 202 may or may not be turned on. As a result, the corresponding conductive line 106 may or may not be discharged through the corresponding conductive line 108 (e.g., the corresponding source line that is coupled to ground), and the digital value stored in the memory cell 202 can be determined. Because the conductive lines 72 intersect the conductive lines 106 and the conductive lines 108, individual memory cells 202 may be selected for the read operation.

FIG. 1A further illustrates reference cross-sections of the memory array 200 that are used in later figures. Cross-section A-A' is along longitudinal axes of conductive lines 72 and in a direction, for example, parallel to the direction of current flow across the OS layer 92 of the transistors 204. Cross-section B-B' is perpendicular to the cross-section A-A' and the longitudinal axes of the conductive lines 72. The cross-section B-B' extends through the dielectric materials 98 and the dielectric materials 102. Cross-section C-C' is parallel to the cross-section B-B' and extends through the conductive lines 106. Subsequent figures refer to these reference cross-sections for clarity.

FIGS. 2 through 7A, 8A, and 8B are cross-sectional views of intermediate stages in the manufacturing of semiconductor devices 300 and semiconductor devices 400, which may be subsequently bonded to the memory array 200 to form packaged semiconductor devices. FIG. 7B is a perspective view of an intermediate stage in the manufacturing of the semiconductor devices 300. FIGS. 9 through 37 are views of intermediate stages in the manufacturing of the memory array 200 and the semiconductor devices including the memory array 200, in accordance with some embodiments. FIGS. 9, 21 through 29, 30A, 31A, 31B, and 32 through 37 are illustrated along reference cross-section A-A' illustrated in FIG. 1A. FIGS. 10B, 11B, 12B, 13B, 14B, 15B, 16B, 17B, 18B, 19B, 20B, and 30B are illustrated along reference cross-section B-B' illustrated in FIG. 1A. FIGS. 19C, 20C, 30C, and 31C are illustrated along reference cross-section C-C' illustrated in FIG. 1A. FIGS. 10A, 11A, 12A, 13A, 14A, 15A, 16A, 17A, 18A, 19A, and 20A illustrate top-down views. FIG. 30D illustrates a perspective view.

Figure 7A:
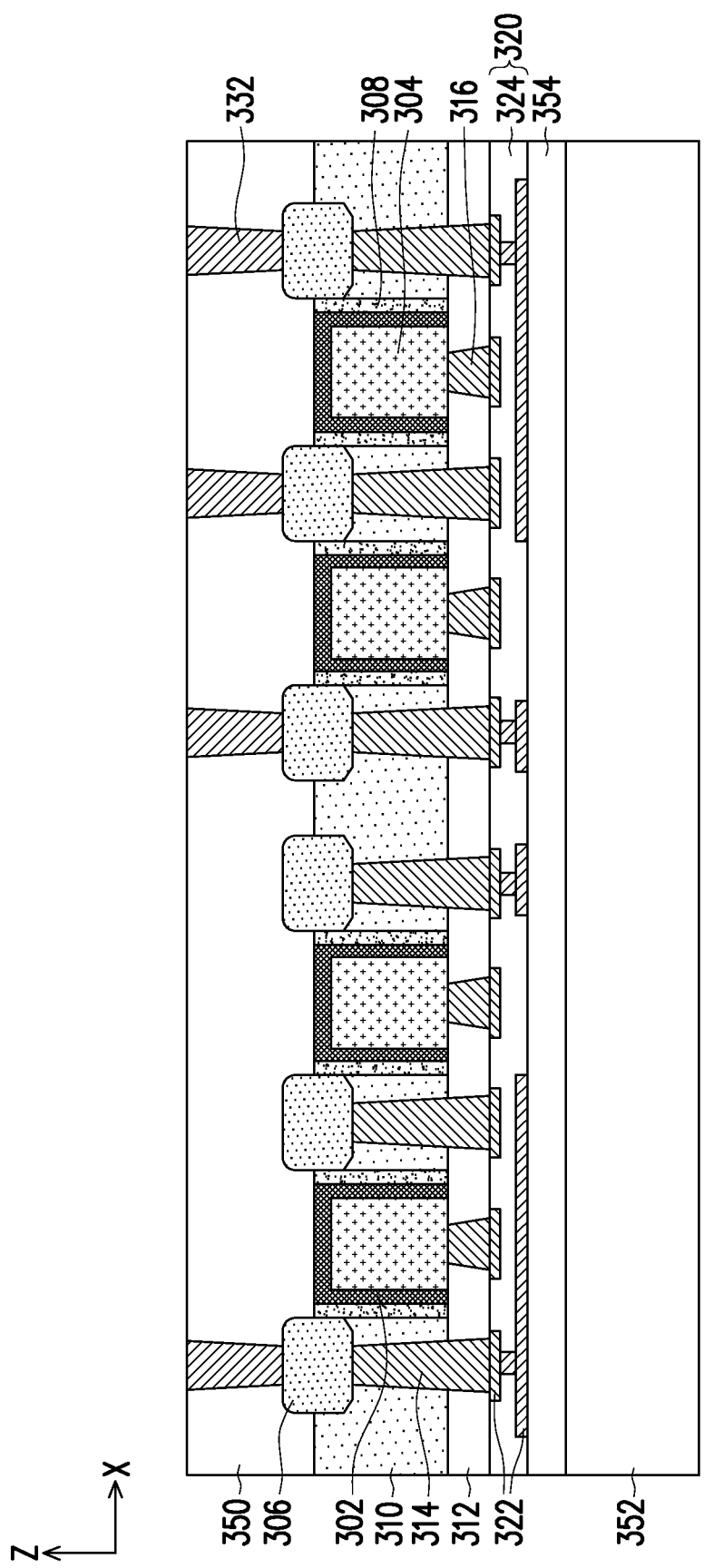
Figure 7B:
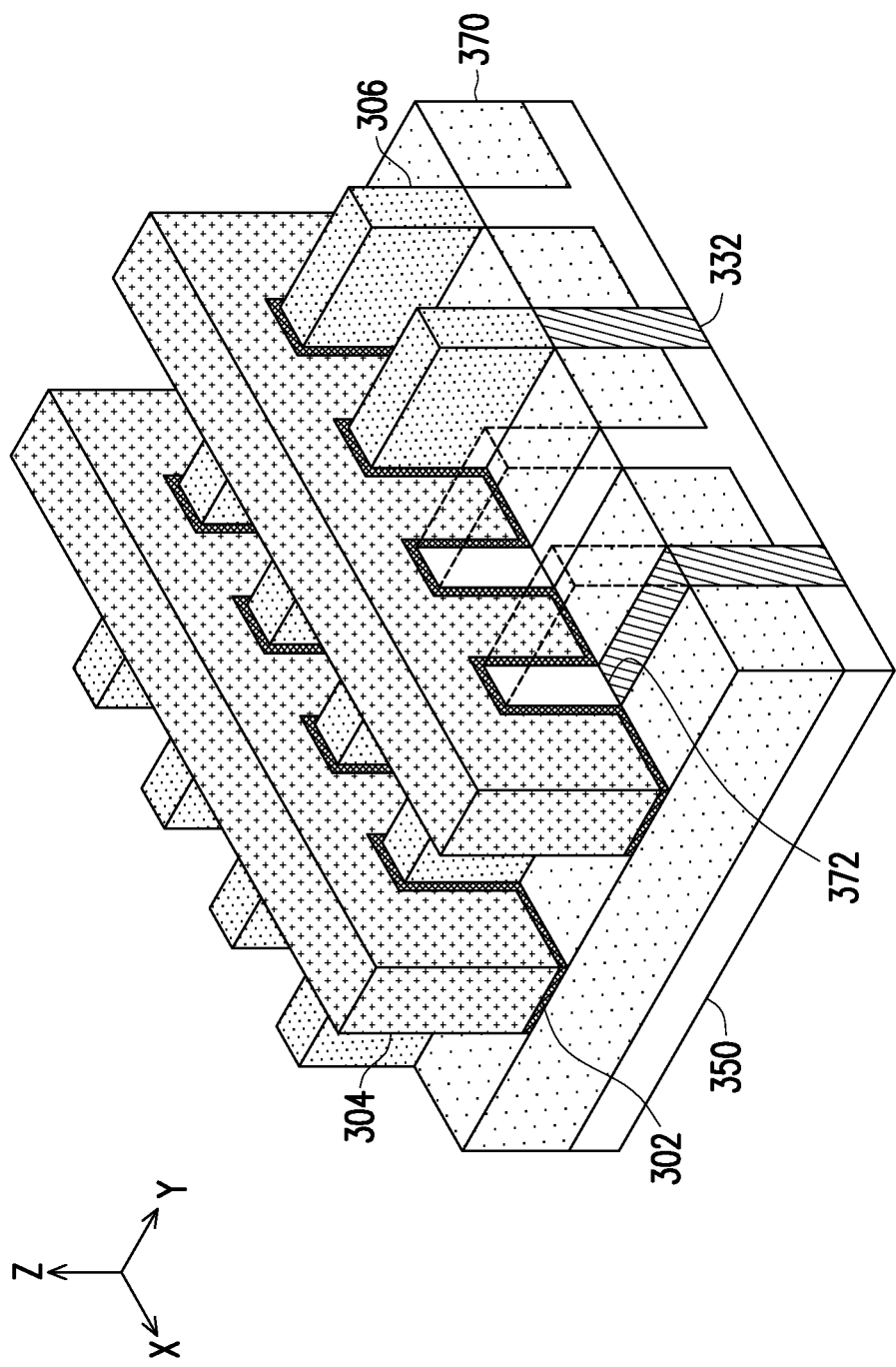
Figure 8A:
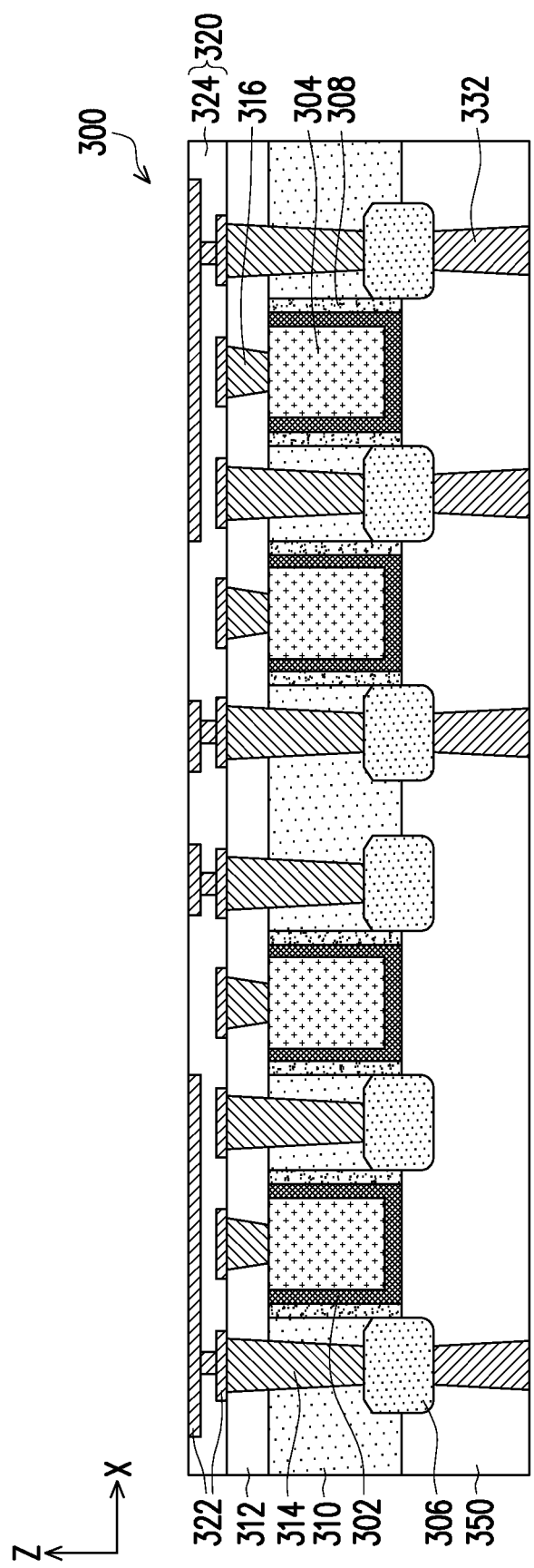
Figure 8B:
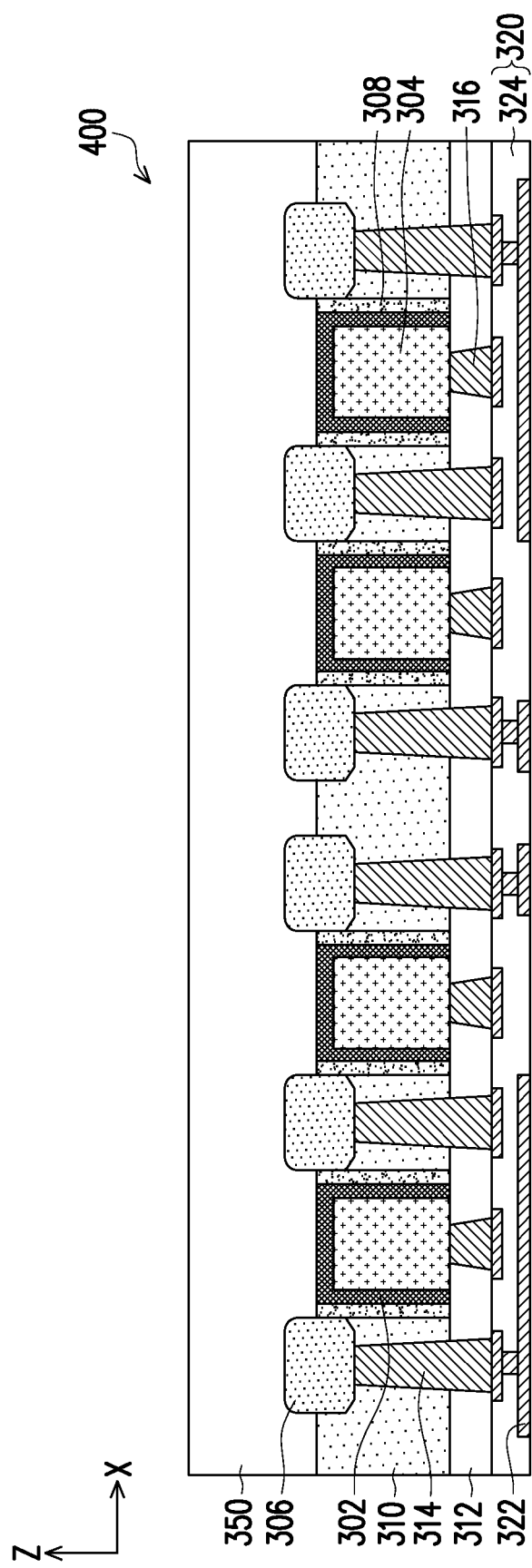

In FIGS. 2 through 8A, semiconductor devices 300 are formed and in FIG. 8B, semiconductor devices 400 are formed. The semiconductor devices 300 and the semiconductor devices 400 may comprise logic dies (e.g., central processing units (CPUs), graphics processing units (GPUs), system-on-a-chips (SoCs), application processors (APs), field-programmable gate arrays (FPGAs), microcontrollers, or the like), peripheral dies (e.g., input/output dies or the like), memory dies (e.g., dynamic random access memory (DRAM) dies, static random access memory (SRAM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or combinations thereof. As will be discussed below, the semiconductor devices 300 and the semiconductor devices 400 may be bonded to the memory array 200 and may be used to perform read/write operations and the like on the memory array 200.

In FIG. 2, a substrate 350 is provided. The substrate 350 may be a semiconductor substrate, such as a bulk semiconductor, a semiconductor-on-insulator (SOI) substrate, or the like, which may be doped (e.g., with a p-type or an n-type dopant) or undoped. The substrate 350 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as multi-layered or gradient substrates may also be used. In some embodiments, the semiconductor material of the substrate 350 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Figure 3:
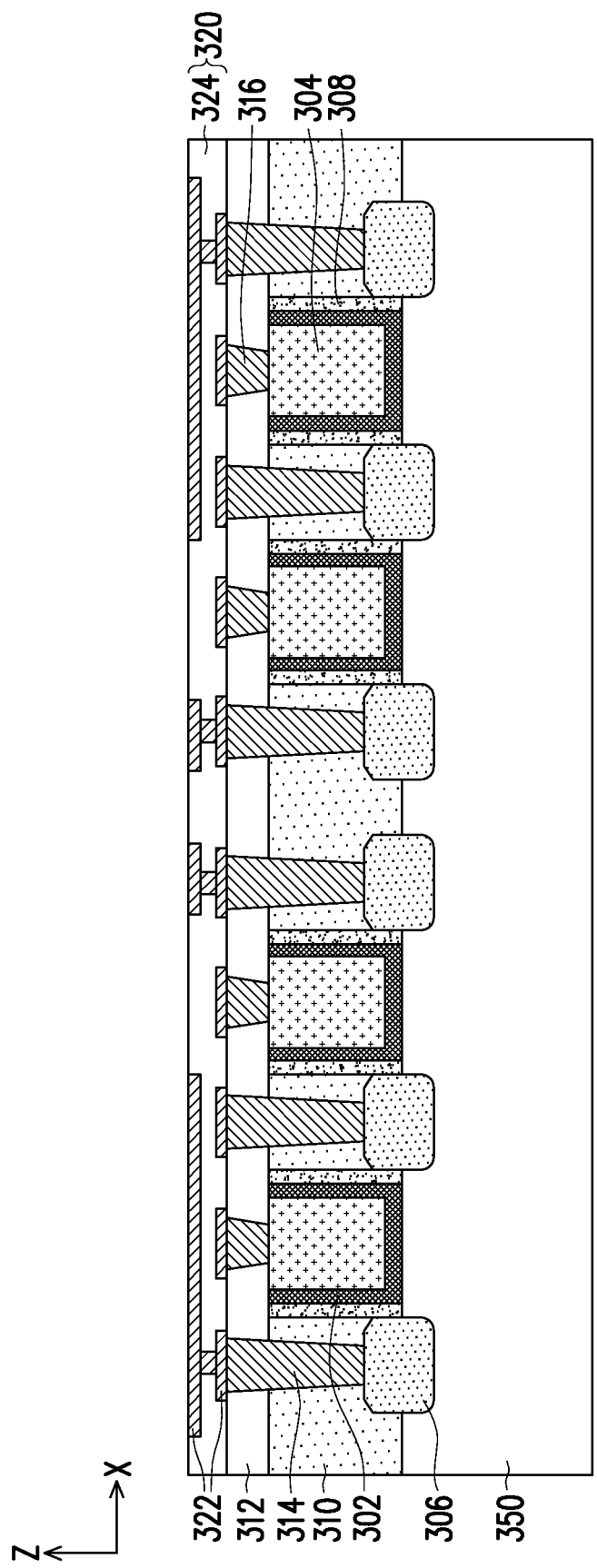

In FIG. 3, circuits are formed over the substrate 350. The circuits include transistors at a top surface of the substrate 350. The transistors may include gate dielectric layers 302 over top surfaces of the substrate 350 and gate electrodes 304 over the gate dielectric layers 302. Source/drain regions 306 are disposed in the substrate 350 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may comprise fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first ILD 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 including one or more stacked dielectric layers 324 and conductive features 322 formed in the one or more dielectric layers 324 is over the second ILD 312, the source/drain contacts 314, and the gate contacts 316. The interconnect structure 320 may be electrically coupled to the gate contacts 316 and the source/drain contacts 314 to form functional circuits. In some embodiments, the functional circuits formed by the interconnect structure 320 may comprise logic circuits, memory circuits, sense amplifiers, controllers, input/output circuits, image sensor circuits, the like, or combinations thereof. In some embodiments, the functional circuits may include decoders, processors, multiplexors, controllers, sense amplifiers, and the like and may be used to provide read/write operations and otherwise control a memory array 200 which is subsequently bonded to the interconnect structure 320. Although FIG. 3 discusses transistors formed over the substrate 350, other active devices (e.g., diodes or the like) and/or passive devices (e.g., capacitors, resistors, or the like) may also be formed as part of the functional circuits. The interconnect structure 320 may be formed over a front-side of the substrate 350 and may therefore be referred to as a front-side interconnect structure.

Figure 4:
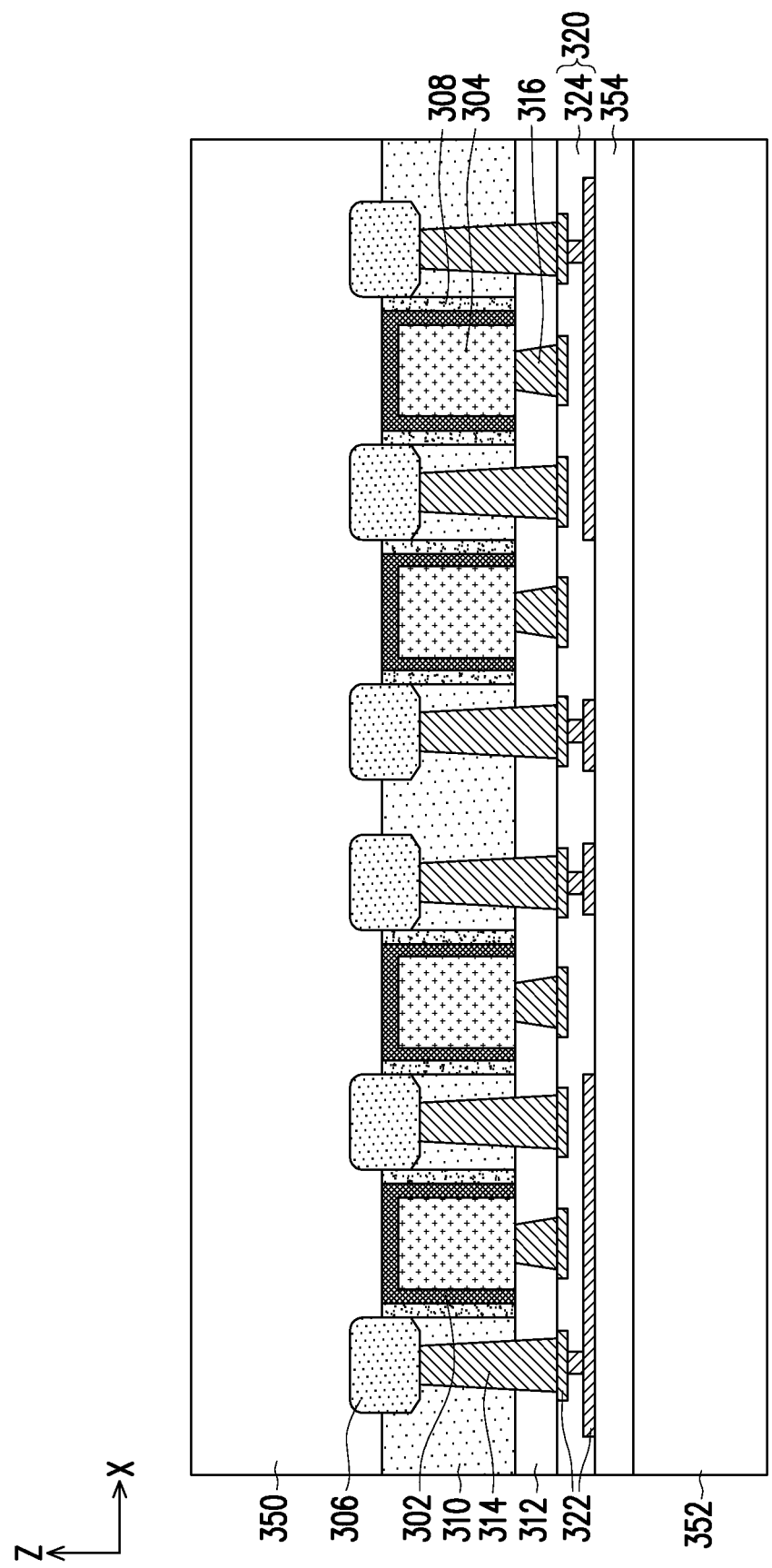

In FIG. 4, the device of FIG. 3 is flipped and a carrier substrate 352 is bonded to the interconnect structure 320. The device may be flipped such that a backside of the substrate 350 faces upwards. The backside of the substrate 350 may refer to a side opposite a front-side of the substrate 350 on which the active devices are formed. The carrier substrate 352 may be a glass carrier substrate, a ceramic carrier substrate, or the like. The carrier substrate 352 may be a wafer, such that multiple devices, such as the device illustrated in FIG. 3, can be bonded on the carrier substrate 352 simultaneously.

The carrier substrate 352 may be bonded to the interconnect structure 320 by a release layer 354. The release layer 354 may be formed of a polymer-based material, which may be removed along with the carrier substrate 352 from the overlying structures that will be formed in subsequent steps. In some embodiments, the release layer 354 is an epoxy-based thermal-release material, which loses its adhesive property when heated, such as a light-to-heat-conversion (LTHC) release coating. In other embodiments, the release layer 354 may be an ultra-violet (UV) glue, which loses its adhesive property when exposed to UV lights. The release layer 354 may be dispensed as a liquid and cured, may be a laminate film laminated onto the carrier substrate 352, or may be the like. The top surface of the release layer 354 may be leveled and may have a high degree of planarity.

Figure 5:
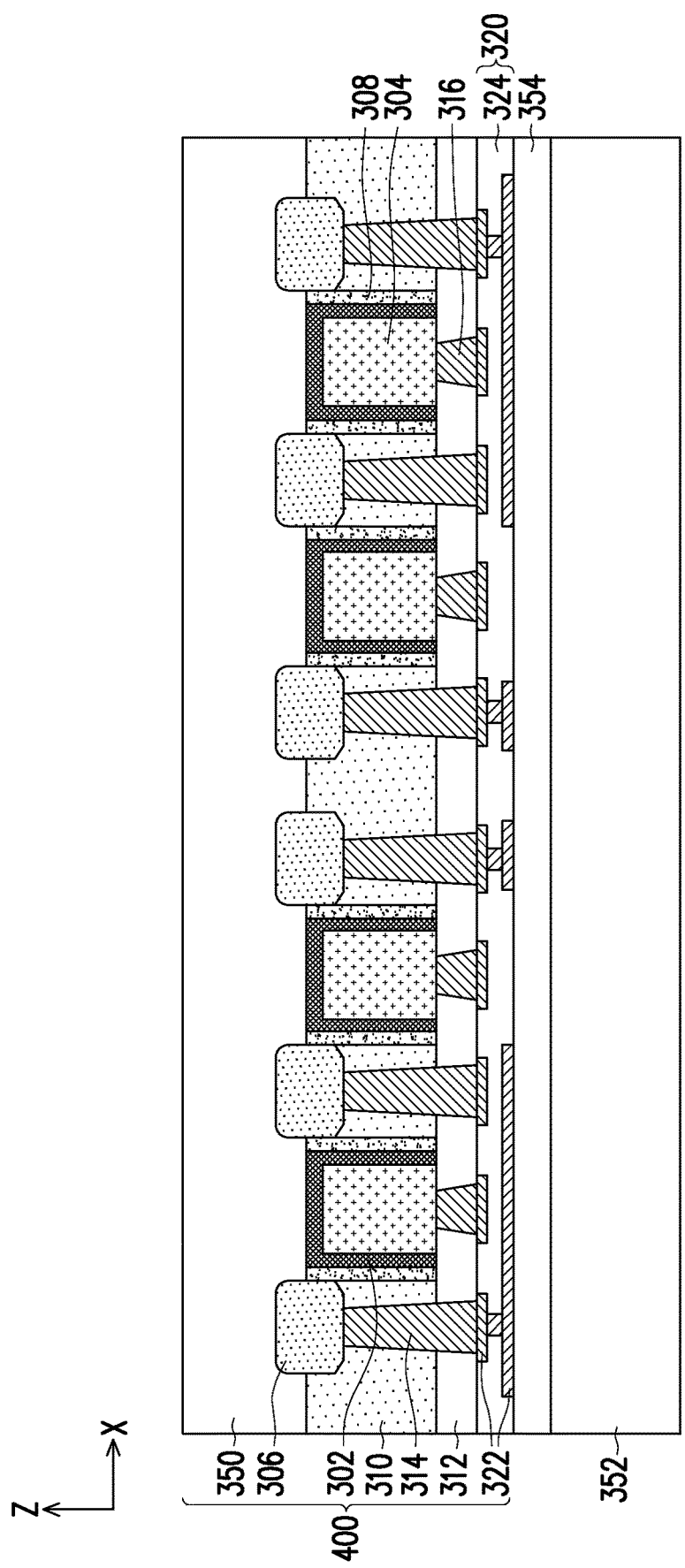

In FIG. 5, a thinning process is applied to the backside of the substrate 350. The thinning process may include a planarization process (e.g., a mechanical grinding, a chemical mechanical polish (CMP), or the like), an etch-back process, combinations thereof, or the like. The substrate 350 may be thinned to shorten the length of subsequently formed through substrate vias (TSVs).

Figure 6:
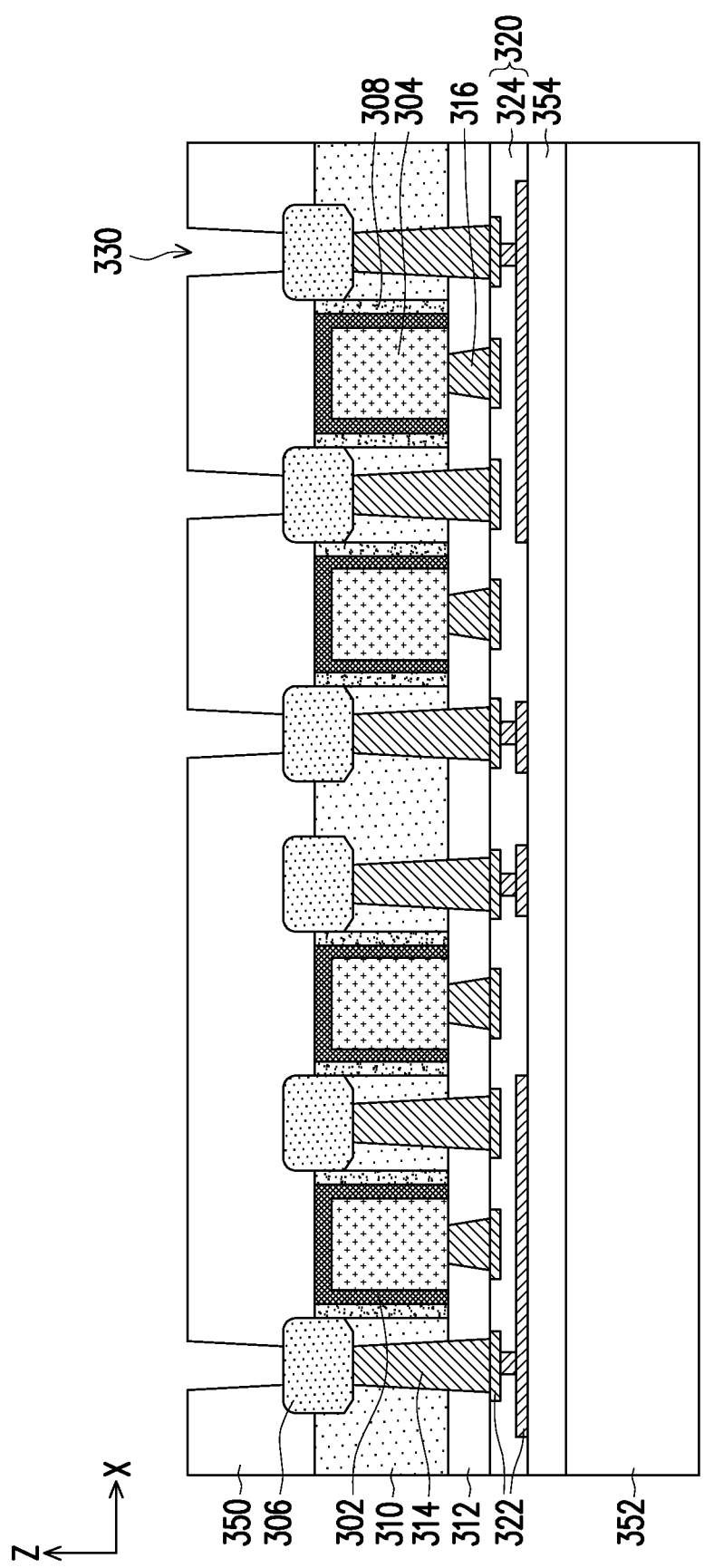

In FIG. 6, trenches 330 are formed in the substrate 350. The trenches 330 may be patterned in the substrate 350 through a combination of photolithography and etching. The etching may be any acceptable etching processes, such as wet or dry etching, reactive ion etching (RIE), neutral beam etching (NBE), the like, or a combination thereof. The etching may be anisotropic. The trenches 330 may extend through the substrate 350 to expose surfaces of the source/drain regions 306.

In FIGS. 7A and 7B, TSVs 332 are formed in the trenches 330. The TSVs 332 may include one or more layers, such as barrier layers, diffusion layers, and fill materials. The TSVs 332 may be electrically coupled to the source/drain regions 306. In some embodiments, silicide regions (not separately illustrated) may be formed in the trenches 330 adjacent the source/drain regions 306 and the TSVs 332 may be coupled to the source/drain regions 306 through the silicide regions. The TSVs 332 may include tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), combinations thereof, or the like. A planarization process, such as a CMP, may be performed to remove excess material from surfaces of the substrate 350 after depositing the material of the TSVs 332.

FIG. 7B illustrates a perspective view of the structure of FIG. 7A in an embodiment in which the transistors include FinFETs. The view illustrated in FIG. 7B has been vertically flipped from the view illustrated in FIG. 7A for clarity and ease of illustration. As illustrated in FIG. 7B, fins 372 are formed extending over the substrate 350. Although the fins 372 are illustrated as single, continuous materials with the substrate 350, the fins 372 and/or the substrate 350 may comprise a single material or a plurality of materials. Shallow trench isolation (STI) regions 370 are disposed in the substrate 350, and the fins 372 protrude above and from between neighboring STI regions 370. The fins 372 may refer to the portions extending between the neighboring STI regions 370. The TSVs 332 may replace portions of the fins 372, extending through the substrate 350 between the STI regions 370 to physically contact and be electrically coupled to the source/drain regions 306.

In FIG. 8A, a carrier substrate de-bonding is performed to detach (de-bond) the carrier substrate 352 from the interconnect structure 320, forming a semiconductor device 300. In accordance with some embodiments, the de-bonding includes projecting a light, such as a laser light or a UV light, on the release layer 354 so that the release layer 354 decomposes under the heat of the light and the carrier substrate 352 can be removed. The device of FIG. 7A may also be flipped such that the front-side of the substrate 350 faces upwards. In some embodiments, a dicing process may further be performed on the semiconductor device 300 to form individual semiconductor dies. The dicing process may include sawing, a laser ablation method, an etching process, a combination thereof, or the like. In some embodiments, the dicing process may be performed before bonding the semiconductor device 300 to a memory array 200, such that individual semiconductor dies are bonded to the memory array 200. In some embodiments, the semiconductor device 300 and the memory array 200 may be diced after bonding the semiconductor device 300 to the memory array 200.

FIG. 8B illustrates an embodiment in which the carrier substrate de-bonding is performed to detach (de-bond) the carrier substrate 352 from the interconnect structure 320 after thinning the substrate 350 (see, e.g., FIG. 5) and before forming trenches 330 through the substrate 350 (see, e.g., FIG. 6), thereby forming a semiconductor device 400. The de-bonding may include projecting a light, such as a laser light or a UV light, on the release layer 354 so that the release layer 354 decomposes under the heat of the light and the carrier substrate 352 can be removed. The semiconductor device 400 may be diced before or after bonding the semiconductor device 400 to a memory array 200.

Figure 9:
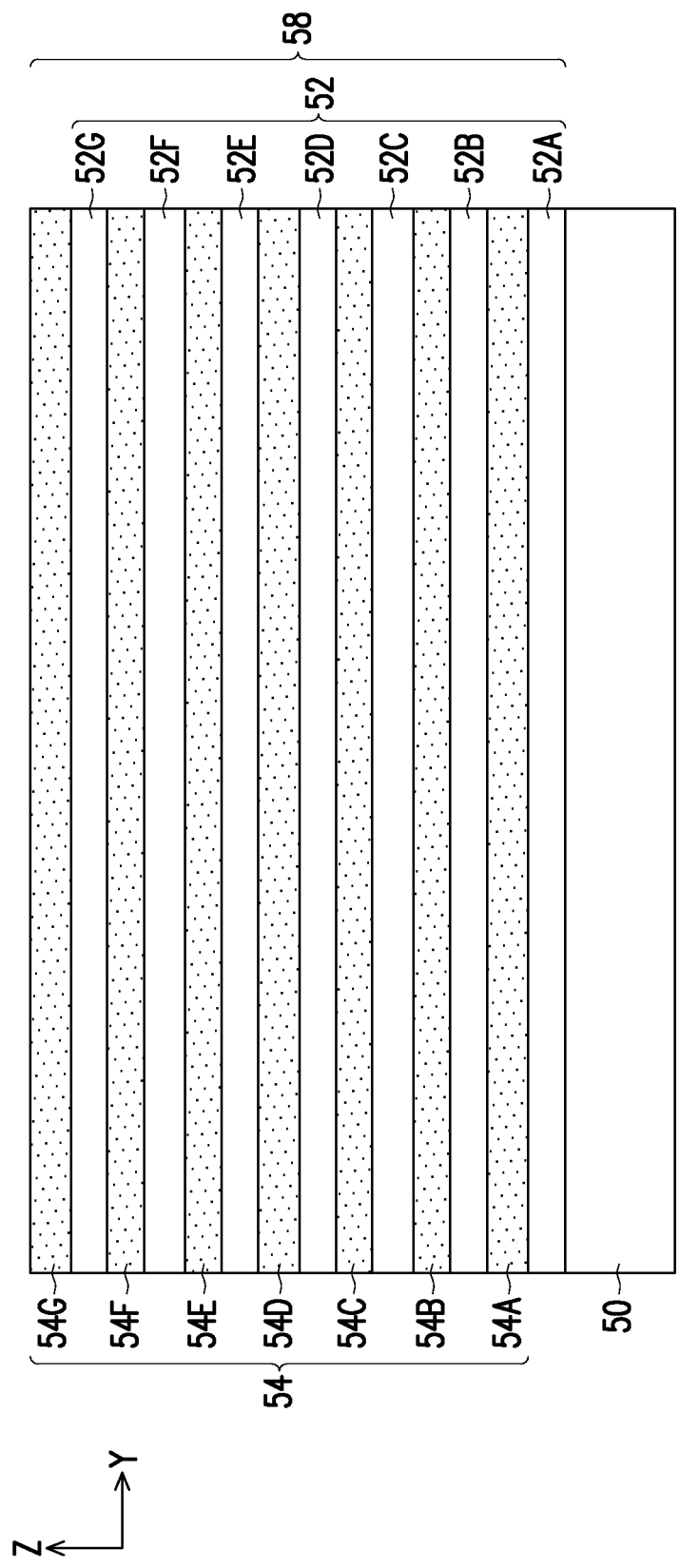

In FIG. 9, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as multi-layered or gradient substrates may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. In some embodiments, active devices (e.g., transistors, diodes, or the like) and/or passive devices (e.g., capacitors, resistors, or the like) may be formed on a top surface of the substrate 50. In some embodiments, the transistors may be planar field effect transistors (FETs), fin field effect transistors (FinFETs), nano-field effect transistors (nano-FETs), or the like.

Further in FIG. 9, a multi-layer stack 58 is formed over the substrate 50. Although the multi-layer stack 58 is illustrated as contacting the substrate 50, any number of intermediate layers may be disposed between the substrate 50 and the multi-layer stack 58. For example, one or more interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive layers 54A-54G (collectively referred to as conductive layers 54) and dielectric layers 52A-52G (collectively referred to as dielectric layers 52). The conductive layers 54 may be patterned in subsequent steps to define conductive lines 72 (e.g., word lines). The conductive layers 54 may comprise conductive materials, such as, copper, titanium, titanium nitride, tantalum, tantalum nitride, tungsten, ruthenium, aluminum, cobalt, silver, gold, nickel, chromium, hafnium, platinum, combinations thereof, or the like. The dielectric layers 52 may comprise insulating materials, such as silicon oxide, silicon nitride, silicon oxynitride, combinations thereof, or the like. The conductive layers 54 and the dielectric layers 52 may each be formed using, for example, chemical vapor deposition (CVD), atomic layer deposition (ALD), physical vapor deposition (PVD), plasma enhanced CVD (PECVD), or the like. Although FIG. 9 illustrates a particular number of the conductive layers 54 and the dielectric layers 52, other embodiments may include different numbers of the conductive layers 54 and the dielectric layers 52.

In some embodiments, the substrate 50 may be a carrier substrate. In embodiments in which the substrate 50 is a carrier substrate, a release layer (not separately illustrated) may be formed over the substrate 50 before forming the multi-layer stack 58 over the substrate 50. The substrate 50 may be a glass carrier substrate, a ceramic carrier substrate, or the like. The substrate 50 may be a wafer, such that multiple memory arrays 200 may be processed on the substrate 50 simultaneously. The release layer may be formed of a polymer-based material, which may be subsequently removed along with the substrate 50 from the overlying memory array 200. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV light. The release layer may be dispensed as a liquid and cured, may be a laminate film laminated onto the substrate 50, or may be the like. The top surface of the release layer may be leveled and may have a high degree of planarity.

In FIGS. 10A through 12B, trenches 86 are formed in the multi-layer stack 58, thereby defining conductive lines 72. The conductive lines 72 may correspond to word lines in the memory array 200 and the conductive lines 72 may provide gate electrodes for the resulting transistors 204 of the memory array 200 (see FIGS. 1A and 1B). In FIGS. 10A through 12B, figures ending in "A" illustrate top-down views and figures ending in "B" illustrate cross-sectional views along the reference cross-section B-B' of FIG. 1A.

Figure 10A:
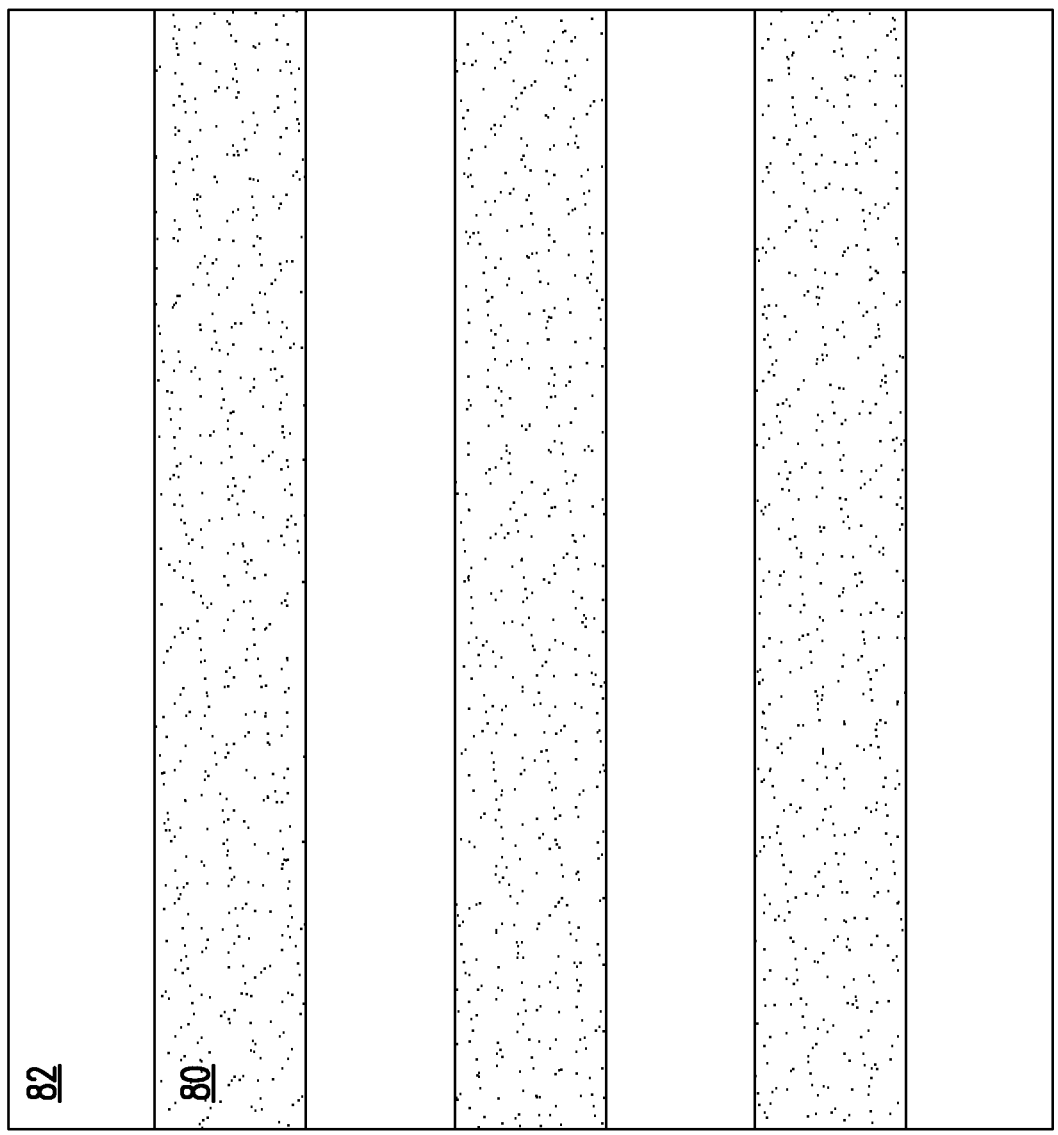
Figure 10B:
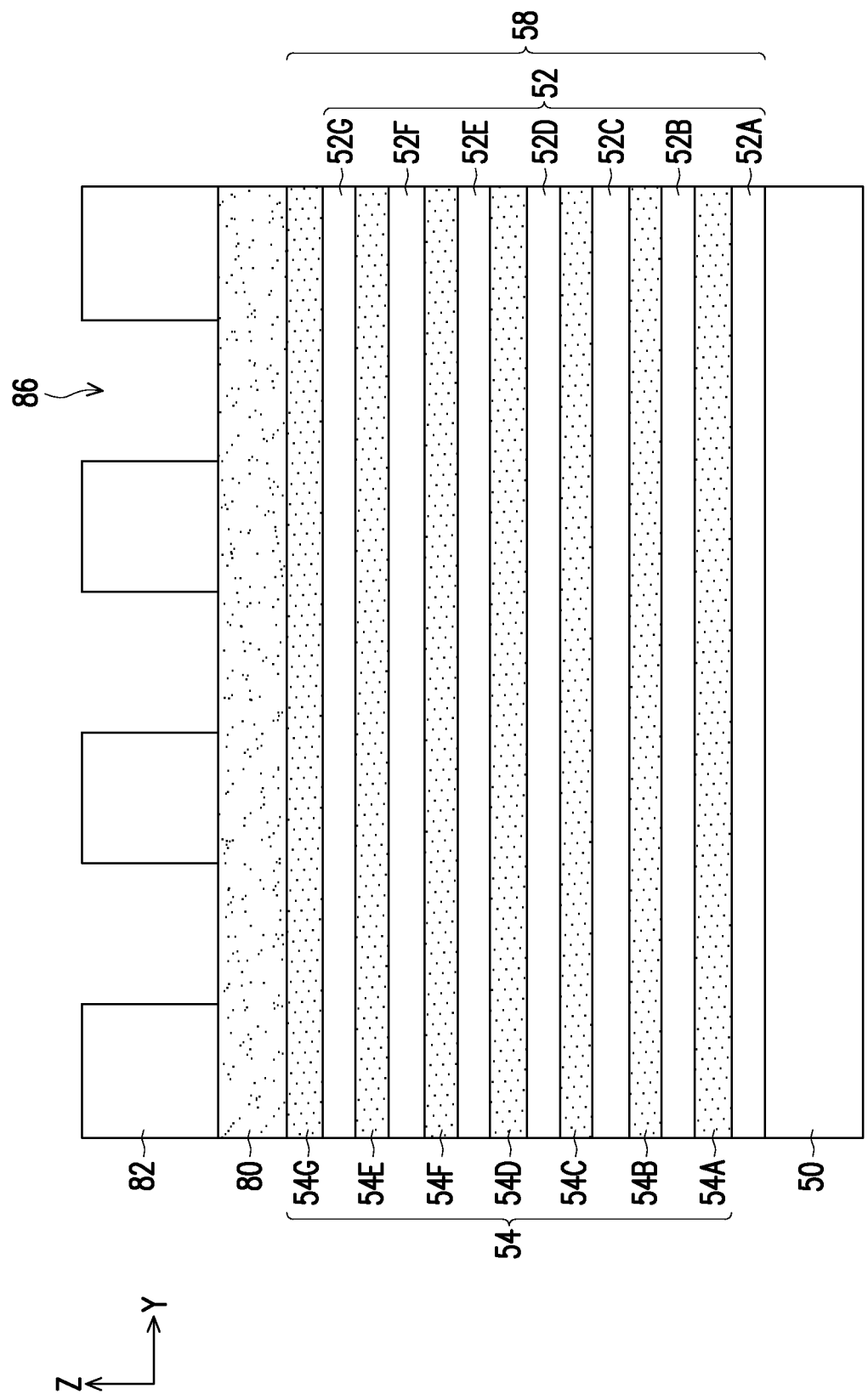

In FIGS. 10A and 10B a hard mask 80 is deposited over the multi-layer stack 58. The hard mask 80 may include, for example, silicon nitride, silicon oxynitride, or the like, which may be deposited by CVD, PVD, ALD, PECVD, or the like. The hard mask 80 can be formed by using a spin-on technique and can be patterned using acceptable photolithography techniques. A photoresist 82 is formed and patterned over the hard mask 80. The photoresist 82 may be patterned to form trenches 86 exposing portions of a top surface of the hard mask 80.

Figure 11B:
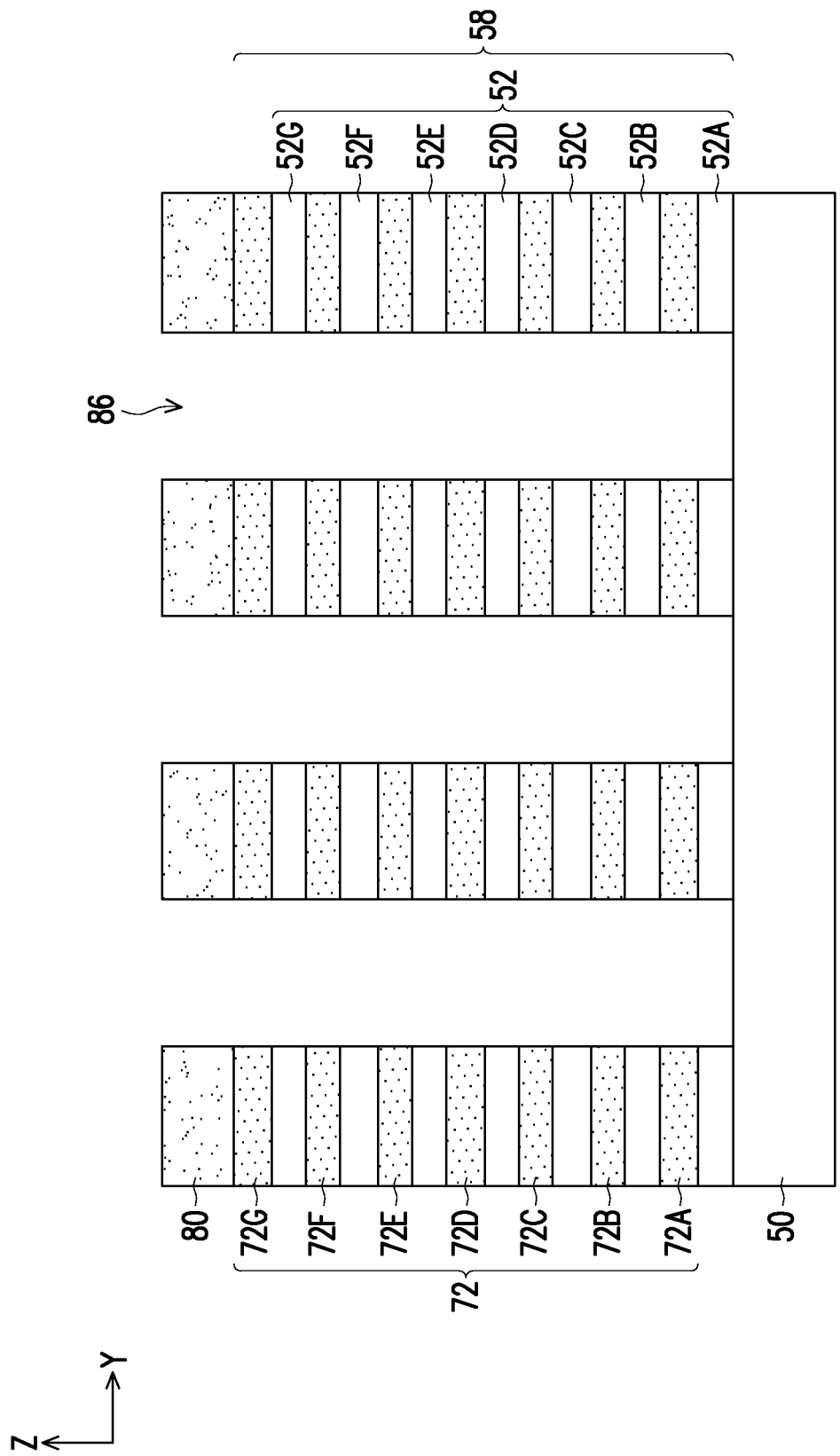
Figure 12A:
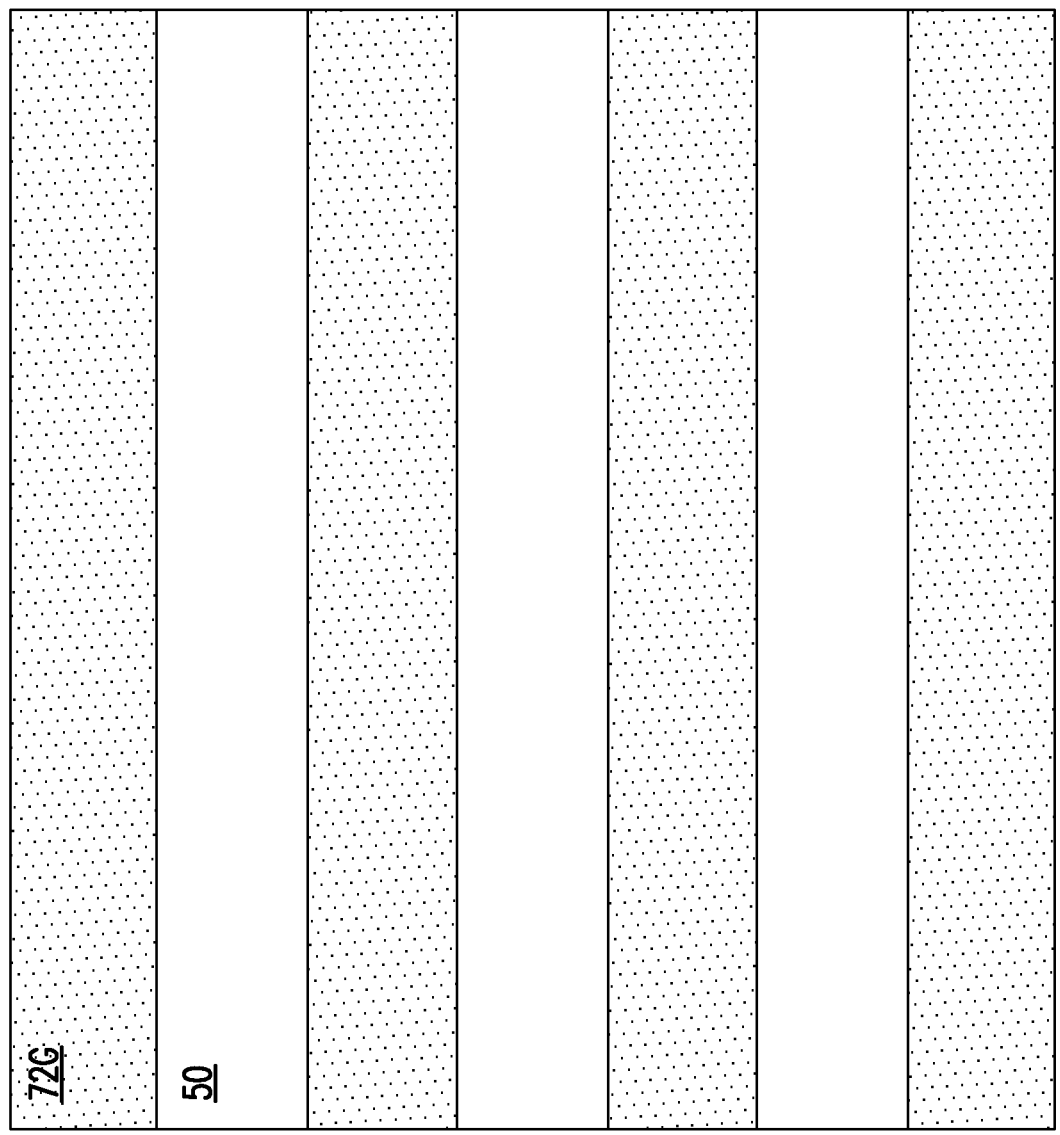
Figure 12B:
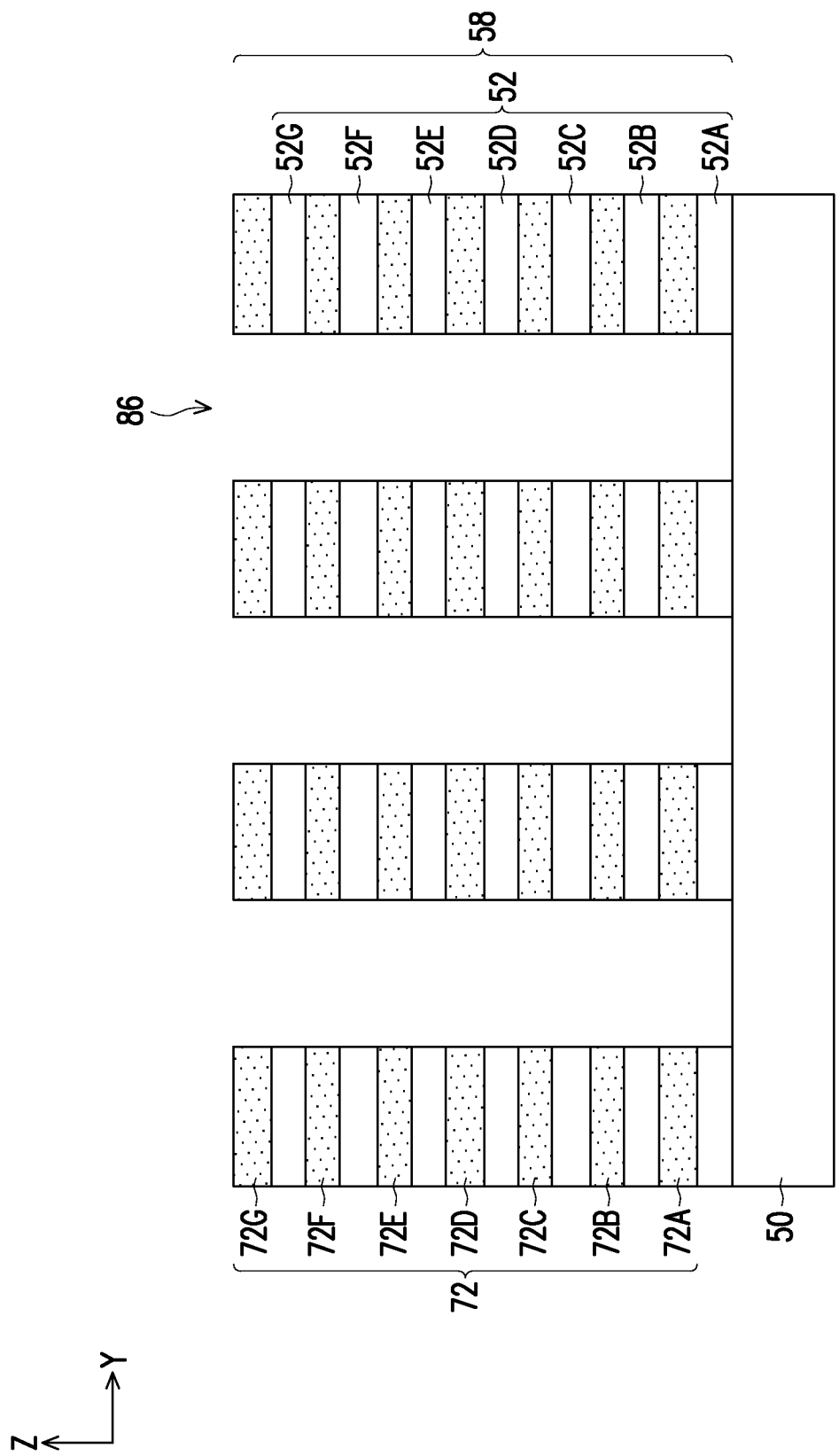

In FIGS. 11A and 11B, a pattern of the photoresist 82 is transferred to the hard mask 80 using an acceptable etching process, such as wet or dry etching, RIE, NBE, the like, or a combination thereof. The etching may be anisotropic. Thus, the trenches 86 are transferred to the hard mask 80. Further in FIGS. 11A and 11B, a pattern of the hard mask 80 is transferred to the multi-layer stack 58 using one or more acceptable etching processes, such as wet or dry etching, RIE, NBE, the like, or a combination thereof. The etching processes may be anisotropic. Thus, the trenches 86 are extended through the multi-layer stack 58. The conductive lines 72A-72G (e.g., word lines, collectively referred to as conductive lines 72) are formed from the conductive layers 54A-54D by etching the trenches 86. More specifically, by etching the trenches 86 through the conductive layers 54, adjacent conductive lines 72 can be separated from each other. In FIGS. 12A and 12B, the hard mask 80 may be removed by an acceptable process, such as a wet etching process, a dry etching process, a planarization process, combinations thereof, or the like.

Figure 13A:
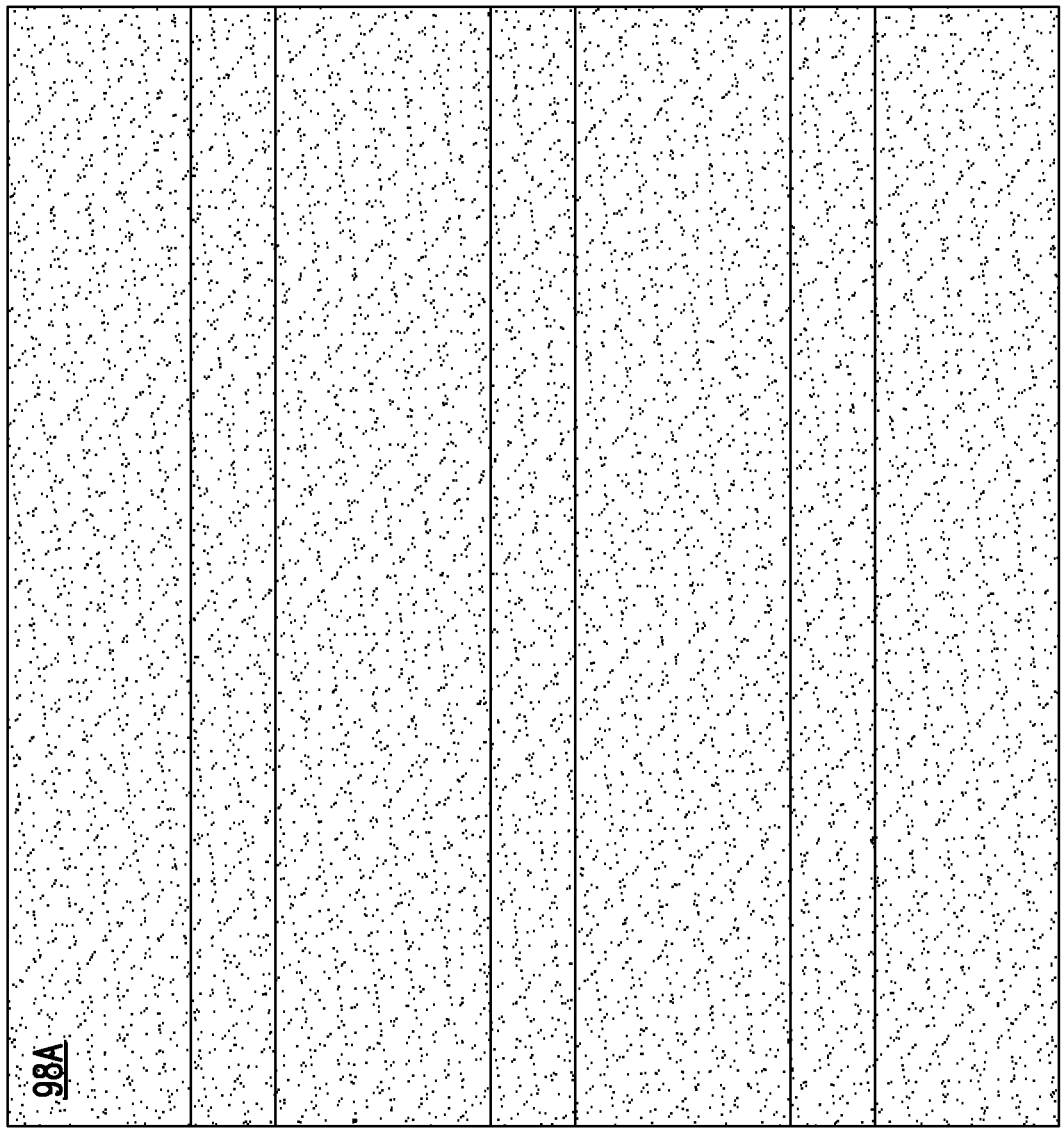
Figure 13B:
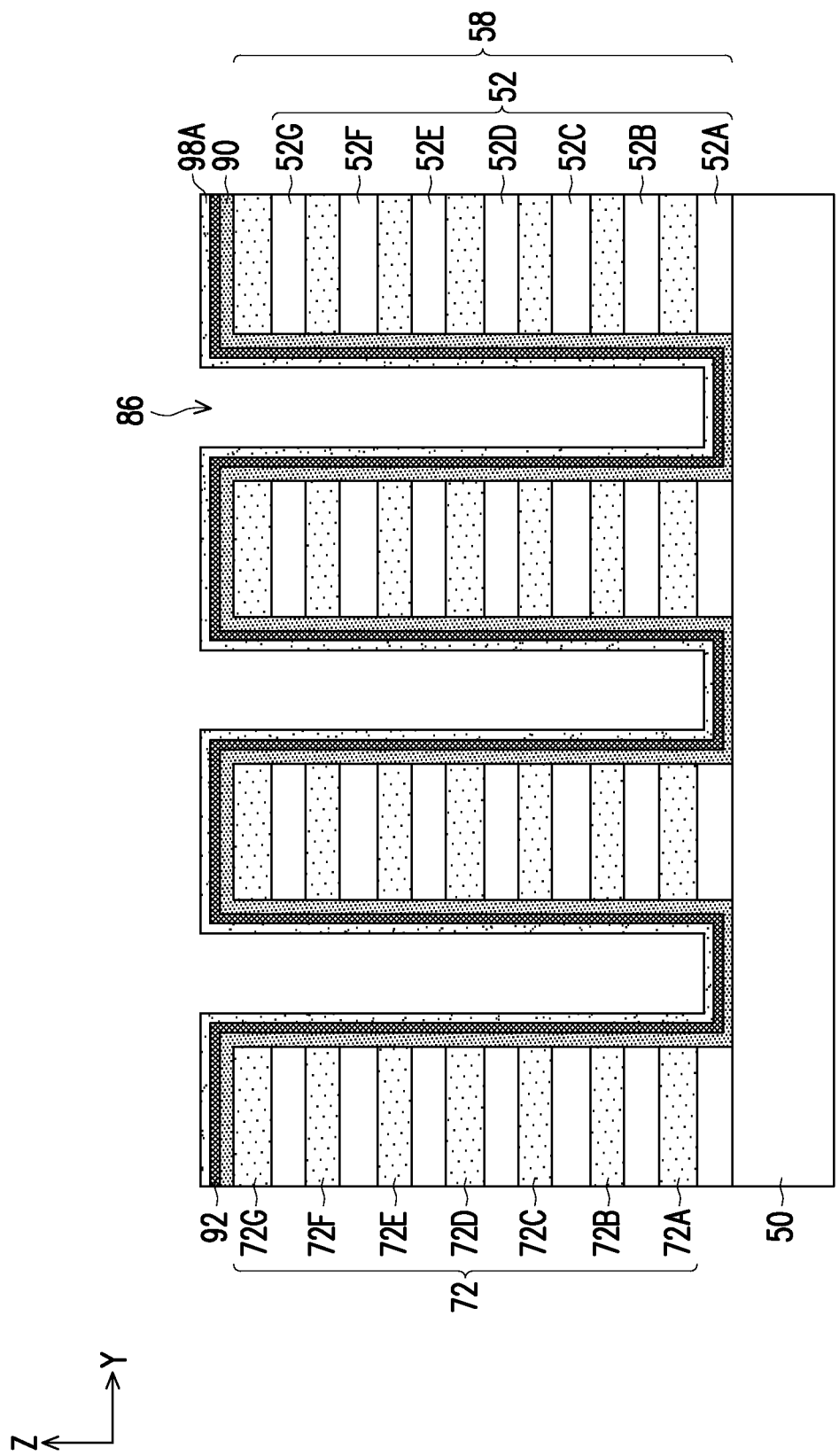

FIGS. 13A through 16B illustrate forming and patterning channel regions for the transistors 204 (see FIGS. 1A and 1B) in the trenches 86. In FIGS. 13A and 13B, a memory film 90, an OS layer 92, and a first dielectric layer 98A are deposited in the trenches 86. The memory film 90 may be deposited conformally in the trenches 86 along sidewalls of the conductive lines 72 and the dielectric layers 52 and along top surfaces of the conductive lines 72G and the substrate 50. The memory film 90 may be deposited by CVD, PVD, ALD, PECVD, or the like.

The memory film 90 may provide gate dielectrics for transistors 204 formed in the memory array 200. The memory film 90 may comprise a material that is capable of switching between two different polarization directions by applying an appropriate voltage differential across the memory film 90. The memory film 90 may be a high-k dielectric material, such as a hafnium (Hf) based dielectric material or the like. In some embodiments, the memory film 90 comprises a ferroelectric material, such as hafnium oxide, hafnium zirconium oxide, silicon-doped hafnium oxide, or the like. In some embodiments, the memory film 90 may comprise different ferroelectric materials or different types of memory materials. In some embodiments, the memory film 90 may be a multilayer memory structure comprising a layer of $SiN_x$ between two $SiO_x$ layers (e.g., an ONO structure).

The OS layer 92 is conformally deposited in the trenches 86 over the memory film 90. The OS layer 92 comprises materials suitable for providing channel regions for the transistors 204 (see FIGS. 1A and 1B). For example, the OS layer 92 may include zinc oxide (ZnO), indium tungsten oxide (InWO), indium gallium zinc oxide (InGaZnO), indium zinc oxide (InZnO), indium tin oxide (ITO), polycrystalline silicon (poly-Si), amorphous silicon (a-Si), combinations thereof, or the like. The OS layer 92 may be deposited by CVD, PVD, ALD, PECVD, or the like. The OS layer 92 may extend along sidewalls and bottom surfaces of the trenches 86 over the memory film 90.

The first dielectric layer 98A is deposited in the trenches 86 over the OS layer 92. The first dielectric layer 98A may include, for example, silicon oxide, silicon nitride, silicon oxynitride, or the like, which may be deposited by CVD, PVD, ALD, PECVD, or the like. The first dielectric layer 98A may extend along sidewalls and bottom surfaces of the trenches 86 over the OS layer 92.

Figure 14A:
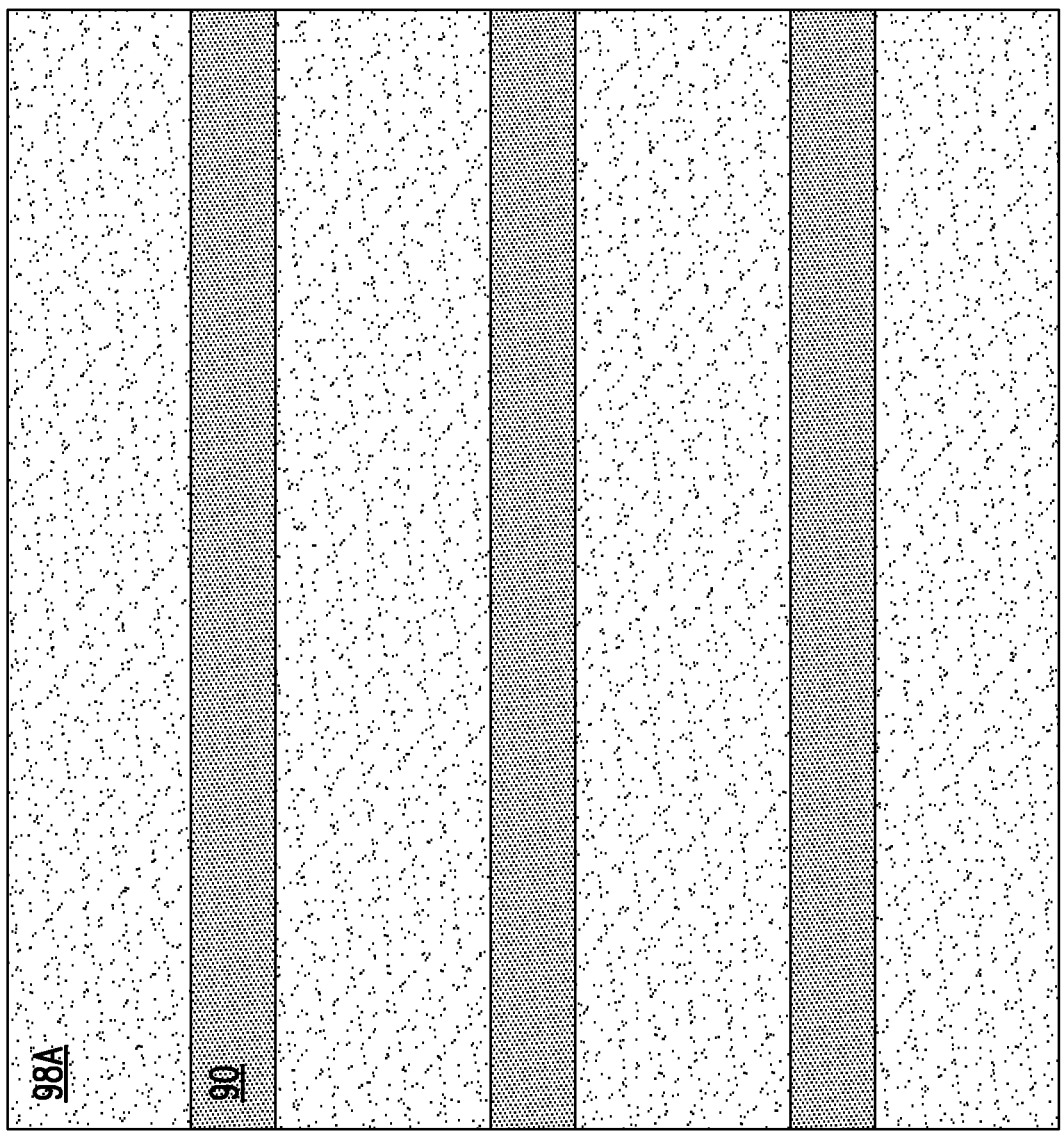
Figure 14B:
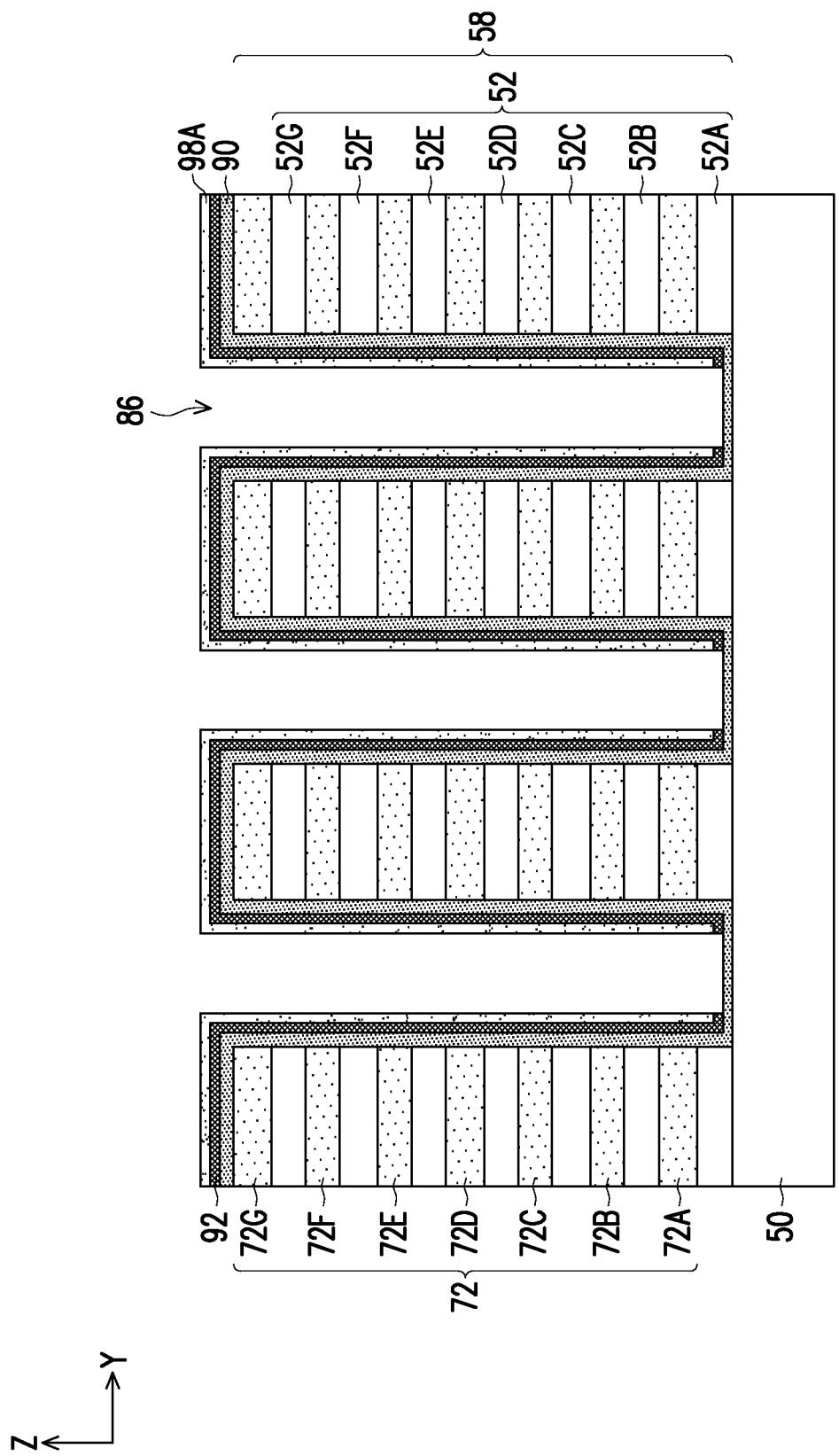

In FIGS. 14A and 14B, bottom portions of the first dielectric layer 98A and the OS layer 92 are removed in the trenches 86. The bottom portions of the first dielectric layer 98A may be removed using a combination of photolithography and etching. The etching may be any acceptable etch process, such as wet or dry etching, RIE, NBE, the like, or a combination thereof. The etching may be anisotropic.

The first dielectric layer 98A may then be used as an etch mask to etch through the bottom portions of the OS layer 92 in the trenches 86. The etching may be any acceptable etch process, such as wet or dry etching, RIE, NBE, the like, or a combination thereof. The etching may be anisotropic. Etching the OS layer 92 may expose portions of the memory film 90 on bottom surfaces of the trenches 86. Thus, portions of the OS layer 92 on opposing sidewalls of the trenches 86 may be separated from each other, which improves isolation between the memory cells 202 of the memory array 200 (see FIGS. 1A and 1B).

Figure 15A:
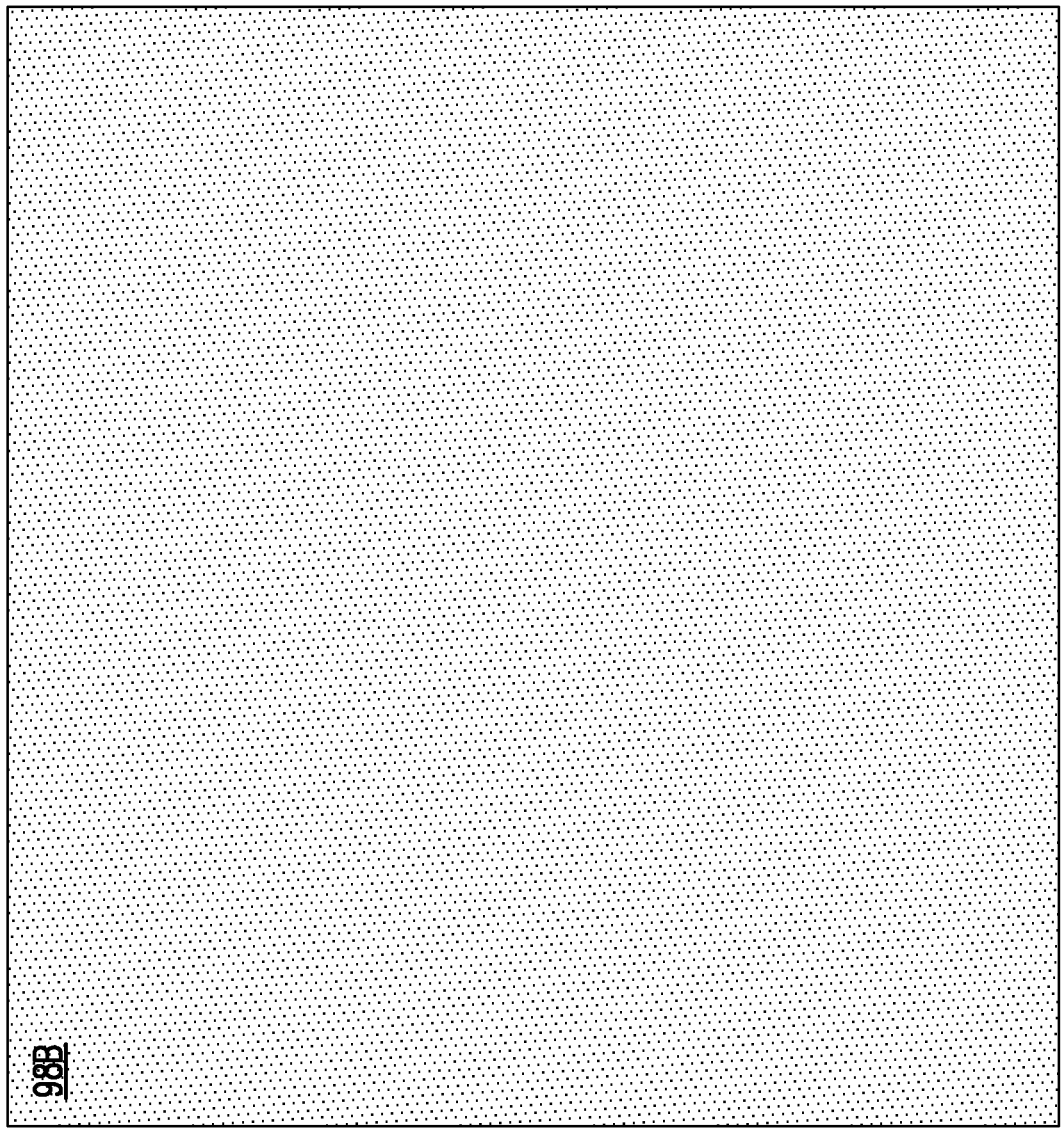
Figure 15B:
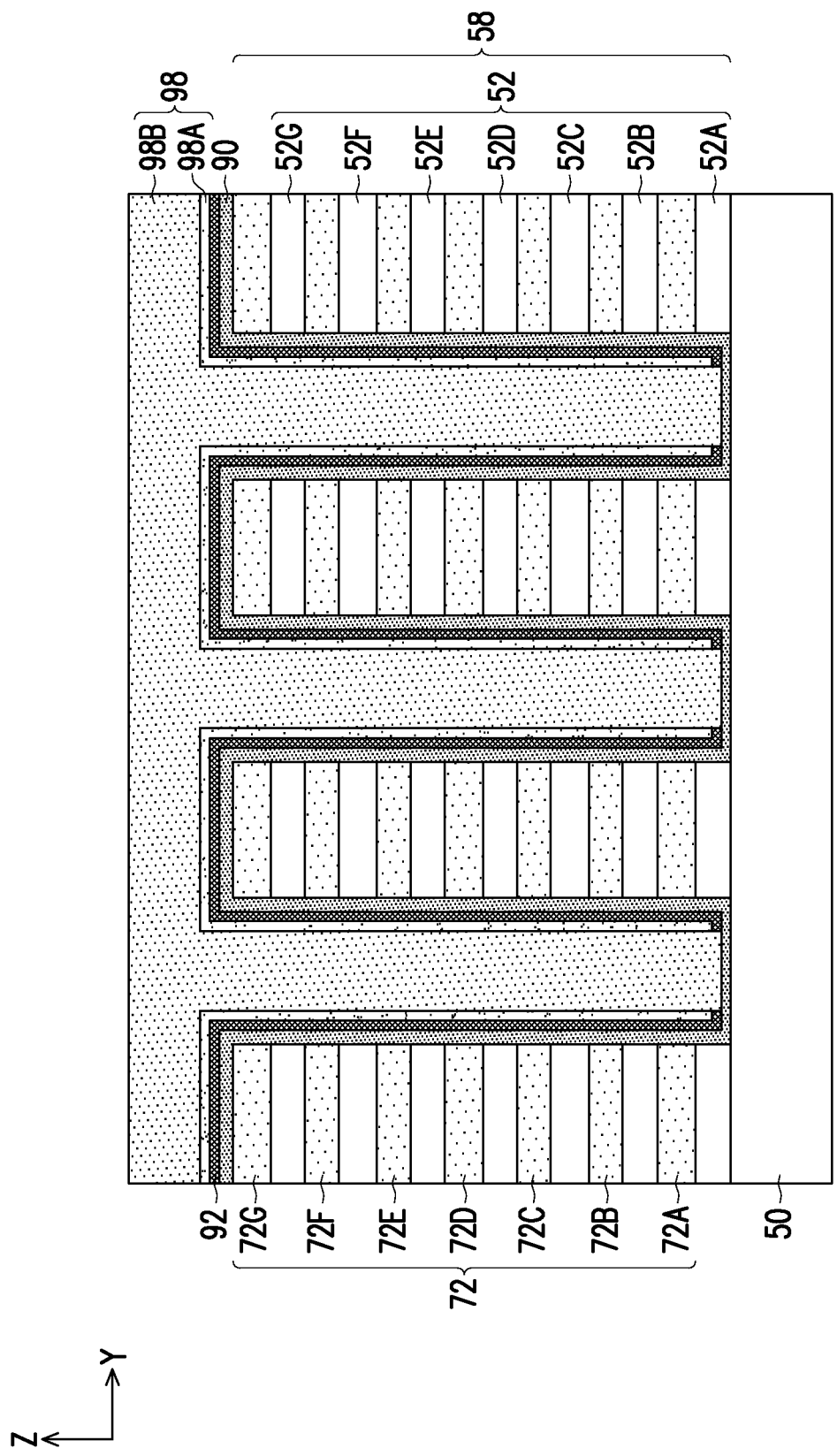

In FIGS. 15A and 15B, additional dielectric materials 98B are deposited to fill remaining portions of the trenches 86. The additional dielectric materials 98B may be formed of materials and by processes the same as or similar to those of the first dielectric layer 98A. The additional dielectric materials 98B and the first dielectric layer 98A may be referred to collectively as dielectric materials 98.

Figure 16A:
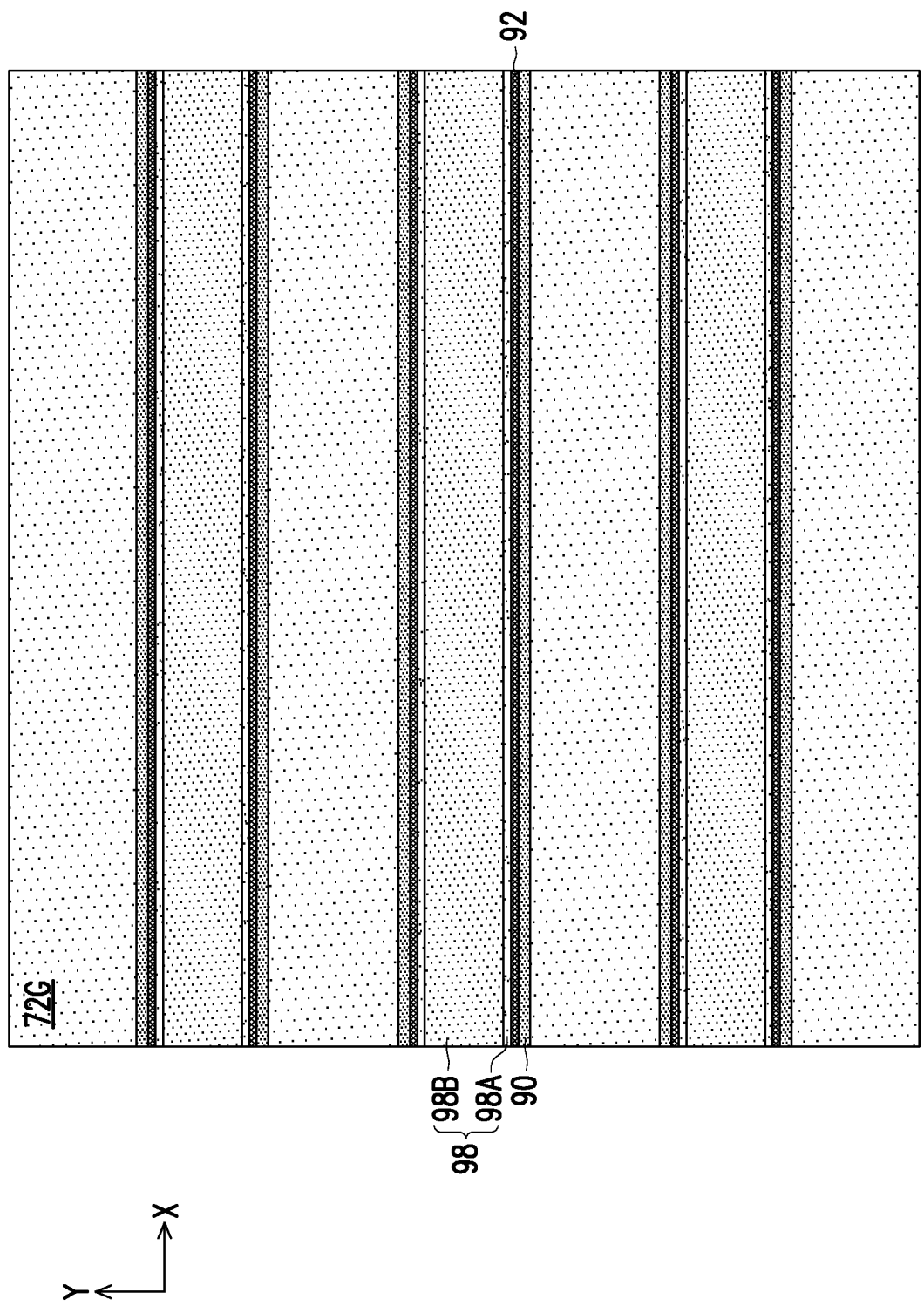
Figure 16B:
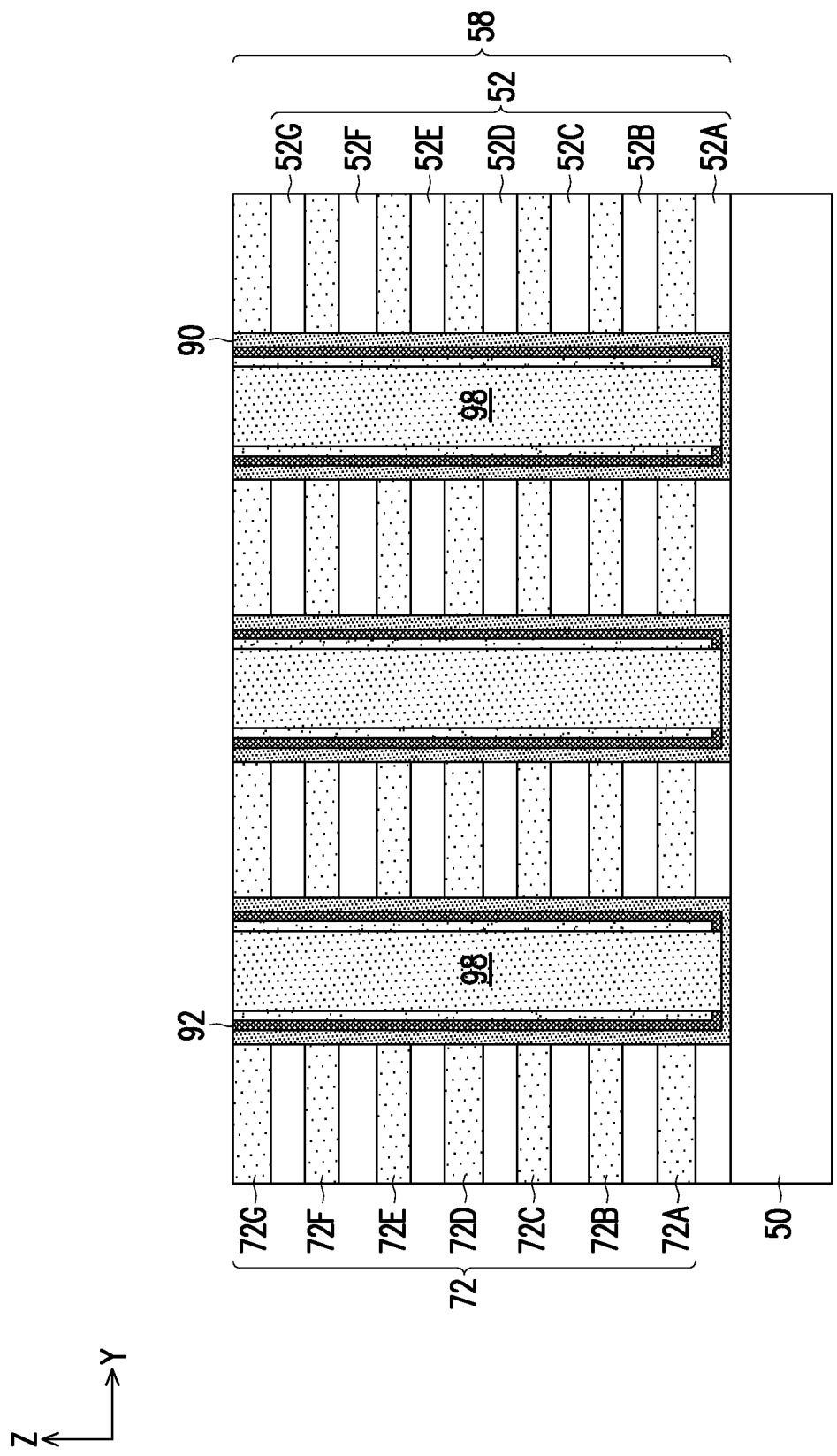

In FIGS. 16A and 16B, a removal process is applied to the dielectric materials 98, the OS layer 92, and the memory film 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the conductive lines 72G), the memory film 90, the OS layer 92, and the dielectric materials 98 are level after the planarization process is complete.

FIGS. 17A through 20C illustrate intermediate steps of manufacturing dielectric materials 102, conductive lines 106 (e.g., bit lines), and conductive lines 108 (e.g., source lines) in the memory array 200. The conductive lines 106 and the conductive lines 108 may extend in a direction perpendicular to the conductive lines 72 such that individual memory cells 202 of the memory array 200 may be selected for read and write operations.

Figure 17B:
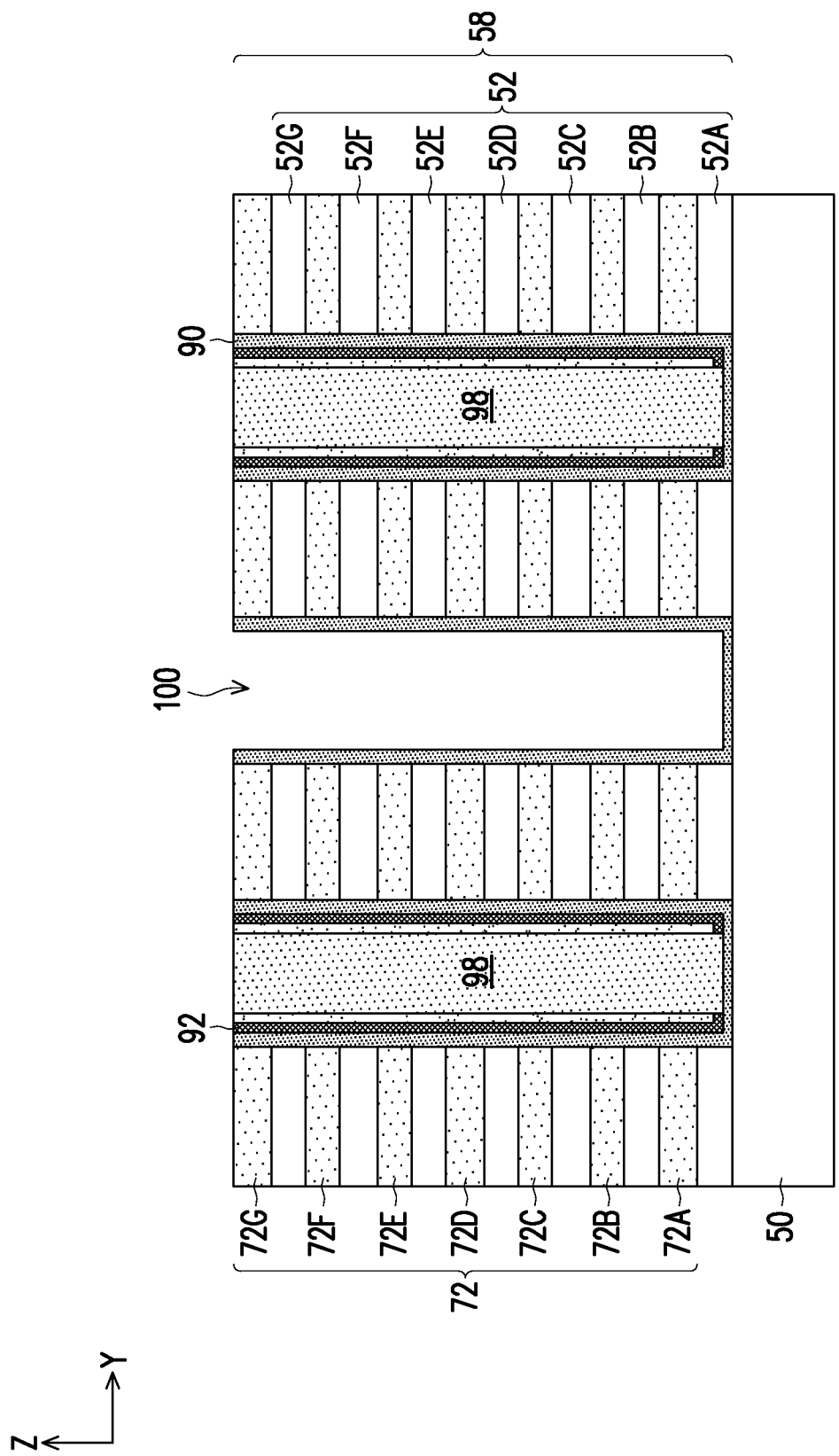

In FIGS. 17A and 17B, trenches 100 are patterned through the dielectric materials 98 and the OS layer 92. The trenches 100 may be patterned in the dielectric materials 98 and the OS layer 92 through a combination of photolithography and etching. The etching may be any acceptable etching processes, such as wet or dry etching, RIE, NBE, the like, or a combination thereof. The etching may be anisotropic. The trenches 100 may be disposed between opposing sidewalls of the memory film 90 and the trenches 100 may physically separate adjacent stacks of the memory cells 202 in the memory array 200 (see FIG. 1A).

Figure 18A:
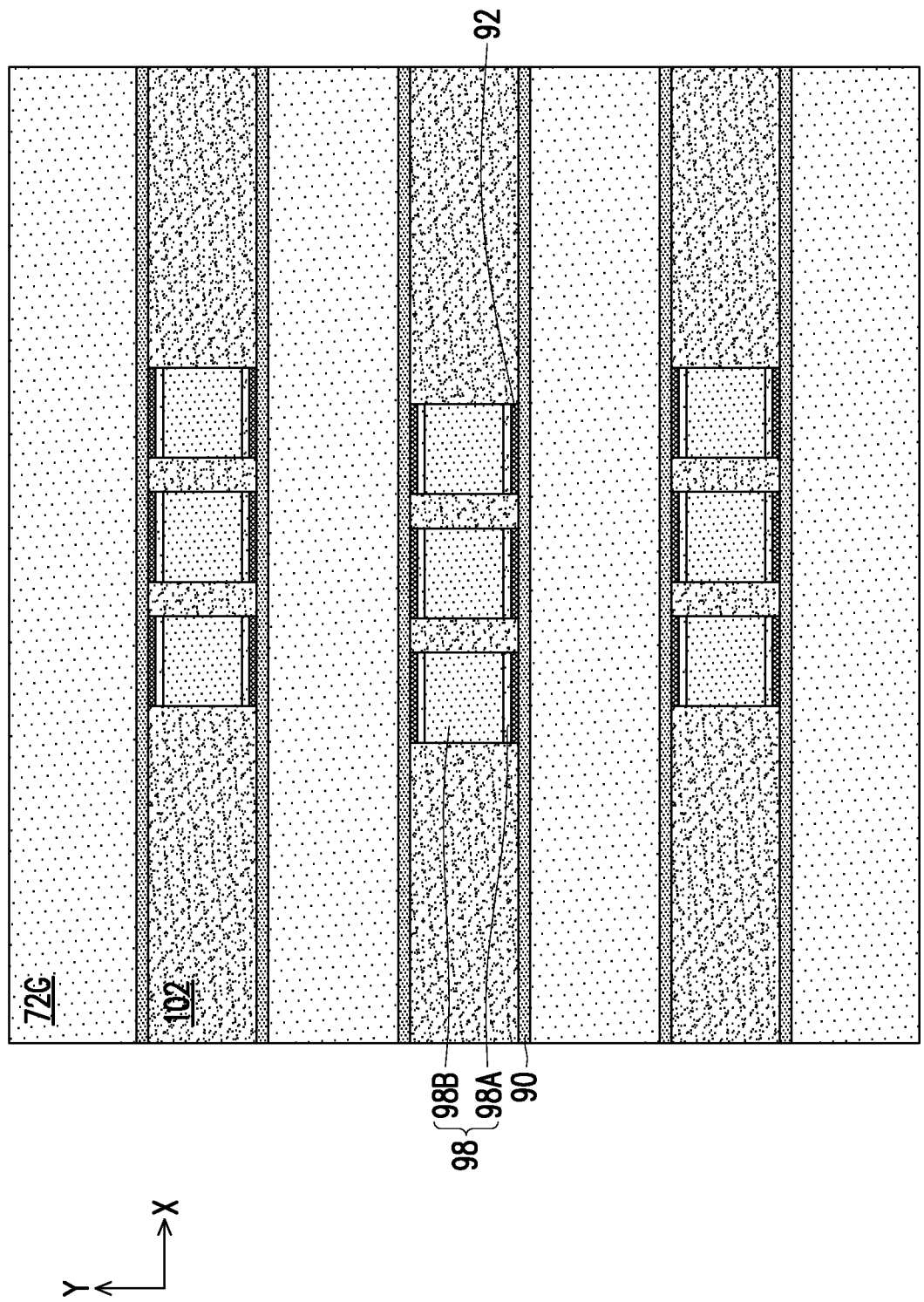
Figure 18B:
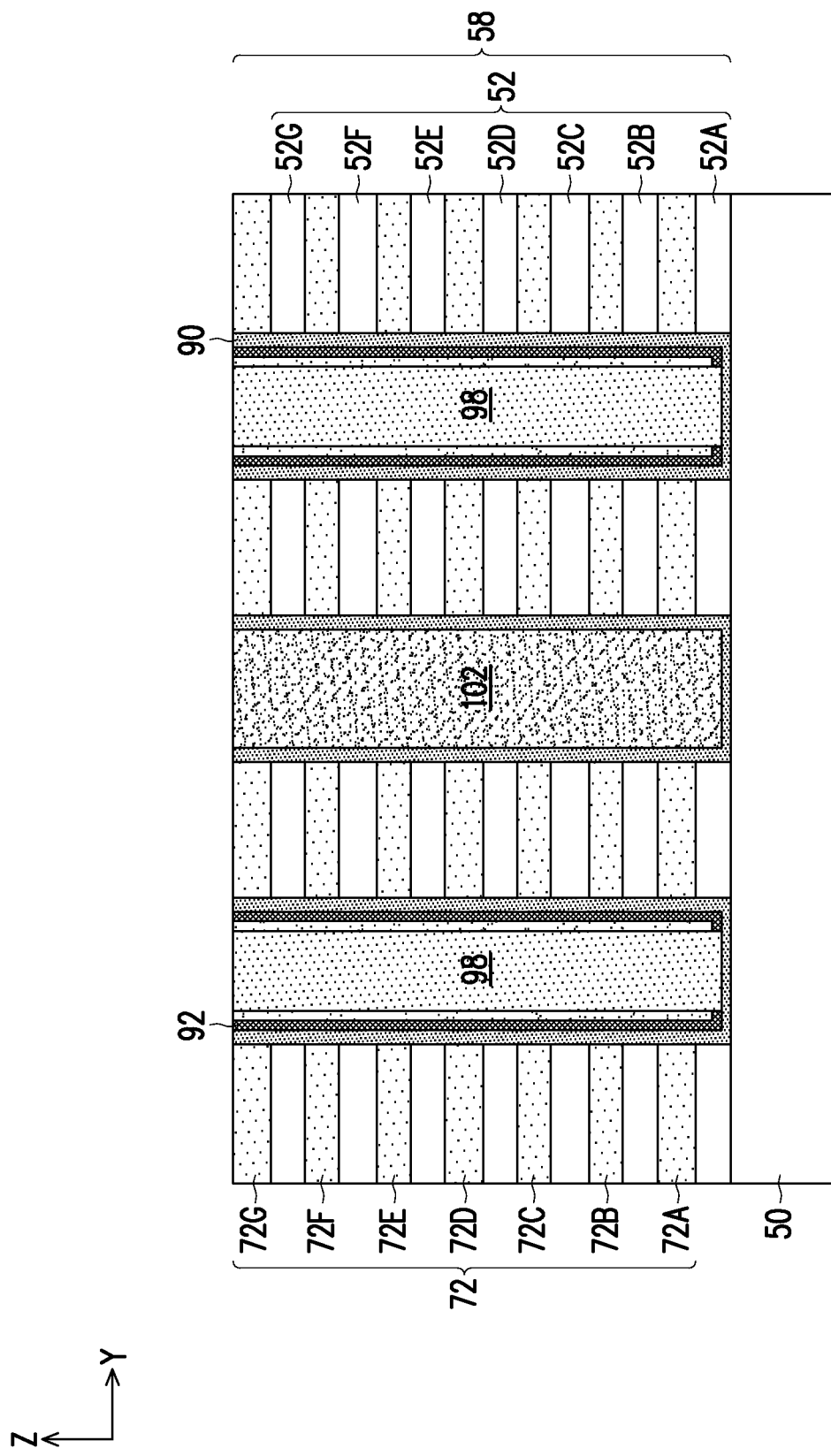

In FIGS. 18A and 18B, dielectric materials 102 are deposited in and fill the trenches 100. The dielectric materials 102 may include, for example, silicon oxide, silicon nitride, silicon oxynitride, or the like, which may be deposited by CVD, PVD, ALD, PECVD, or the like. The dielectric materials 102 may extend along sidewalls and bottom surfaces of the trenches 100 over the OS layer 92. After deposition, a planarization process (e.g., a CMP, an etch-back, or the like) may be performed to remove excess portions of the dielectric materials 102. In the resulting structure, top surfaces of the multi-layer stack 58, the memory film 90, the OS layer 92, the dielectric materials 98, and the dielectric materials 102 may be substantially level (e.g., within process variations) with one another.

In some embodiments, materials of the dielectric materials 98 and the dielectric materials 102 may be selected so that they may be etched selectively relative each other. For example, in some embodiments, the dielectric materials 98 are an oxide and the dielectric materials 102 are a nitride. In some embodiments, the dielectric materials 98 are a nitride and the dielectric materials 102 are an oxide. Other materials are also possible.

Figure 19A:
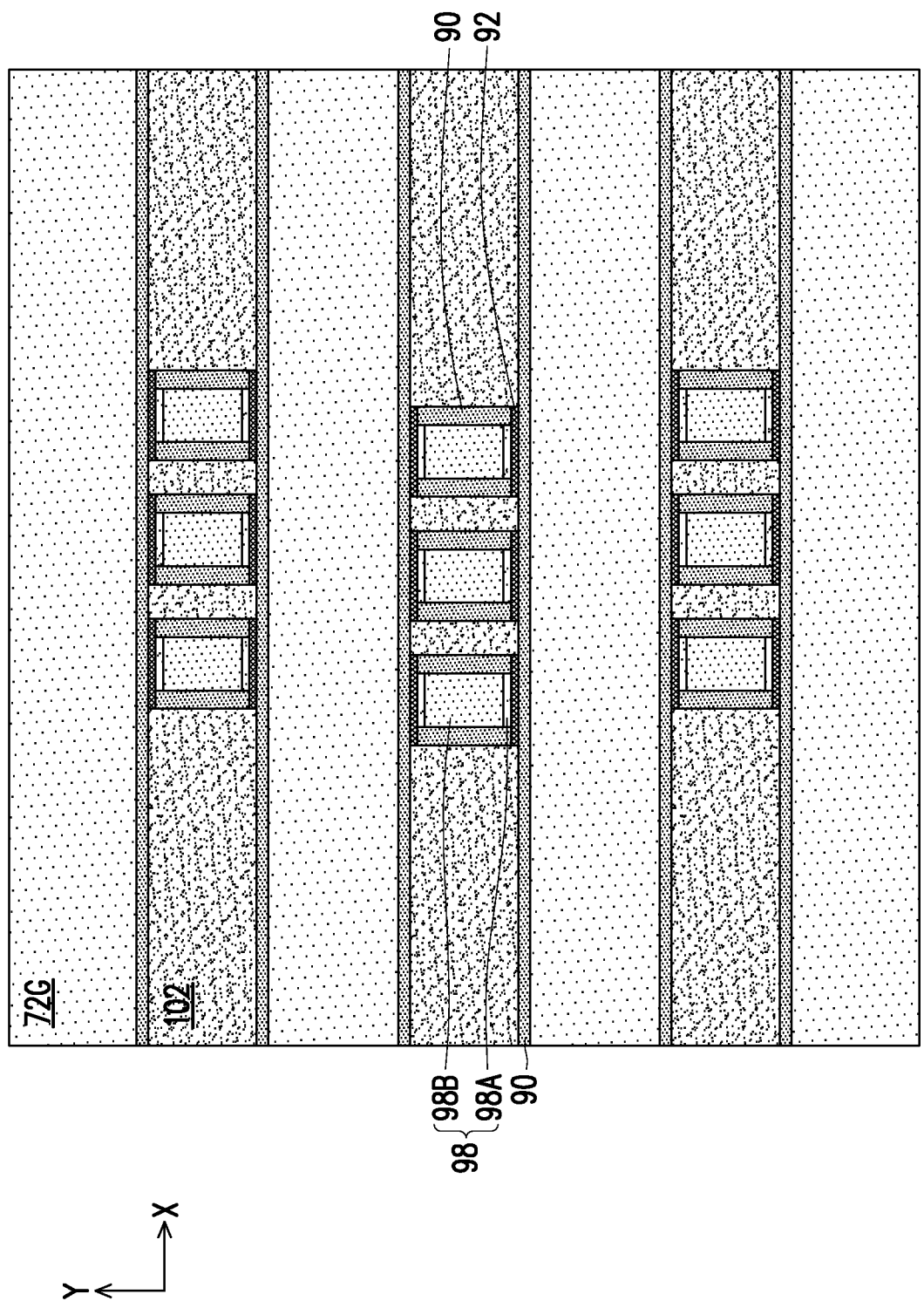
Figure 19B:
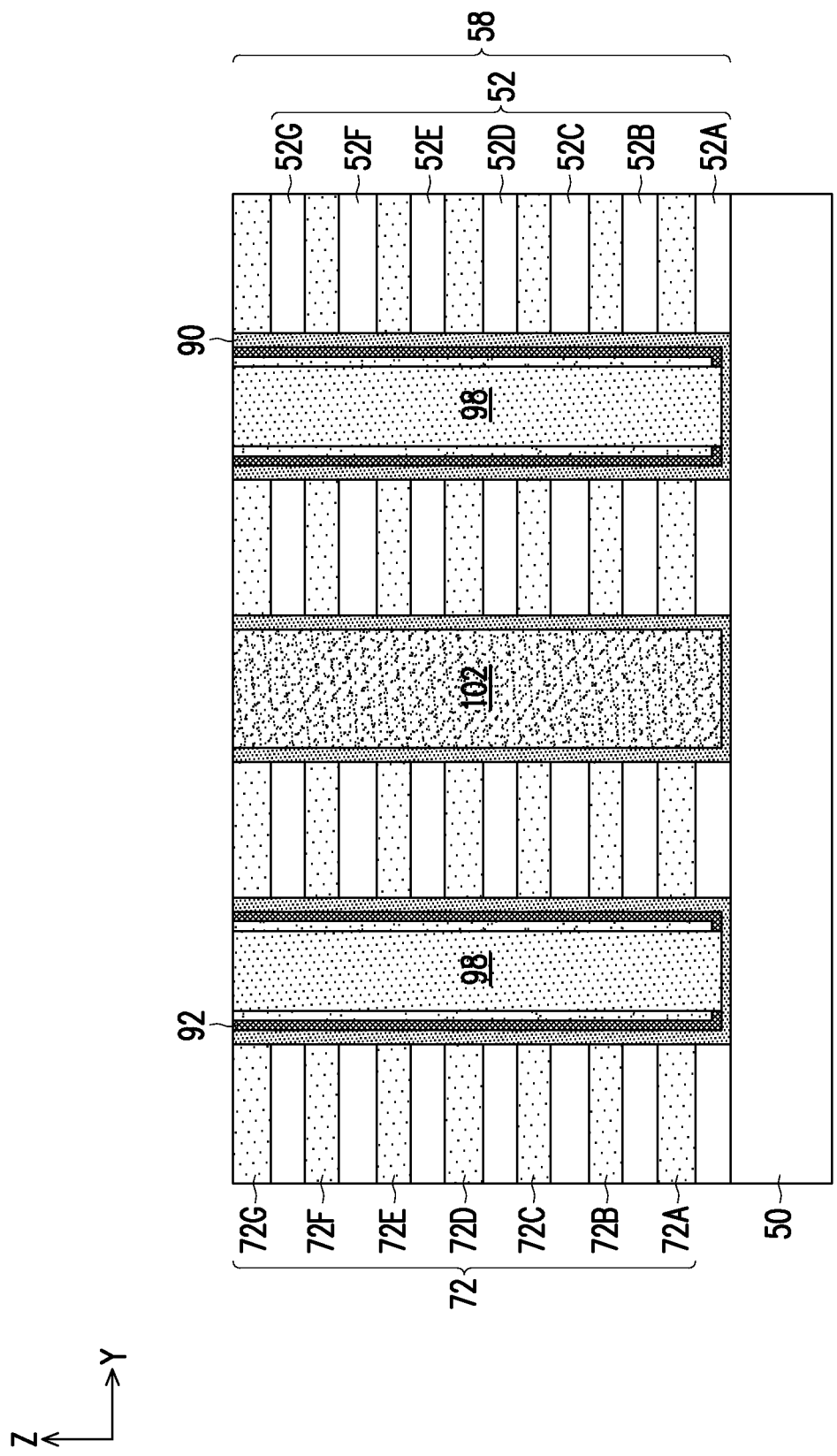
Figure 19C:
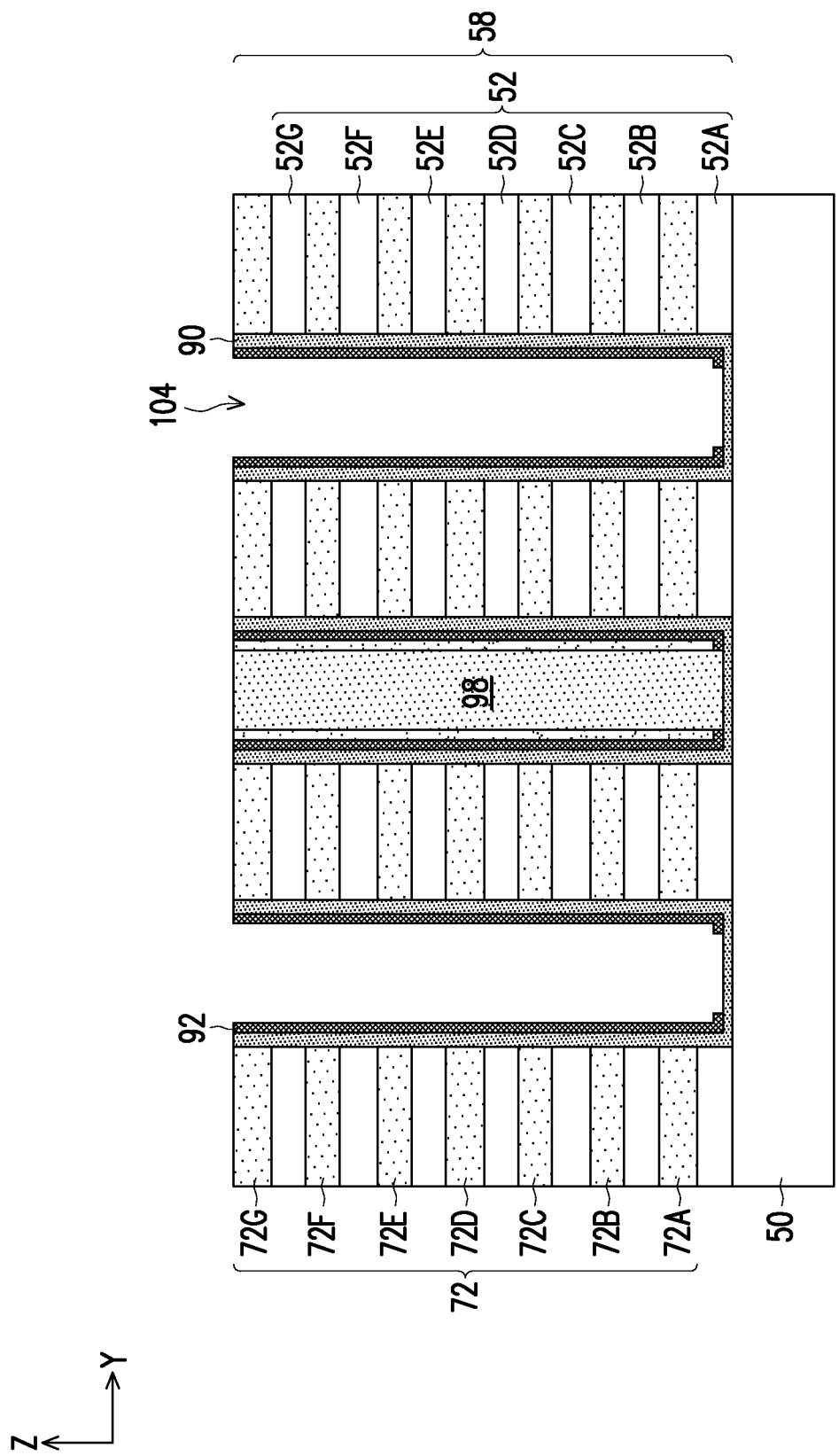

In FIGS. 19A and 19B, trenches 104 are patterned through the dielectric materials 98. The trenches 104 may be subsequently used to form conductive lines. The trenches 104 may be patterned through the dielectric materials 98 using a combination of photolithography and etching. The etching may be any acceptable etch process, such as wet or dry etching, RIE, NBE, the like, or a combination thereof. The etching may be anisotropic. The etching may use etchants that etch the dielectric materials 98 without significantly etching the dielectric materials 102. A pattern of the trenches 104 may correspond to that of subsequently formed conductive lines (such as the conductive lines 106 and the conductive lines 108, discussed below with respect to FIGS. 20A through 20C). Portions of the dielectric materials 98 may remain between each pair of the trenches 104, and the dielectric materials 102 may be disposed between adjacent pairs of the trenches 104.

Figure 20A:
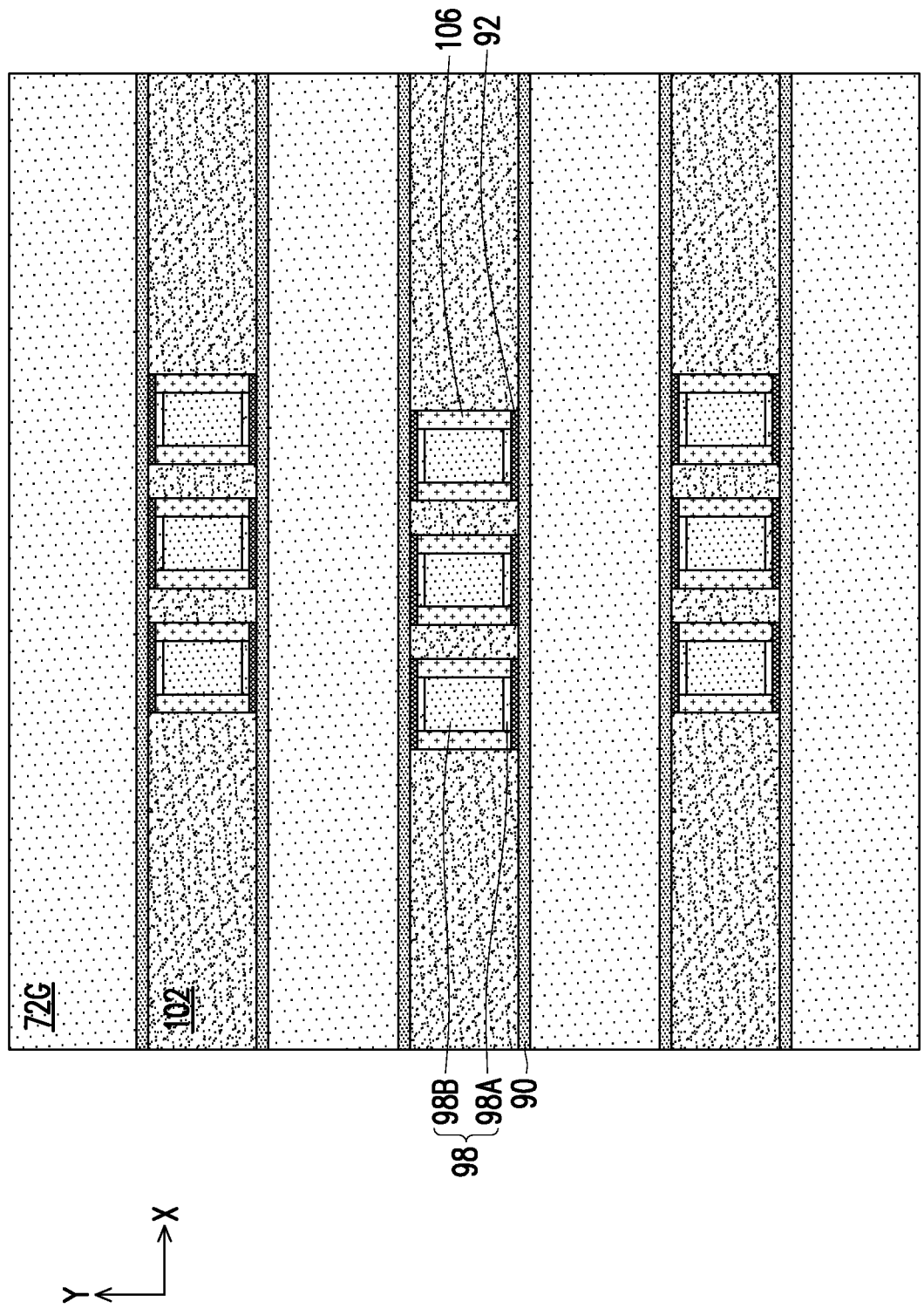
Figure 20B:
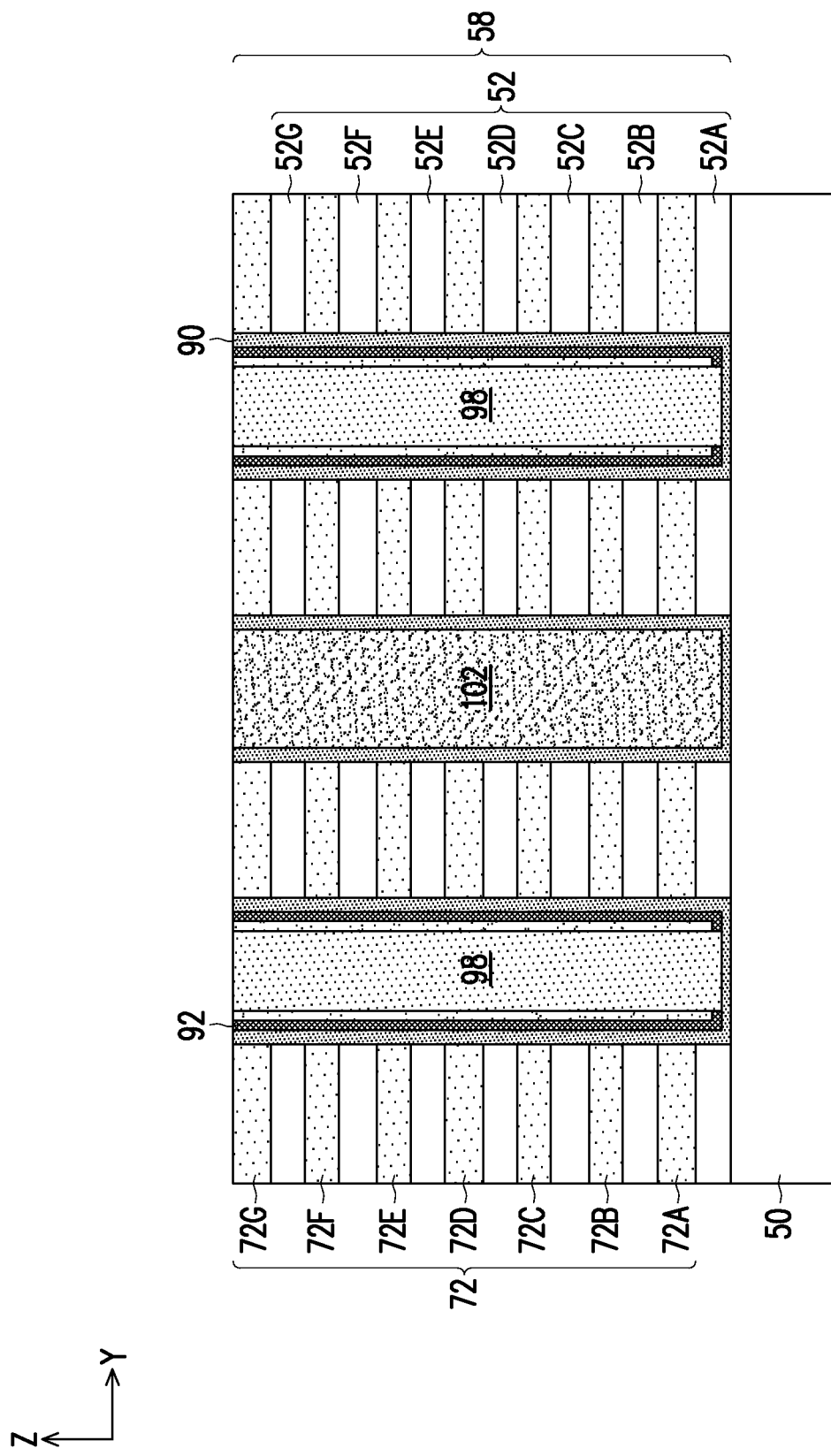
Figure 20C:
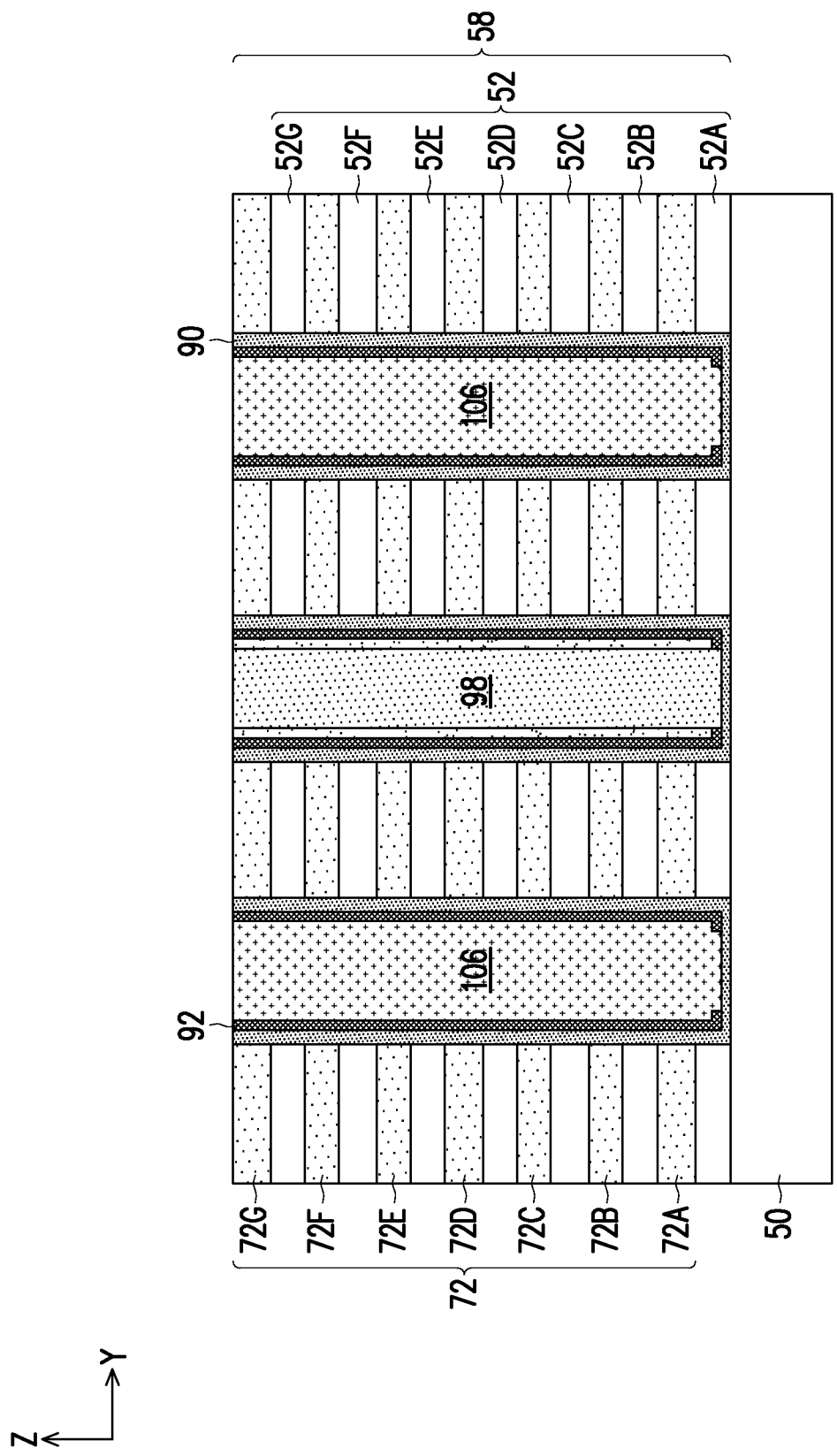

In FIGS. 20A through 20C, the trenches 104 are filled with a conductive material to form conductive lines 106 and conductive lines 108. The conductive lines 106 and the conductive lines 108 may each comprise conductive materials such as copper, titanium, titanium nitride, tantalum, tantalum nitride, tungsten, ruthenium, aluminum, combinations thereof, or the like. The conductive lines 106 and the conductive lines 108 may be formed using, for example, CVD, ALD, PVD, PECVD, or the like. After the conductive materials are deposited, a planarization (e.g., a CMP, an etch-back, or the like) may be performed to remove excess portions of the conductive materials, thereby forming the conductive lines 106 and the conductive lines 108. In the resulting structure, top surfaces of the multi-layer stack 58, the memory film 90, the OS layer 92, the dielectric materials 98, the dielectric materials 102, the conductive lines 106, and the conductive lines 108 may be substantially level (e.g., within process variations) with one another.

The conductive lines 106 may correspond to bit lines in the memory array 200 and the conductive lines 108 may correspond to source lines in the memory array 200. Further, the conductive lines 106 and the conductive lines 108 may provide source/drain electrodes for the transistors 204 in the memory array 200. Although FIG. 20C illustrates a cross-sectional view that only shows the conductive lines 106, a cross-sectional view of the conductive lines 108 may be similar.

Figure 26:
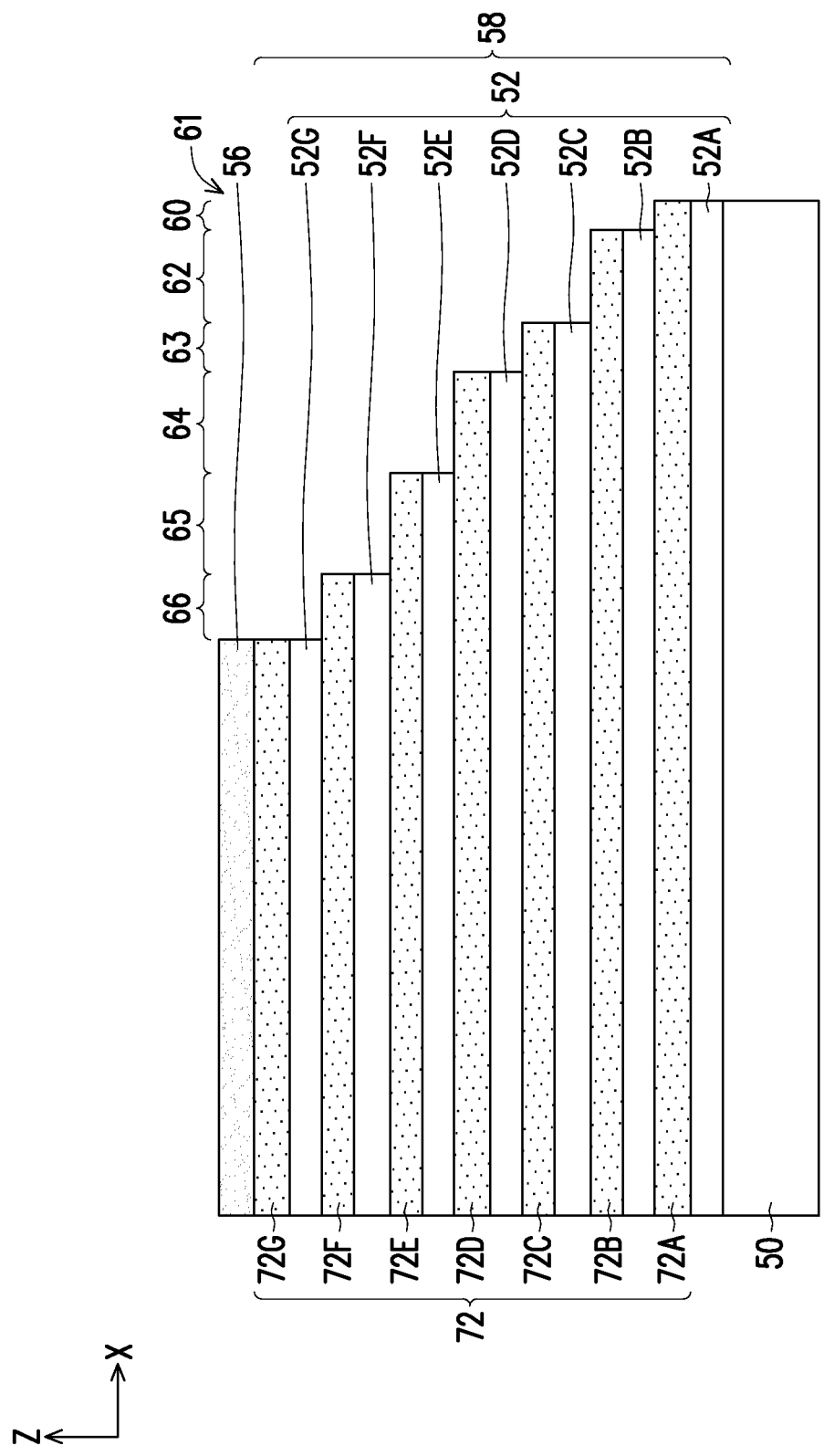
Figure 27:
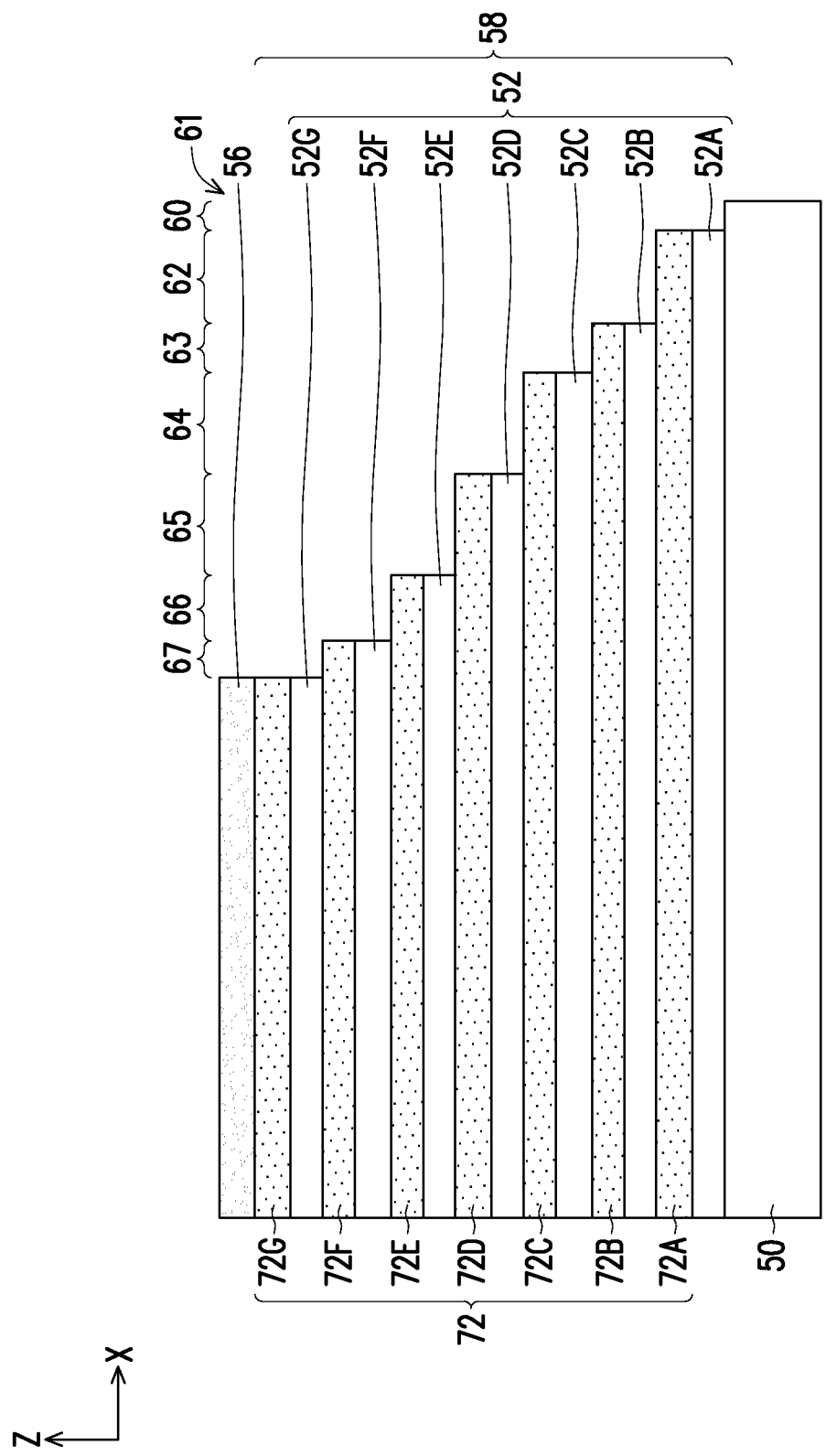
Figure 28:
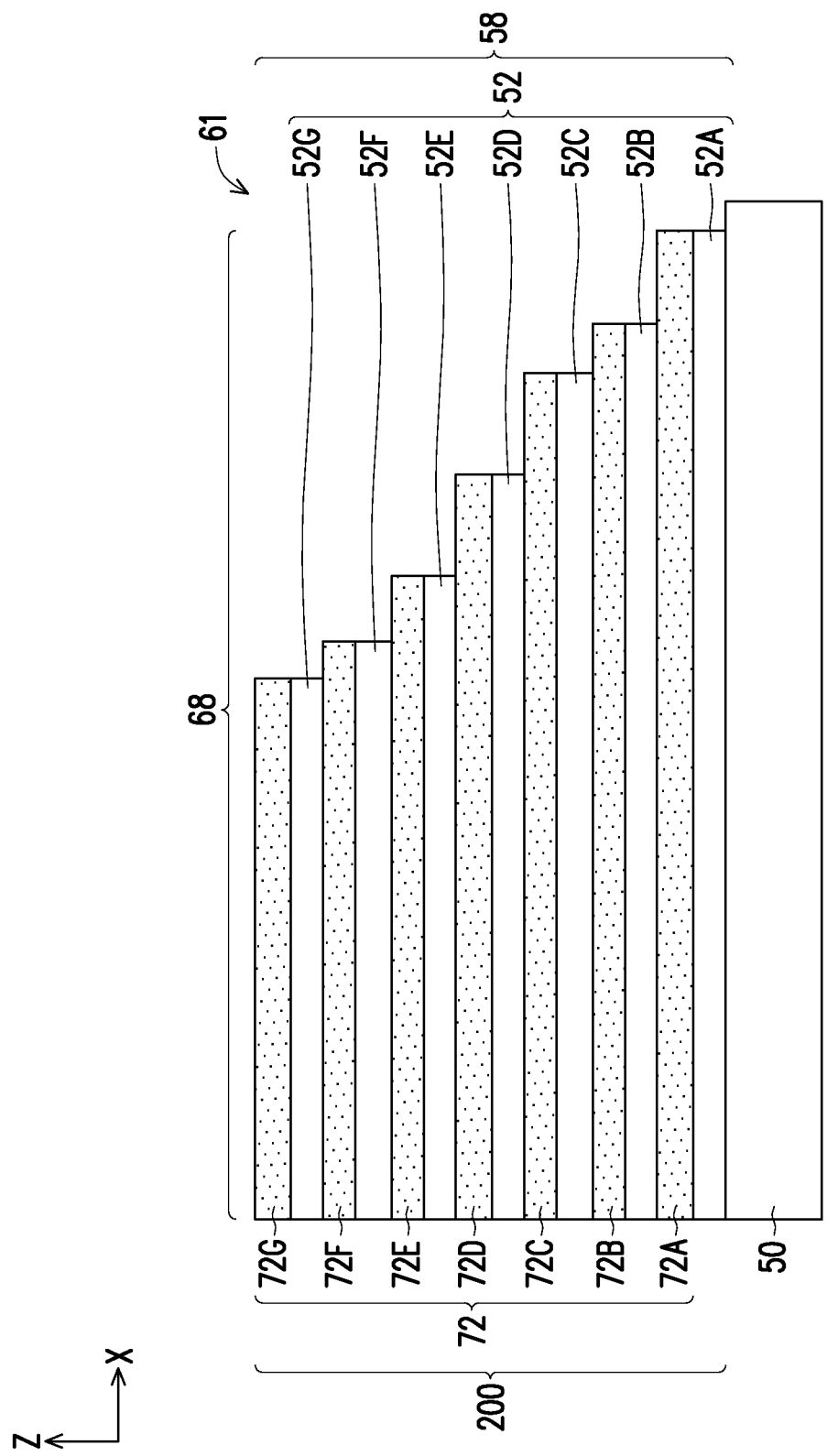

FIGS. 21 through 28 illustrate patterning the multi-layer stack 58 to form a staircase structure 68 (illustrated in FIG. 28). Although the staircase structure 68 is discussed as being formed after forming the channel regions for the transistors 204, the conductive lines 106, and the conductive lines 108, in some embodiments, the staircase structure 68 may be formed before forming the channel regions for the transistors 204, the conductive lines 106, and the conductive lines 108. For example, the manufacturing steps illustrated in and described with respect to FIGS. 21 through 28 to form the staircase structure 68 may be performed prior to the manufacturing steps illustrated in and described with respect to FIGS. 10A through 20C. The same or similar processes may be used in staircase-first and staircase-last embodiments.

Figure 21:
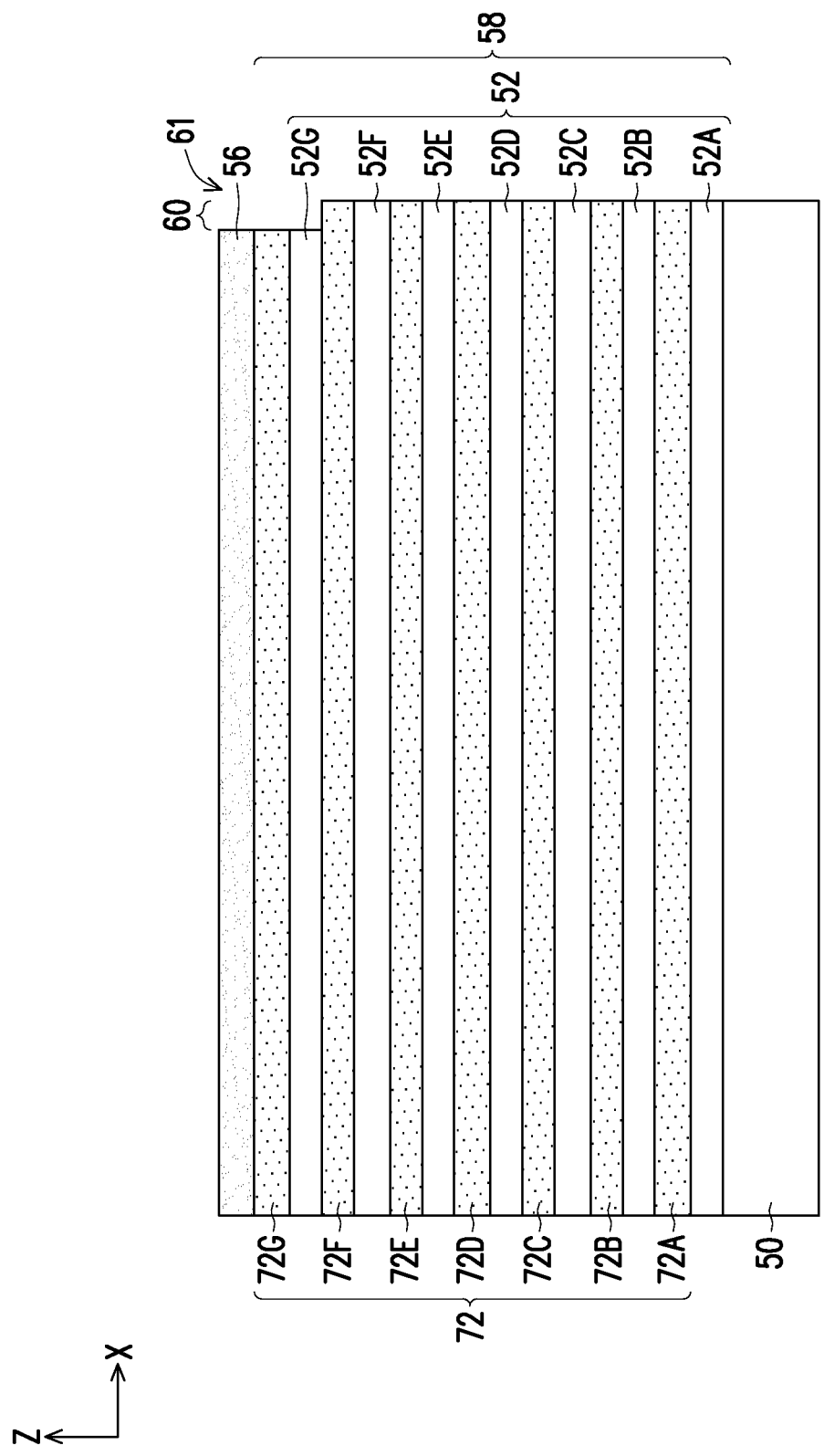

In FIG. 21 a photoresist 56 is formed over the multi-layer stack 58. The photoresist 56 can be formed by using a spin-on technique and can be patterned using acceptable photolithography techniques. Patterning the photoresist 56 may expose the multi-layer stack 58 in a region 60, while masking remaining portions of the multi-layer stack 58. For example, a topmost layer of the multi-layer stack 58 (e.g., the conductive lines 72G) may be exposed in the region 60.

Further in FIG. 21, the exposed portions of the multi-layer stack 58 in the region 60 are etched using the photoresist 56 as a mask. The etching may be any acceptable etch process, such as wet or dry etching, RIE, NBE, the like, or a combination thereof. The etching may be anisotropic. The etching may remove portions of the conductive lines 72G and the dielectric layer 52G in the region 60 and define an opening 61. Because the conductive lines 72G and the dielectric layer 52G have different material compositions, etchants used to remove exposed portions of these layers may be different. In some embodiments, the dielectric layer 52G acts as an etch stop layer while etching the conductive lines 72G, and the conductive lines 72F act as an etch stop layer while etching the dielectric layer 52G. As a result, the portions of the conductive lines 72G and the dielectric layer 52G may be selectively removed without removing remaining layers of the multi-layer stack 58, and the opening 61 may be extended to a desired depth. Alternatively, a timed etch processes may be used to stop the etching of the opening 61 after the opening 61 reach a desired depth. In the resulting structure, the conductive lines 72F are exposed in the region 60.

Figure 22:
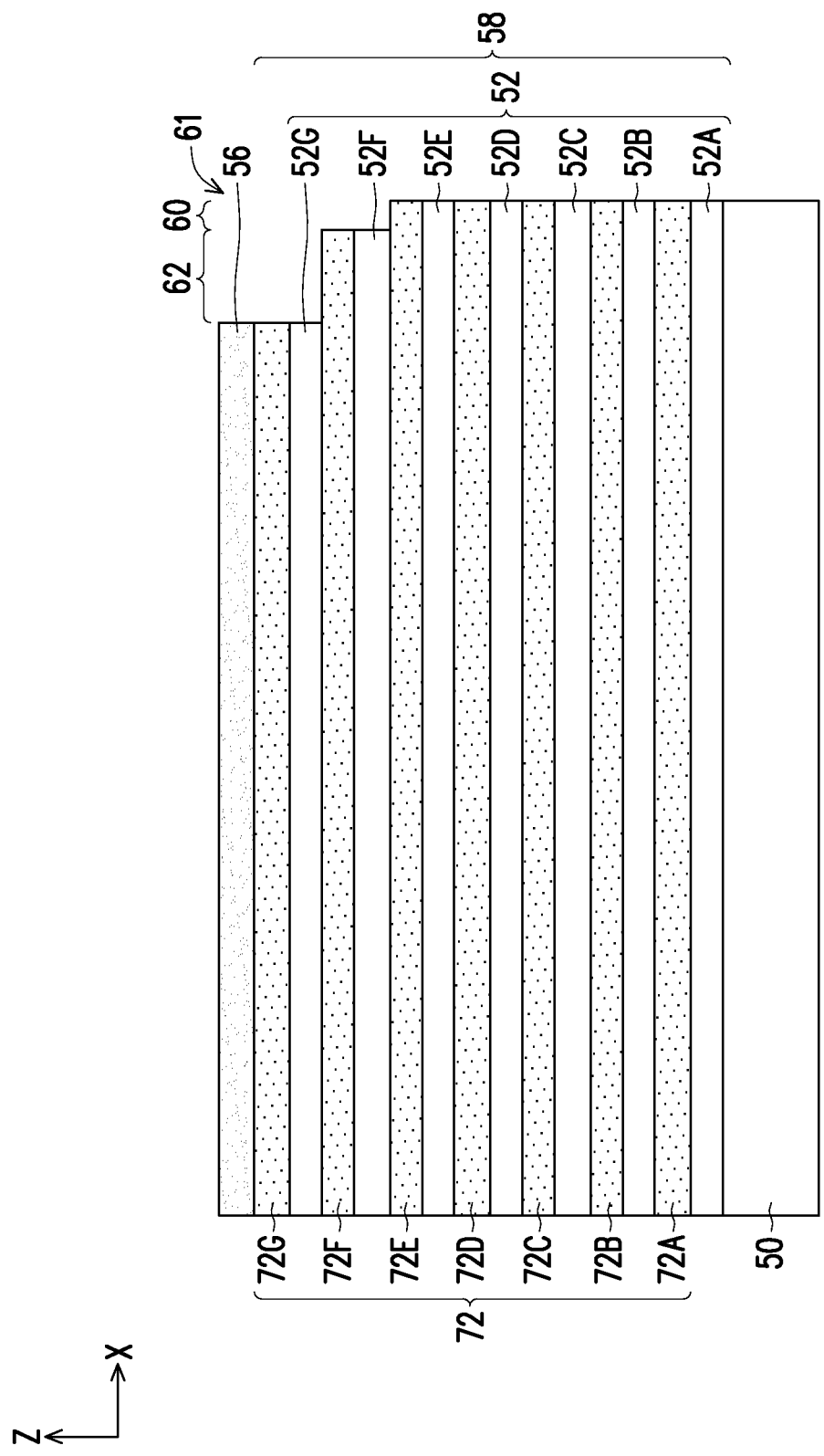

In FIG. 22, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60 and a region 62 are exposed. For example, top surfaces of the conductive lines 72G in the region 62 and top surfaces of the conductive lines 72F in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the conductive lines 72 and the dielectric layers 52 have different material compositions, etchants used to remove exposed portions of these layers may be different. In some embodiments, the dielectric layers 52G and 52F act as etch stop layers while etching the conductive lines 72G and 72F, respectively, and the conductive lines 72F and 72E act as etch stop layers while etching dielectric layers 52G and 52F, respectively. As a result, the portions of the conductive lines 72 and the dielectric layers 52 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, unetched portions of the conductive lines 72 and the dielectric layers 52 act as masks for underlying layers, and as a result a previous pattern of the conductive lines 72G and the dielectric layers 52G (see FIG. 21) may be transferred to the underlying conductive lines 72F and the underlying dielectric layers 52F. In the resulting structure, the conductive lines 72F are exposed in the region 62 and the conductive lines 72E are exposed in the region 60.

Figure 23:
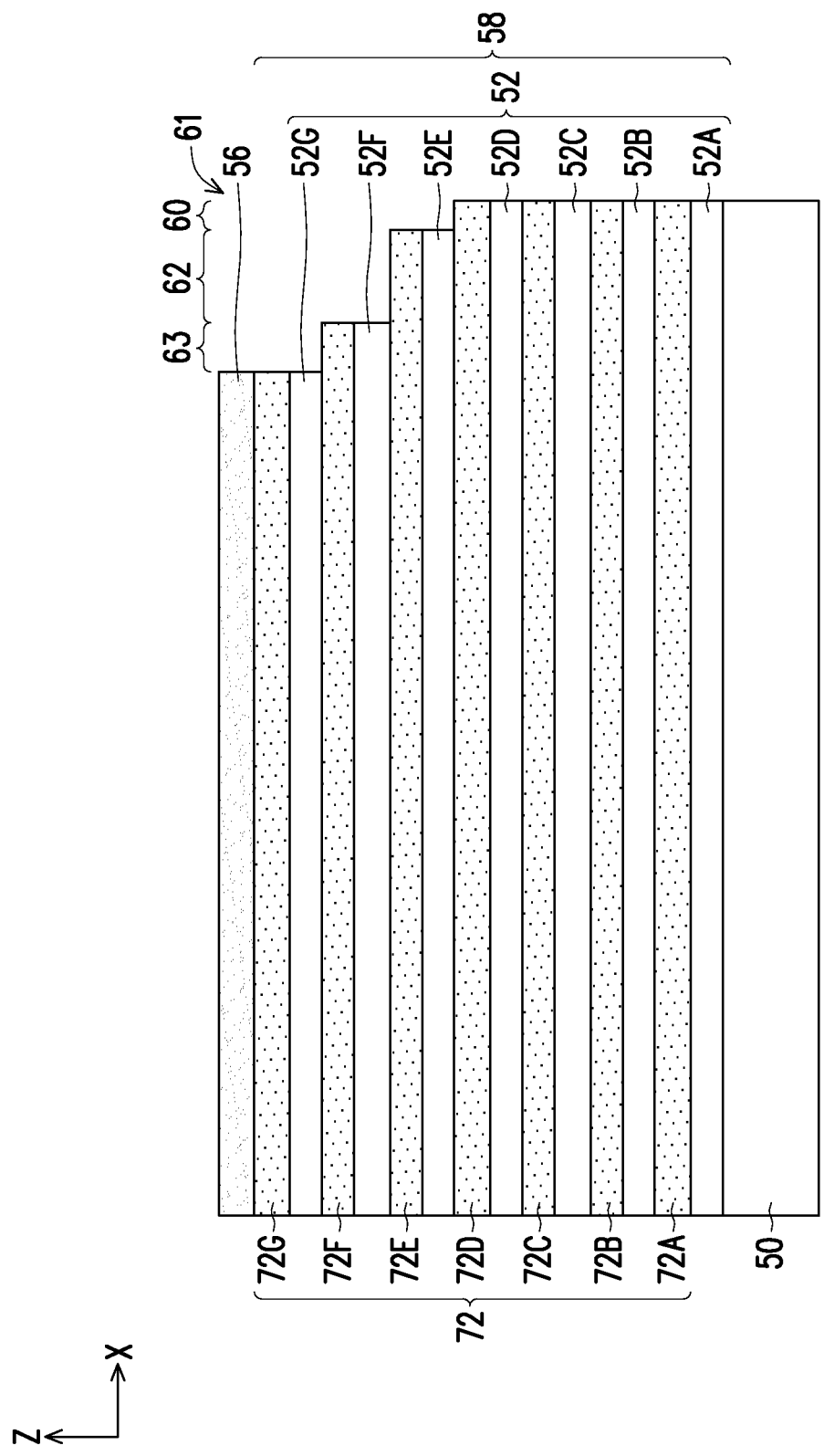

In FIG. 23, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60, the region 62, and a region 63 are exposed. For example, top surfaces of the conductive lines 72G in the region 63, top surfaces of the conductive lines 72F in the region 62, and top surfaces of the conductive lines 72E in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the conductive lines 72 and the dielectric layers 52 have different material compositions, etchants used to remove exposed portions of these layers may be different. In some embodiments, the dielectric layers 52G, 52F, and 52E act as etch stop layers while etching the conductive lines 72G, 72F, and 72E, respectively, and the conductive lines 72F, 72E, and 72D act as etch stop layers while etching dielectric layers 52G, 52F, and 52E, respectively. As a result, the portions of the conductive lines 72 and the dielectric layers 52 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, unetched portions of the conductive lines 72 and the dielectric layers 52 act as masks for underlying layers, and as a result a previous pattern of the conductive lines 72G and 72F and the dielectric layers 52G and 52F (see FIG. 22) may be transferred to the underlying conductive lines 72F and 72E and the underlying dielectric layers 52F and 52E. In the resulting structure, the conductive lines 72F are exposed in the region 63, the conductive lines 72E are exposed in the region 62, and the conductive lines 72D are exposed in the region 60.

Figure 24:
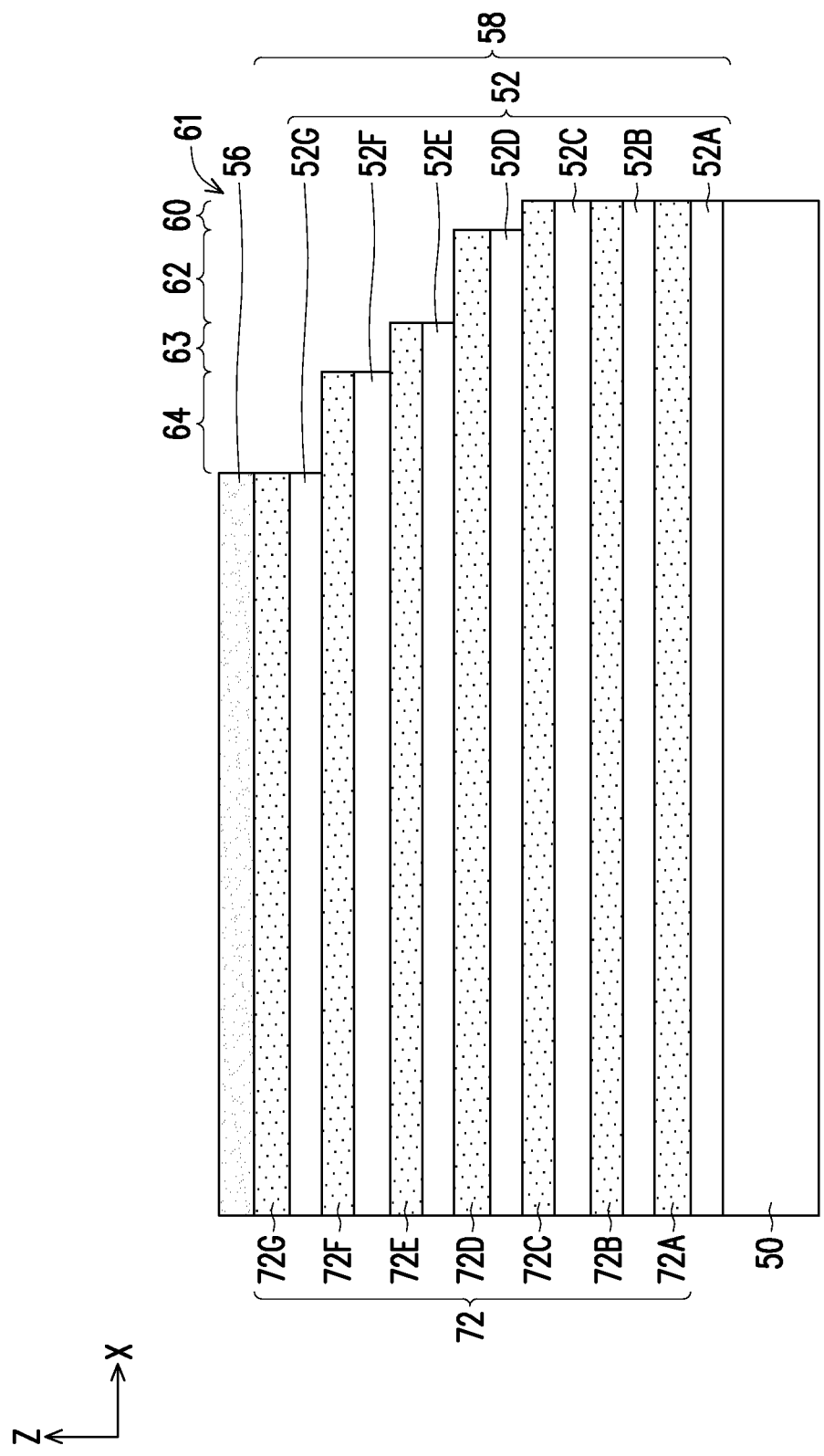

In FIG. 24, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60, the region 62, the region 63, and a region 64 are exposed. For example, top surfaces of the conductive lines 72G in the region 64, top surfaces of the conductive lines 72F in the region 63, top surfaces of the conductive lines 72E in the region 62, and top surfaces of the conductive lines 72D in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the conductive lines 72 and the dielectric layers 52 have different material compositions, etchants used to remove exposed portions of these layers may be different. In some embodiments, the dielectric layers 52G, 52F, 52E, and 52D act as etch stop layers while etching the conductive lines 72G, 72F, 72E, and 72D, respectively, and the conductive lines 72F, 72E, 72D, and 72C act as etch stop layers while etching dielectric layers 52G, 52F, 52E, and 52D, respectively. As a result, the portions of the conductive lines 72 and the dielectric layers 52 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, unetched portions of the conductive lines 72 and the dielectric layers 52 act as masks for underlying layers, and as a result a previous pattern of the conductive lines 72G-72E and the dielectric layers 52G-52E (see FIG. 23) may be transferred to the underlying conductive lines 72F-72D and the underlying dielectric layers 52F-52D. In the resulting structure, the conductive lines 72F are exposed in the region 64, the conductive lines 72E are exposed in the region 63, the conductive lines 72D are exposed in the region 62, and the conductive lines 72C are exposed in the region 60.

Figure 25:
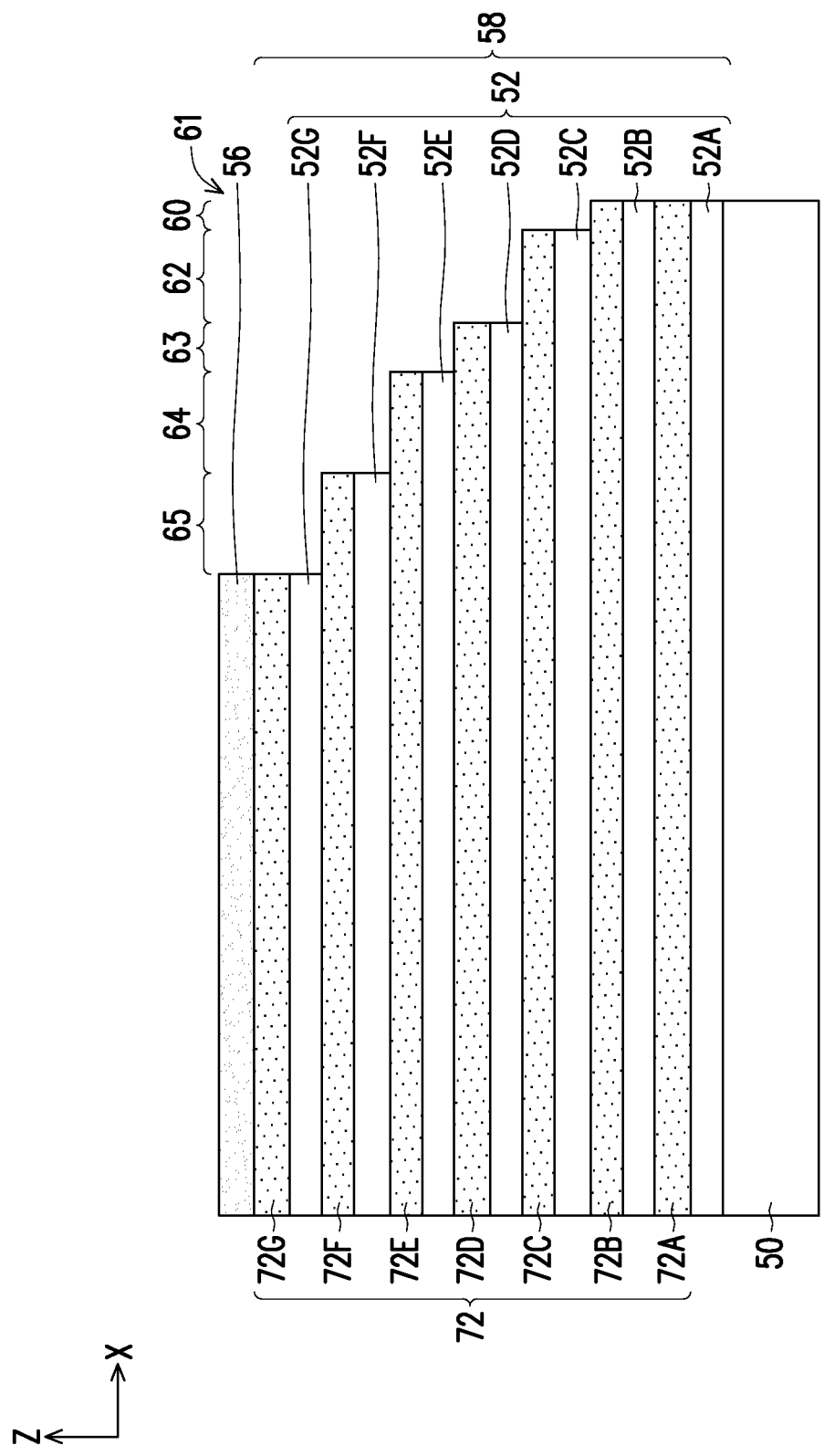

In FIG. 25, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60, the region 62, the region 63, the region 64, and a region 65 are exposed. For example, top surfaces of the conductive lines 72G in the region 65, top surfaces of the conductive lines 72F in the region 64, top surfaces of the conductive lines 72E in the region 63, top surfaces of the conductive lines 72D in the region 62, and top surfaces of the conductive lines 72C in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the conductive lines 72 and the dielectric layers 52 have different material compositions, etchants used to remove exposed portions of these layers may be different. In some embodiments, the dielectric layers 52G, 52F, 52E, 52D, and 52C act as etch stop layers while etching the conductive lines 72G, 72F, 72E, 72D, and 72C, respectively, and the conductive lines 72F, 72E, 72D, 72C, and 72B act as etch stop layers while etching dielectric layers 52G, 52F, 52E, 52D, and 52C, respectively. As a result, the portions of the conductive lines 72 and the dielectric layers 52 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, unetched portions of the conductive lines 72 and the dielectric layers 52 act as masks for underlying layers, and as a result a previous pattern of the conductive lines 72G-72D and the dielectric layers 52G-52D (see FIG. 24) may be transferred to the underlying conductive lines 72F-72C and the underlying dielectric layers 52F-52C. In the resulting structure, the conductive lines 72F are exposed in the region 65, the conductive lines 72E are exposed in the region 64, the conductive lines 72D are exposed in the region 63, the conductive lines 72C are exposed in the region 62, and the conductive lines 72B are exposed in the region 60.

In FIG. 26, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60, the region 62, the region 63, the region 64, the region 65, and a region 66 are exposed. For example, top surfaces of the conductive lines 72G in the region 66, top surfaces of the conductive lines 72F in the region 65, top surfaces of the conductive lines 72E in the region 64, top surfaces of the conductive lines 72D in the region 63, top surfaces of the conductive lines 72C in the region 62 may be exposed, and top surfaces of the conductive lines 72B in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the conductive lines 72 and the dielectric layers 52 have different material compositions, etchants used to remove exposed portions of these layers may be different. In some embodiments, the dielectric layers 52G, 52F, 52E, 52D, 52C, and 52B act as etch stop layers while etching the conductive lines 72G, 72F, 72E, 72D, 72C, and 72B, respectively, and the conductive lines 72F, 72E, 72D, 72C, 72B, and 72A act as etch stop layers while etching dielectric layers 52G, 52F, 52E, 52D, 52C, and 52B, respectively. As a result, the portions of the conductive lines 72 and the dielectric layers 52 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, unetched portions of the conductive lines 72 and the dielectric layers 52 act as masks for underlying layers, and as a result a previous pattern of the conductive lines 72G-72C and the dielectric layers 52G-52C (see FIG. 25) may be transferred to the underlying conductive lines 72F-72B and the underlying dielectric layers 52F-52B. In the resulting structure, the conductive lines 72F are exposed in the region 66, the conductive lines 72E are exposed in the region 65, the conductive lines 72D are exposed in the region 64, the conductive lines 72C are exposed in the region 63, the conductive lines 72B are exposed in the region 62, and the conductive lines 72A are exposed in the region 60.

In FIG. 27, the photoresist 56 is trimmed to expose additional portions of the multi-layer stack 58. The photoresist 56 can be trimmed using acceptable photolithography techniques. As a result of the trimming, a width of the photoresist 56 is reduced, and portions of the multi-layer stack 58 in the region 60, the region 62, the region 63, the region 64, the region 65, the region 66, and a region 67 are exposed. For example, top surfaces of the conductive lines 72G in the region 67, top surfaces of the conductive lines 72F in the region 66, top surfaces of the conductive lines 72E in the region 65, top surfaces of the conductive lines 72D in the region 64, top surfaces of the conductive lines 72C in the region 63 may be exposed, top surfaces of the conductive lines 72B in the region 62, and top surfaces of the conductive lines 72A in the region 60 may be exposed.

Exposed portions of the multi-layer stack 58 may then be etched using the photoresist 56 as a mask. The etching may be any suitable etching process, such as wet or dry etching, RIE, NBE, the like, or a combination thereof. The etching process may be anisotropic. The etching may extend the opening 61 further into the multi-layer stack 58. Because the conductive lines 72 and the dielectric layers 52 have different material compositions, etchants used to remove exposed portions of these layers may be different. In some embodiments, the dielectric layers 52G, 52F, 52E, 52D, 52C, 52B, and 52A act as etch stop layers while etching the conductive lines 72G, 72F, 72E, 72D, 72C, 72B, and 72A, respectively, and the conductive lines 72F, 72E, 72D, 72C, 72B, and 72A and the substrate 50 act as etch stop layers while etching dielectric layers 52G, 52F, 52E, 52D, 52C, 52B, and 52A, respectively. As a result, the portions of the conductive lines 72 and the dielectric layers 52 may be selectively removed without removing remaining layers of the multi-layer stack 58, and the opening 61 may be extended to a desired depth. Alternatively, timed etch processes may be used to stop the etching of the opening 61 after the opening 61 reaches a desired depth. Further, during the etching process, unetched portions of the conductive lines 72 and the dielectric layers 52 act as masks for underlying layers, and as a result a previous pattern of the conductive lines 72G-72B and the dielectric layers 52G-52B (see FIG. 26) may be transferred to the underlying conductive lines 72F-72A and the underlying dielectric layers 52F-52A. In the resulting structure, the conductive lines 72F are exposed in the region 67, the conductive lines 72E are exposed in the region 66, the conductive lines 72D are exposed in the region 65, the conductive lines 72C are exposed in the region 64, the conductive lines 72B are exposed in the region 63, the conductive lines 72A are exposed in the region 62, and the substrate 50 is exposed in the region 60.

In FIG. 28 the photoresist 56 may be removed, such as by an acceptable ashing or wet strip process. Thus, a memory array 200 including a staircase structure 68 is formed. The staircase structure 68 comprises a stack of alternating layers of the conductive lines 72 and the dielectric layers 52. As illustrated in FIG. 28, the lengths of the conductive lines 72 increase in a direction towards the substrate 50 such that lower conductive lines 72 are longer and extend laterally past upper conductive lines 72. As a result, conductive contacts can be made from above the staircase structure 68 to each of the conductive lines 72 in subsequent processing steps.

Figure 29:
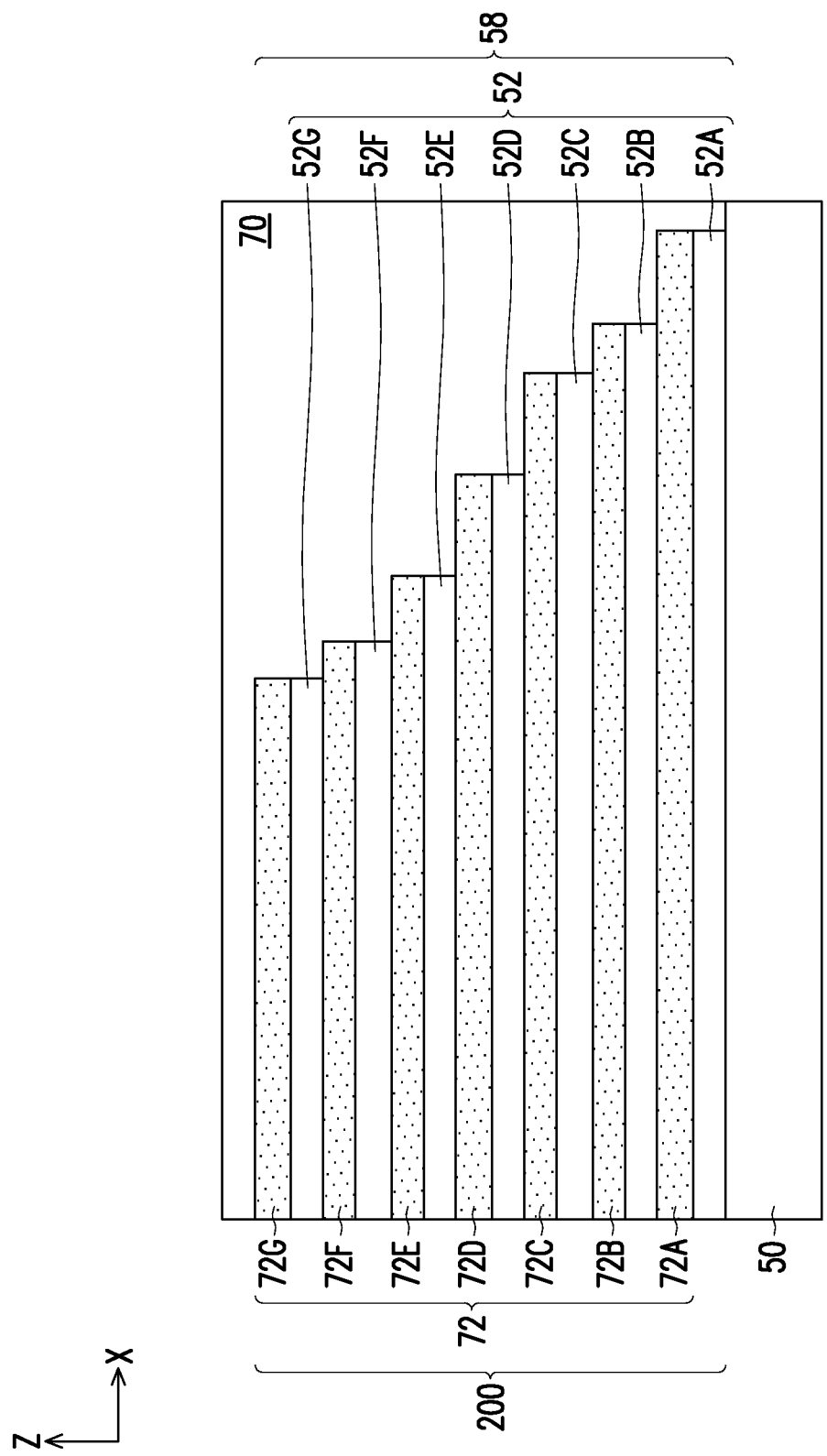
Figure 30A:
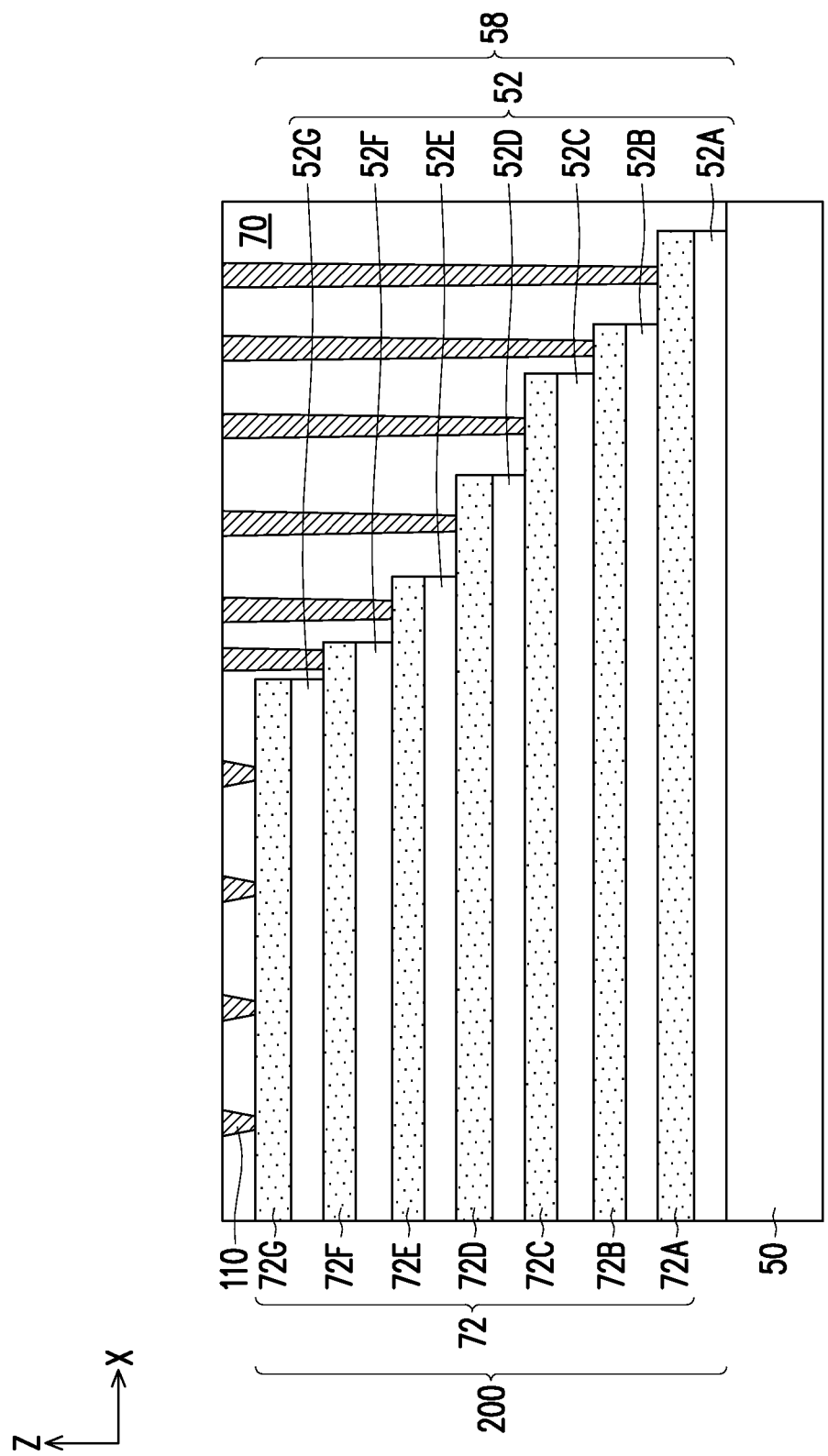
Figure 30B:
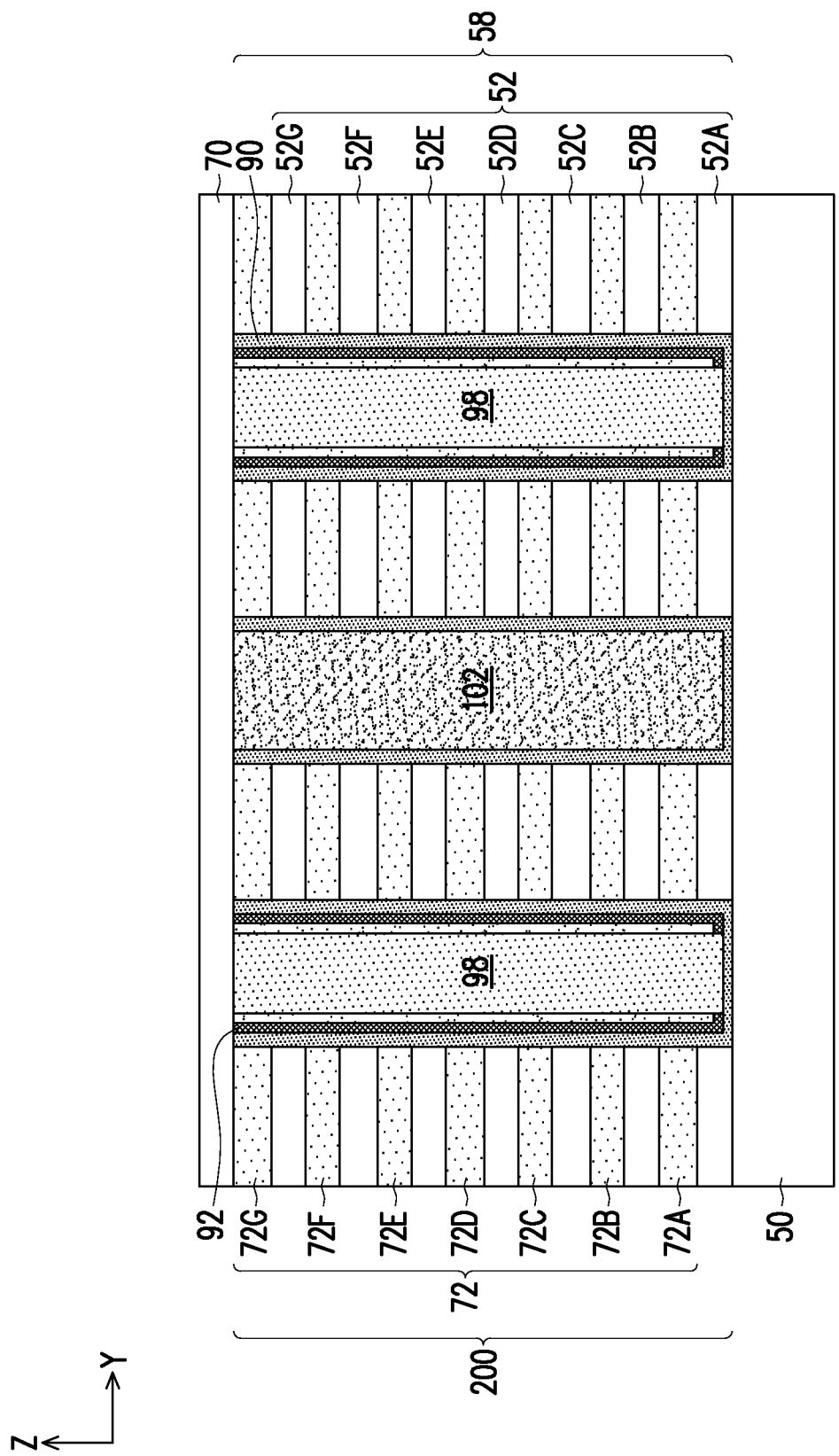
Figure 30C:
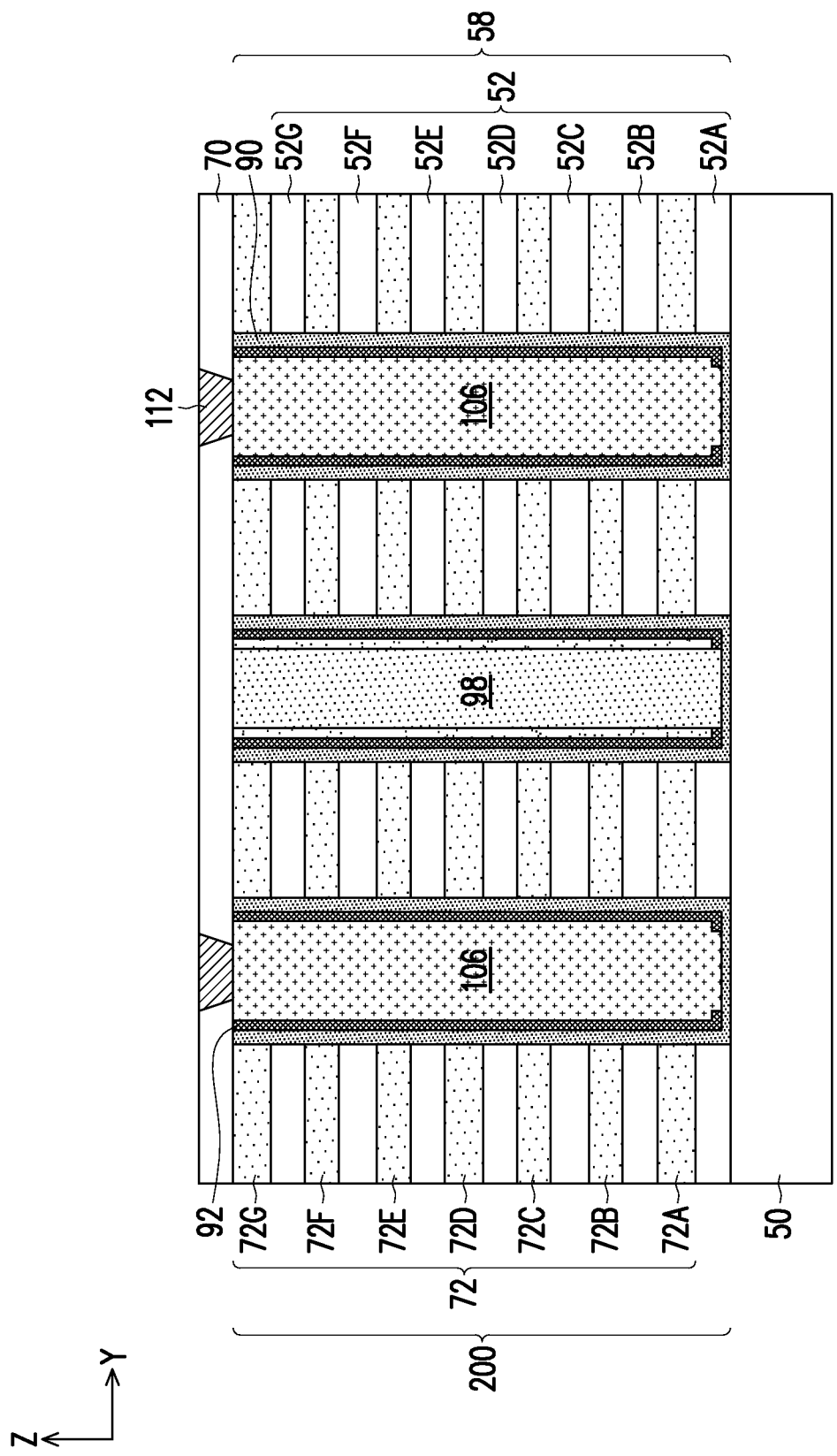
Figure 30D:
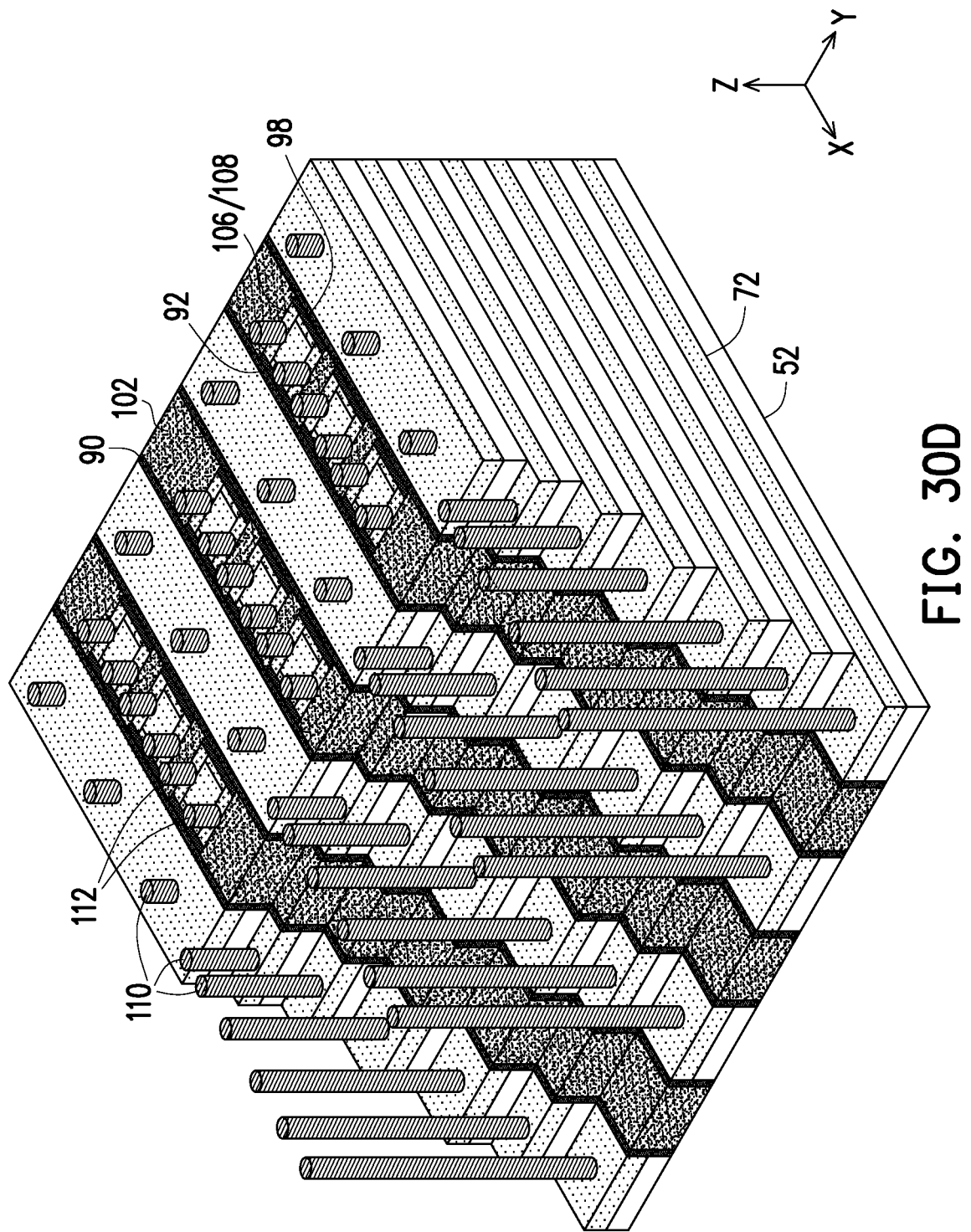

In FIG. 29, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may comprise an oxide (e.g., silicon oxide or the like), a nitride (e.g., silicon nitride or the like), a combination thereof or the like. Other dielectric materials formed by any acceptable process may be used. The IMD 70 extends along sidewalls of the conductive lines 72A-72G and sidewalls of the dielectric layers 52A-52G. Further, the IMD 70 may contact top surfaces of the conductive lines 72A-72G and the substrate 50.

In FIGS. 30A through 30D, contacts 110 are formed extending to and electrically coupled to the conductive lines 72. The staircase shape of the conductive lines 72 provides surfaces on each of the conductive lines 72 for the contacts 110 to land on. Forming the contacts 110 may include patterning openings in the IMD 70 to expose portions of the conductive lines 72 using a combination of photolithography and etching, for example. In some embodiments, the openings in the IMD 70 may be formed by a process having high etch selectivity to materials of the IMD 70. As such, the openings in the IMD 70 may be formed without significantly removing materials of the conductive lines 72. In some embodiments, openings exposing each of the conductive lines 72A-72G may be formed simultaneously. Because of variations in the thickness of the IMD 70 overlying each of the conductive lines 72A-72G, the conductive lines 72G may be exposed to the etching for a longer duration than the conductive lines 72F, which are exposed to the etching for a longer duration than the conductive lines 72E and so forth, with the conductive lines 72A being exposed to the etching for the shortest duration. Exposure to the etching may cause some material loss, pitting, or other damage in the conductive lines 72 such that the conductive lines 72G are damaged to a greatest extent, the conductive lines 72F-72B are damaged to decreasing extents, and the conductive lines 72A are damaged to a least extent. In some embodiments, the openings to the conductive lines 72A-72G may be formed in one or more etching processes. For example, a first etching process may be used to form openings exposing the conductive lines 72A-72D and a second etching process may be used to form openings to the conductive lines 72E-72G. In some embodiments, each of the etching processes performing on the conductive lines 72 may be performed on 4-5 layers of the conductive lines 72. Performing multiple etching processes to form the openings may reduce damage to the conductive lines 72 which are further from the substrate 50.

A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings. As illustrated in FIG. 30A through 30D, the contacts 110 may extend to each of the conductive lines 72A-72G.

Further in FIGS. 30A through 30D, contacts 112 are formed extending to and electrically coupled to the conductive lines 106 and the conductive lines 108. Forming the contacts 112 may include patterning openings in the IMD 70 to expose portions of the conductive lines 106 and the conductive lines 108 using a combination of photolithography and etching, for example. The contacts 112 may be formed using processes and materials the same as or similar to those used to form the contacts 110. The contacts 112 may be formed simultaneously with, or separately from the contacts 110.

Figure 31A:
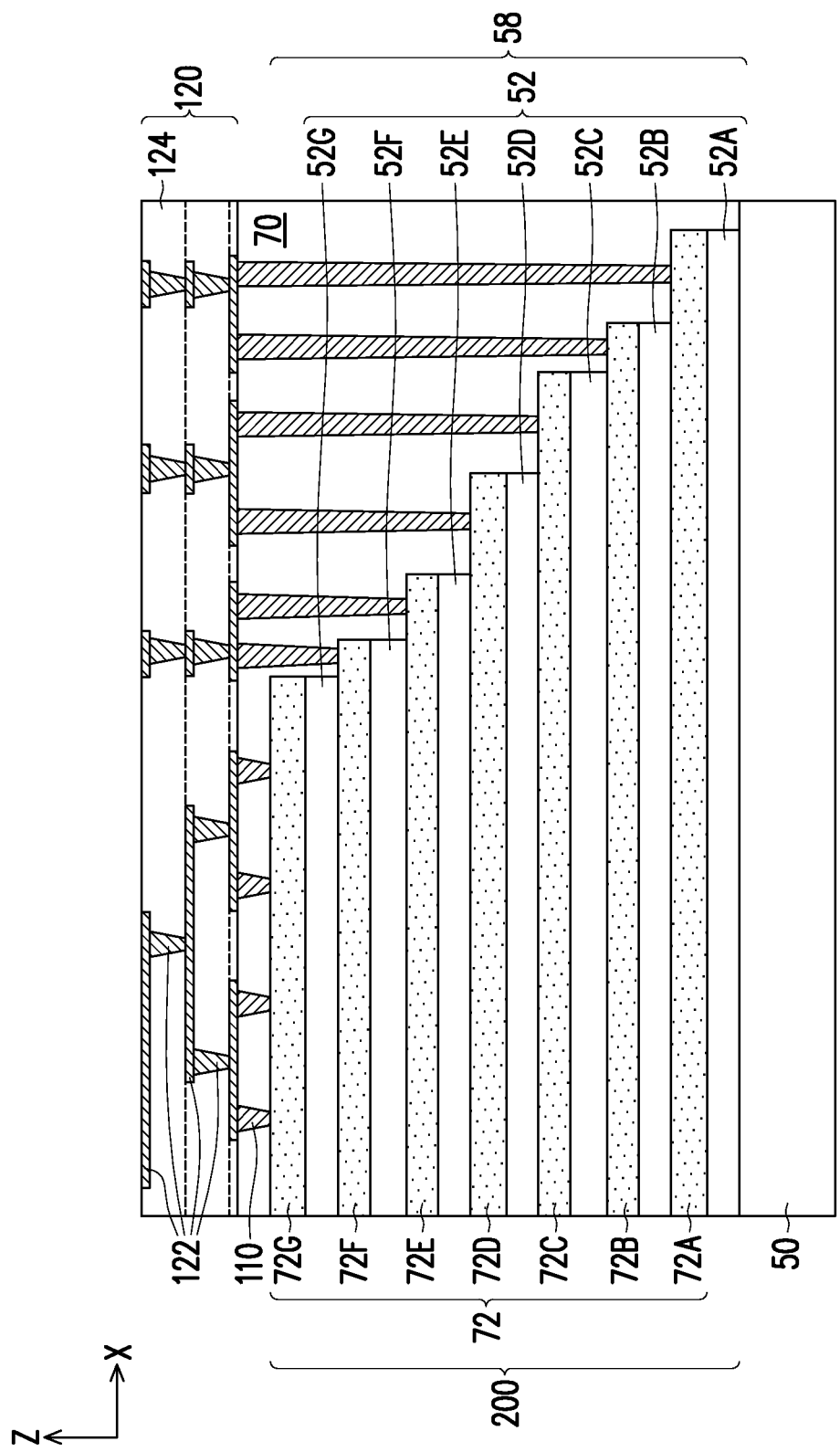
Figure 31B:
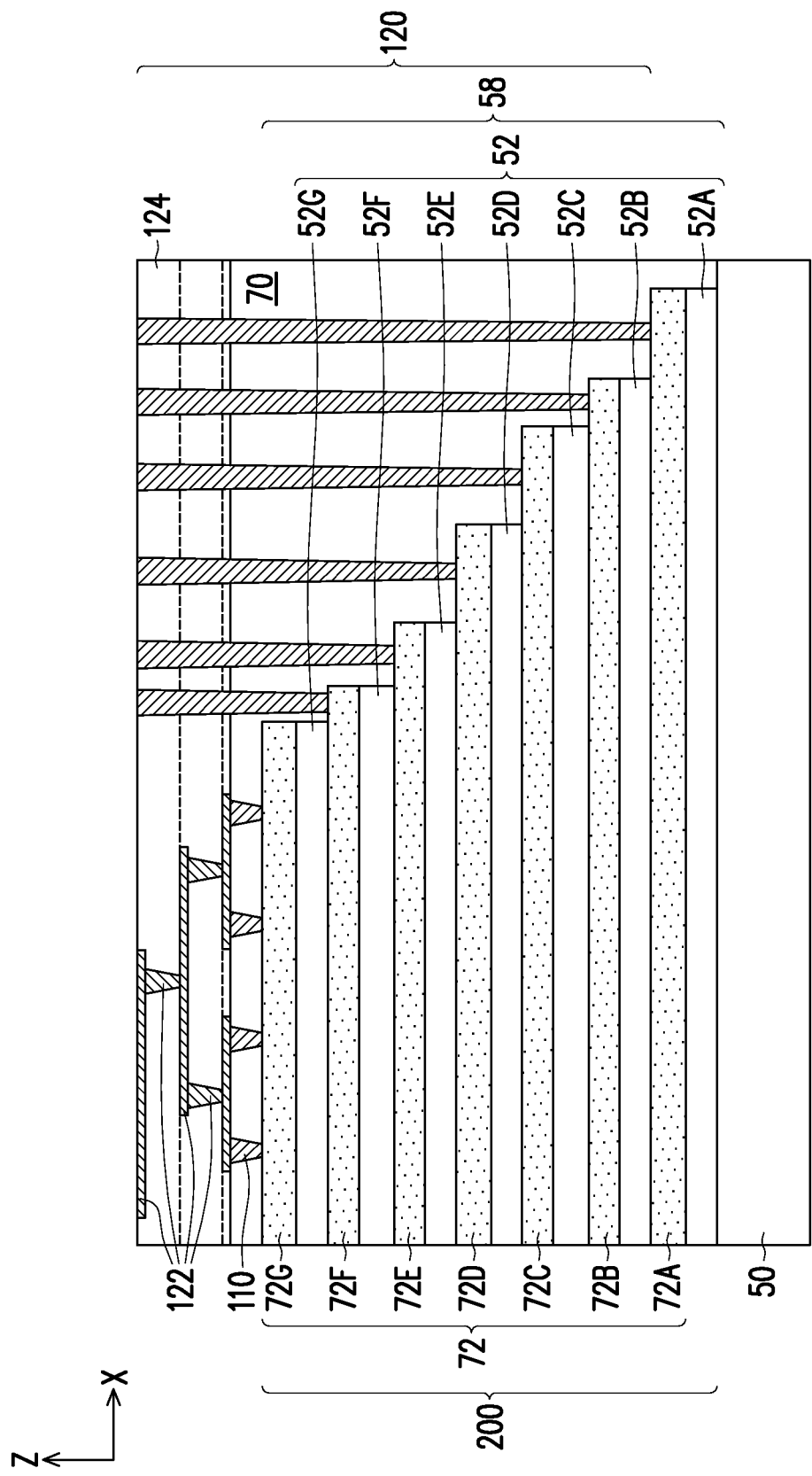
Figure 31C:
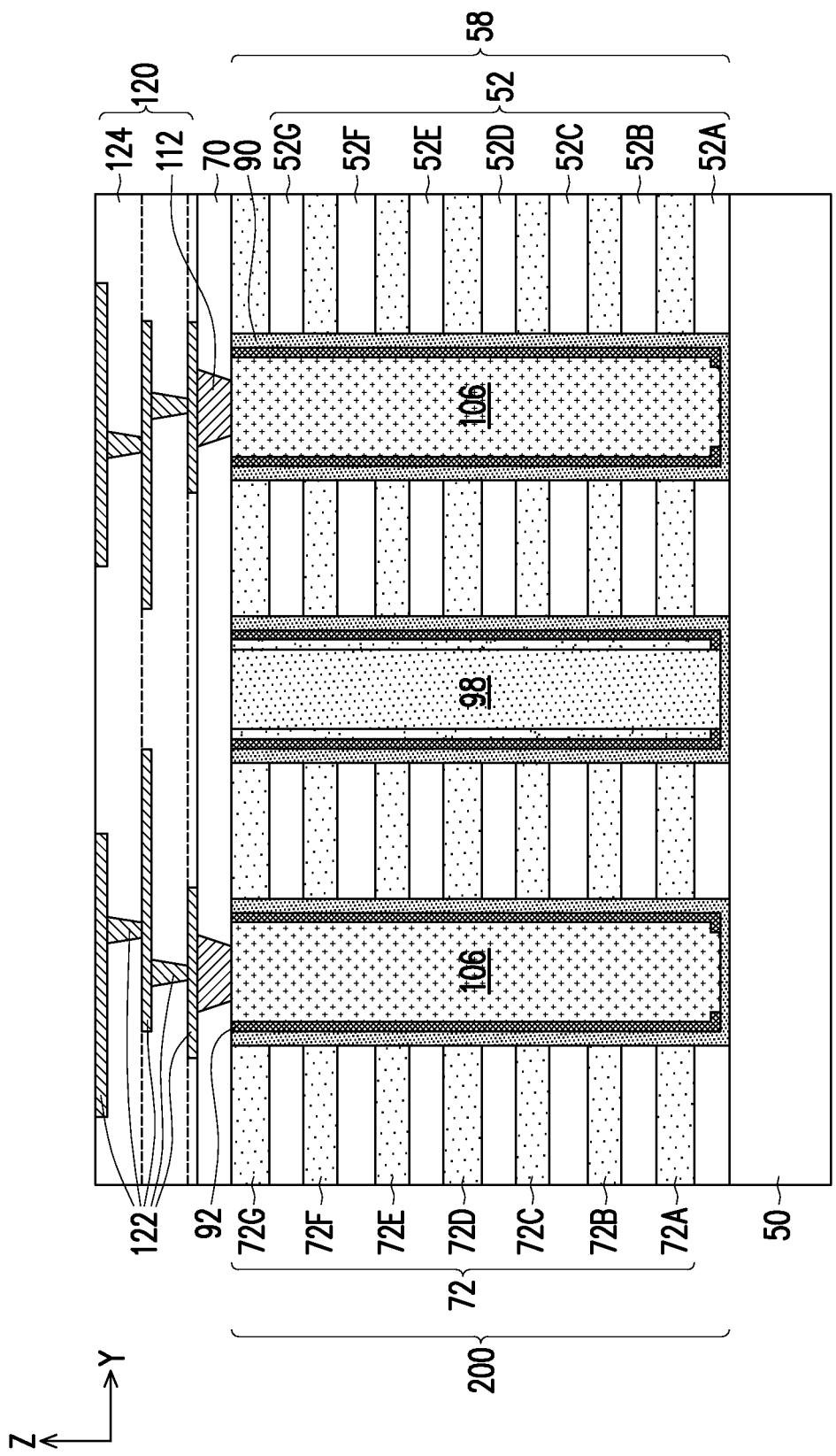

In FIGS. 31A through 31C, an interconnect structure 120 is formed over the IMD 70, the contacts 110, and the contacts 112. The interconnect structure 120 may include one or more layers of conductive features 122 formed in one or more stacked dielectric layers 124. Each of the stacked dielectric layers 124 may include a dielectric material, such as a low-k dielectric material, an extra low-k (ELK) dielectric material, or the like. The dielectric layers 124 may be deposited using appropriate processes, such as, CVD, ALD, PVD, PECVD, or the like.

The conductive features 122 may include conductive lines and conductive vias interconnecting layers of the conductive lines. The conductive vias may extend through respective ones of the dielectric layers 124 to provide vertical connections between layers of the conductive lines. The conductive features 122 may be formed through any acceptable process, such as a damascene process, a dual damascene process, or the like.

In some embodiments, the conductive features 122 may be formed using a damascene process in which a respective dielectric layer 124 is patterned utilizing a combination of photolithography and etching techniques to form trenches corresponding to the desired pattern of the conductive features 122. An optional diffusion barrier and/or optional adhesion layer may be deposited in the trenches and the trenches may then be filled with a conductive material. Suitable materials for the barrier layer include titanium, titanium nitride, titanium oxide, tantalum, tantalum nitride, titanium oxide, or other alternatives. Suitable materials for the conductive material include copper, silver, gold, tungsten, aluminum, combinations thereof, or the like. In an embodiment, the conductive features 122 may be formed by depositing a seed layer of copper or a copper alloy, and filling the trenches using electroplating. A chemical mechanical planarization (CMP) process or the like may be used to remove excess conductive material from surfaces of the respective dielectric layer 124 and to planarize surfaces of the conductive features 122 and the dielectric layer 124 for subsequent processing.

FIGS. 31A through 31C illustrate three layers of the conductive features 122 and the dielectric layers 124. However, it should be appreciated that the interconnect structure 120 may include any number of the conductive features 122 disposed in any number of the dielectric layers 124. The conductive features 122 of the interconnect structure 120 may be electrically coupled to the contacts 110 and the contacts 112.

In the embodiment illustrated in FIG. 31A, the contacts 110 electrically coupled to the conductive lines 72A-72F only extend through the IMD 70 such that top surfaces of the contacts 110 are level with a top surface of the IMD 70. However, in the embodiment illustrated in FIG. 31B, the contacts 110 electrically coupled to the conductive lines 72A-72F extend through the IMD 70 and the dielectric layers 124 such that top surfaces of the contacts 110 are level with a top surface of a topmost dielectric layer 124. The contacts 110 may be part of the interconnect structure 120. Forming the contacts 110 extending through the dielectric layers 124 and the IMD 70 reduces the patterning steps required to form the contacts 110 and the interconnect structure 120, but reduces the flexibility of connections. Either of the embodiments illustrated in FIGS. 31A and 31B may be used in subsequently formed devices.

Figure 32:
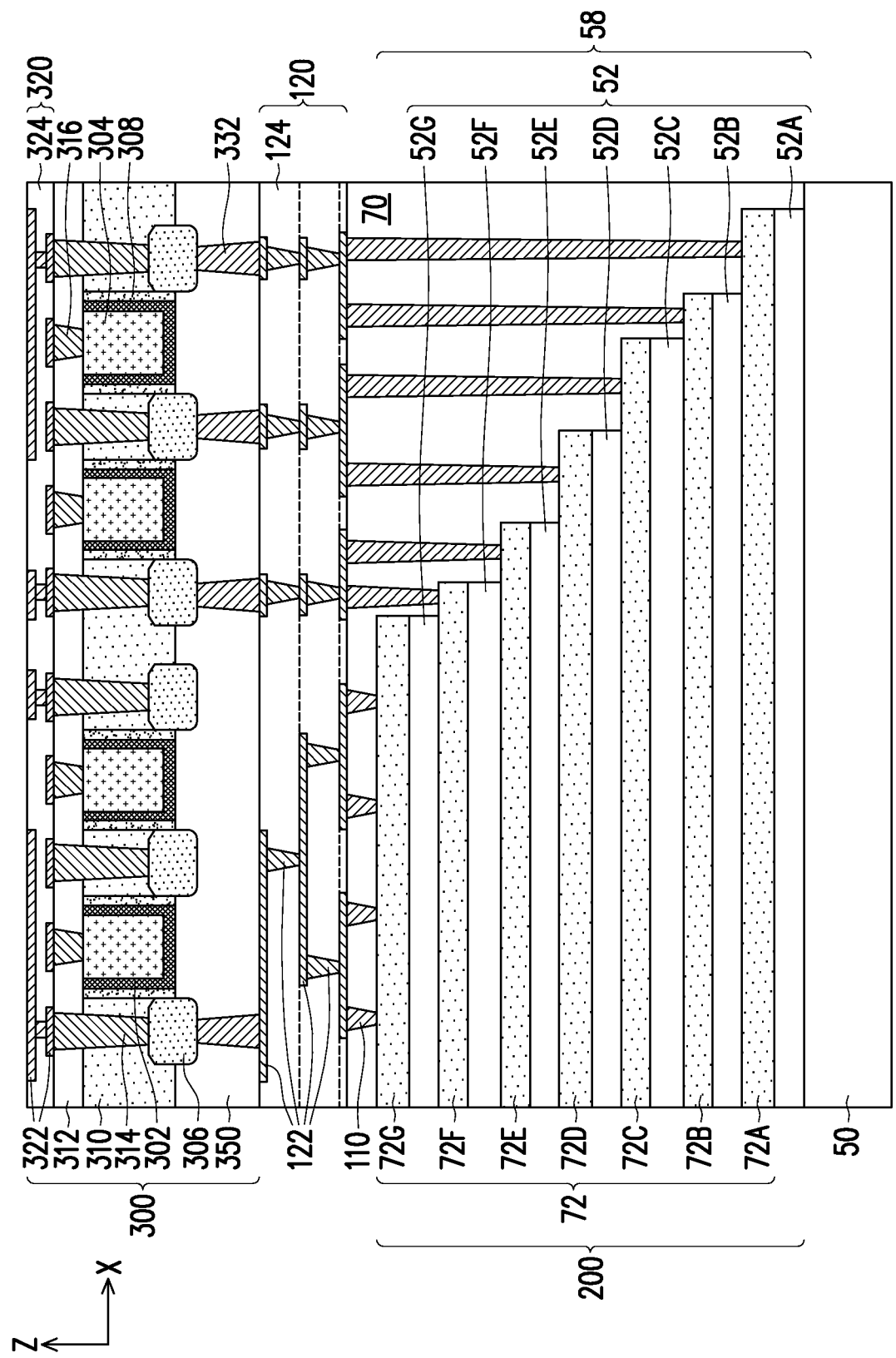
Figure 33:
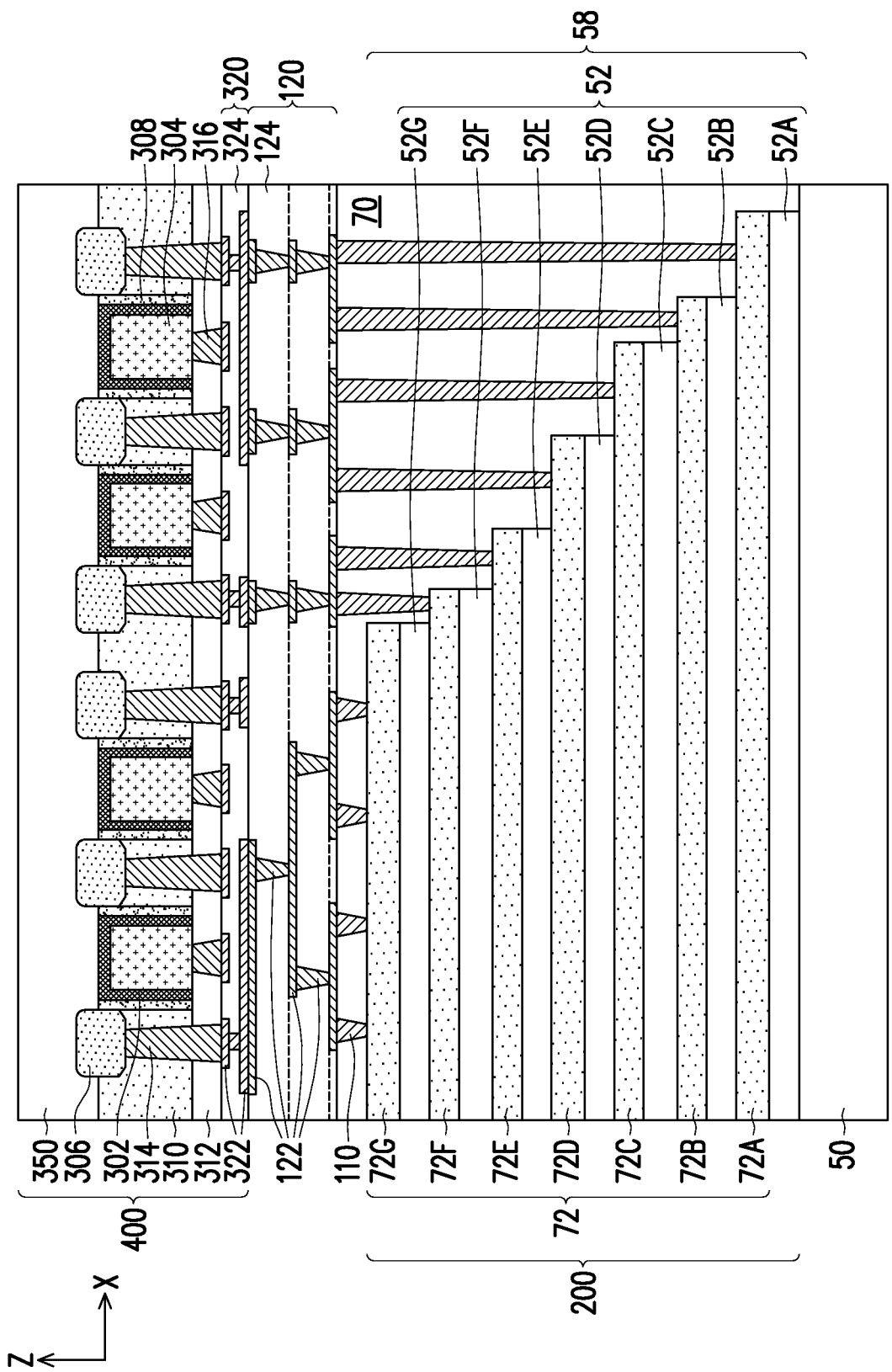
Figure 34:
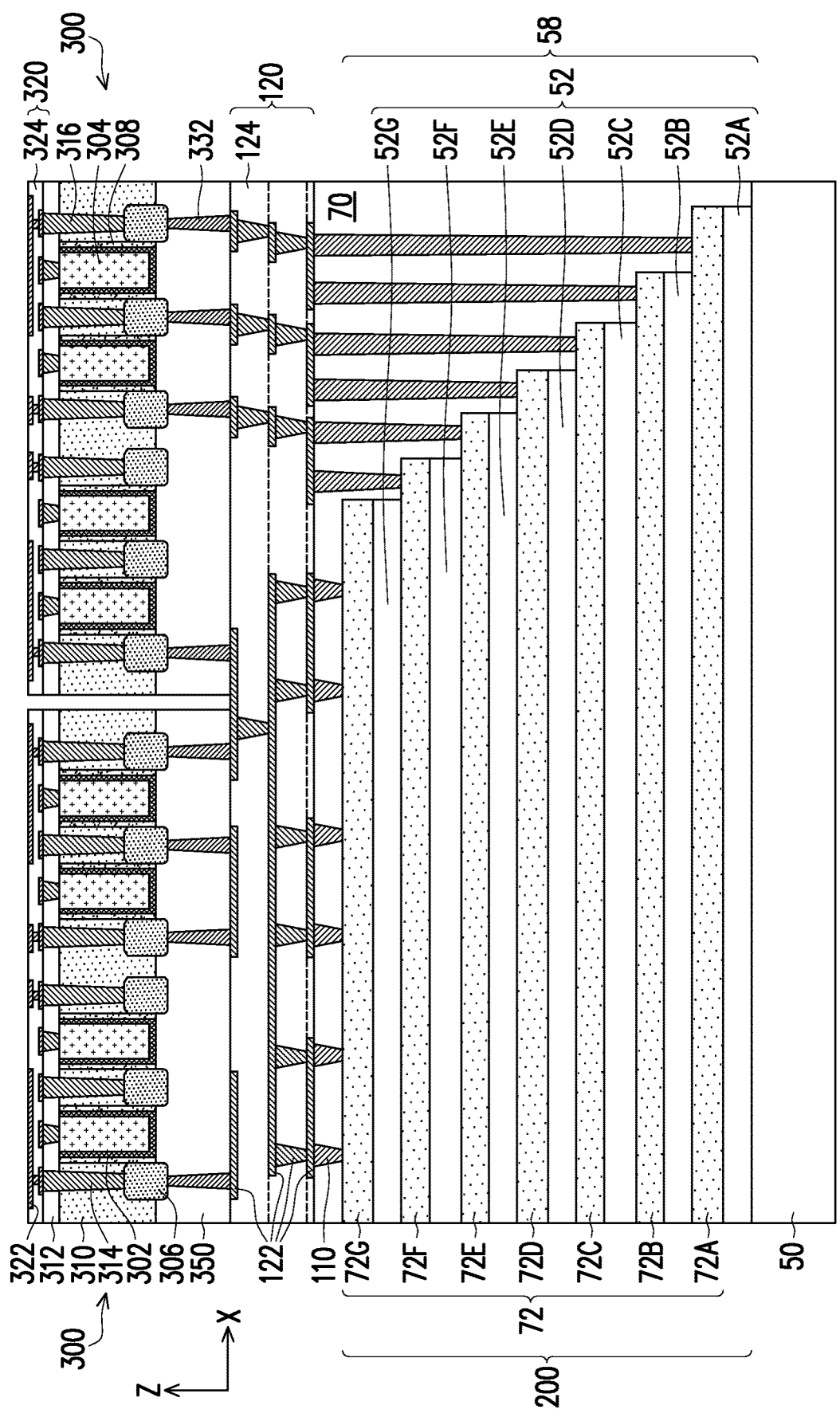

FIGS. 32 through 34 illustrate bonding semiconductor dies to the interconnect structure 120. In FIG. 32, a backside of a semiconductor device 300 is bonded to the interconnect structure 120. In the illustrated embodiment, the semiconductor device 300 is bonded to the interconnect structure 120 by hybrid bonding. A topmost dielectric layer 124 is bonded to the substrate 350 through dielectric-to-dielectric bonding, without using any adhesive material (e.g., die attach film), and the topmost conductive features 122 are bonded to the TSVs 332 through metal-to-metal bonding, without using any eutectic material (e.g., solder). The bonding may include a pre-bonding and an annealing. During the pre-bonding, a small pressing force is applied to press the semiconductor device 300 against the interconnect structure 120. The pre-bonding is performed at a low temperature, such as room temperature, such as a temperature in the range of about 15° C. to about 30° C. In some embodiments, an oxide, such as a native oxide, is formed at the back side of the substrate 350 and is used for the bonding. The bonding strength is then improved in a subsequent annealing step, in which the dielectric layer 124 and the substrate 350 are annealed at a high temperature, such as a temperature in the range of about 100° C. to about 400° C. After the annealing, bonds, such as fusions bonds, are formed bonding the dielectric layer 124 and the substrate 350. For example, the bonds can be covalent bonds between the dielectric layer 124 and the substrate 350. The conductive features 122 and the TSVs 332 may be in physical contact after the pre-bonding, or may expand to be brought into physical contact during the annealing. Further, during the annealing, the material of the conductive features 122 and the TSVs 332 (e.g., copper) intermingles, so that metal-to-metal bonds are formed. Hence, the resulting bonds between the semiconductor device 300 and the interconnect structure 120 are hybrid bonds that include both dielectric-to-dielectric bonds and metal-to-metal bonds.

In some embodiments, the semiconductor device 300 may be a wafer which includes multiple integrated circuits, which will subsequently be diced. In other embodiments, the semiconductor device 300 is diced before bonding and one or more semiconductor dies may be bonded to the memory array 200. The memory array 200 may be diced before or after being bonded to the semiconductor device 300. In embodiments in which the memory array 200 and the semiconductor device 300 are diced after bonding, the memory array 200 and the semiconductor device 300 may be diced simultaneously. As such, the semiconductor device 300 may be bonded to the memory array 200 through wafer-to-wafer bonding (e.g., both the semiconductor device 300 and the memory array 200 are diced after bonding), die-to-die bonding (e.g., both the semiconductor device 300 and the memory array 200 are diced before bonding), or die-to-wafer bonding (e.g., the semiconductor device 300 or the memory array 200 are diced before bonding).

In some embodiments, the semiconductor device 300 may be a logic device, which includes circuits such as decoders, processors, multiplexors, controllers, sense amplifiers, and the like. The semiconductor device 300 may provide control for reading and writing operations and the like to the memory array 200. In contrast, the memory array 200 may be free of logic circuits and all of the transistors 204 in the memory array 200 may serve as memory cells 202.

As discussed with respect to FIGS. 31A through 31C, the interconnect structure 120 may provide connections to both the contacts 110 and the contacts 112. Bonding the semiconductor device 300 to the interconnect structure 120 provides routing and interconnections between the circuits of the semiconductor device 300 and both the contacts 110 and the contacts 112 of the memory array 200.

As compared with conventional memory arrays which are formed over semiconductor dies and routed to the semiconductor dies through interconnect structures formed over and adjacent the memory arrays, bonding the semiconductor device 300 to the interconnect structure 120 formed over the memory array 200 simplifies the routing between the memory array 200 and the semiconductor device 300, reduces the number of process steps required to form the routing, and shortens the length of connections between the memory array 200 and the semiconductor device 300. This reduces costs, reduces device defects, and improves device performance.

In FIG. 33, a front-side of a semiconductor device 400 is bonded to the interconnect structure 120. In the illustrated embodiment, the semiconductor device 400 is bonded to the interconnect structure 120 by hybrid bonding. A topmost dielectric layer 124 is bonded to a topmost dielectric layer 324 through dielectric-to-dielectric bonding, without using any adhesive material (e.g., die attach film), and the topmost conductive features 122 are bonded to topmost conductive features 322 through metal-to-metal bonding, without using any eutectic material (e.g., solder). The bonding may include a pre-bonding and an annealing. During the pre-bonding, a small pressing force is applied to press the semiconductor device 400 against the interconnect structure 120. The pre-bonding is performed at a low temperature, such as room temperature, such as a temperature in the range of about 15° C. to about 30° C. The bonding strength is then improved in a subsequent annealing step, in which the dielectric layer 124 and the dielectric layer 324 are annealed at a high temperature, such as a temperature in the range of about 100° C. to about 400° C. After the annealing, bonds, such as fusions bonds, are formed bonding the dielectric layer 124 and the dielectric layer 324. For example, the bonds can be covalent bonds between the dielectric layer 124 and the dielectric layer 324. The conductive features 122 and the conductive features 322 may be in physical contact after the pre-bonding, or may expand to be brought into physical contact during the annealing. Further, during the annealing, the material of the conductive features 122 and the conductive features 322 (e.g., copper) intermingles, so that metal-to-metal bonds are formed. Hence, the resulting bonds between the semiconductor device 400 and the interconnect structure 120 are hybrid bonds that include both dielectric-to-dielectric bonds and metal-to-metal bonds.

In some embodiments, the semiconductor device 400 may be a wafer which includes multiple integrated circuits, which will subsequently be diced. In other embodiments, the semiconductor device 400 is diced before bonding and one or more semiconductor dies may be bonded to the memory array 200. The memory array 200 may be diced before or after being bonded to the semiconductor device 400. In embodiments in which the memory array 200 and the semiconductor device 400 are diced after bonding, the memory array 200 and the semiconductor device 400 may be diced simultaneously. As such, the semiconductor device 400 may be bonded to the memory array 200 through wafer-to-wafer bonding (e.g., both the semiconductor device 400 and the memory array 200 are diced after bonding), die-to-die bonding (e.g., both the semiconductor device 400 and the memory array 200 are diced before bonding), or die-to-wafer bonding (e.g., the semiconductor device 400 or the memory array 200 are diced before bonding).

In some embodiments, the semiconductor device 400 may be a logic device, which includes circuits such as decoders, processors, multiplexors, controllers, sense amplifiers, and the like. The semiconductor device 400 may provide control for reading and writing operations and the like to the memory array 200. In contrast, the memory array 200 may be free of logic circuits and all of the transistors 204 in the memory array 200 may serve as memory cells 202.

As discussed with respect to FIGS. 31A through 31C, the interconnect structure 120 may provide connections to both the contacts 110 and the contacts 112. Bonding the semiconductor device 400 to the interconnect structure 120 provides routing and interconnections between the circuits of the semiconductor device 400 and both the contacts 110 and the contacts 112 of the memory array 200.

As compared with conventional memory arrays which are formed over semiconductor dies and routed to the semiconductor dies through interconnect structures formed over and adjacent the memory arrays, bonding the semiconductor device 400 to the interconnect structure 120 formed over the memory array 200 simplifies the routing between the memory array 200 and the semiconductor device 400, reduces the number of process steps required to form the routing, and shortens the length of connections between the memory array 200 and the semiconductor device 400. This reduces costs, reduces device defects, and improves device performance.

In FIG. 34, multiple semiconductor devices 300 are bonded to the interconnect structure 120. As discussed previously, each of the semiconductor devices 300 may be logic dies, peripheral dies, memory dies, power management dies, RF dies, sensor dies, MEMS dies, signal processing dies, front-end dies, the like, or combinations thereof. In some embodiments, the multiple semiconductor devices 300 may include a logic die and a peripheral die, such as an input/output die. The logic die may include circuits such as decoders, processors, multiplexors, controllers, sense amplifiers, and the like. The logic die may provide control for reading and writing operations and the like to the memory array 200. In contrast, the memory array 200 may be free of logic circuits and all of the transistors 204 in the memory array 200 may serve as memory cells 202. The input/output die may be used to interface with external semiconductor devices or the like. The semiconductor devices 300 may be bonded to the interconnect structure 120 using processes the same as or similar to those discussed above with respect to the embodiment illustrated in FIG. 32.

As discussed with respect to FIGS. 31A through 31C, the interconnect structure 120 may provide connections to both the contacts 110 and the contacts 112. Bonding the semiconductor devices 300 to the interconnect structure 120 provides routing and interconnections between the circuits of the semiconductor devices 300 and both the contacts 110 and the contacts 112 of the memory array 200.

As compared with conventional memory arrays which are formed over semiconductor dies and routed to the semiconductor dies through interconnect structures formed over and adjacent the memory arrays, bonding the semiconductor devices 300 to the interconnect structure 120 formed over the memory array 200 simplifies the routing between the memory array 200 and the semiconductor devices 300, reduces the number of process steps required to form the routing, and shortens the length of connections between the memory array 200 and the semiconductor devices 300. This reduces costs, reduces device defects, and improves device performance. Moreover, any number of semiconductor devices 300 or semiconductor devices 400 may be bonded to a memory array 200.

Figure 35:
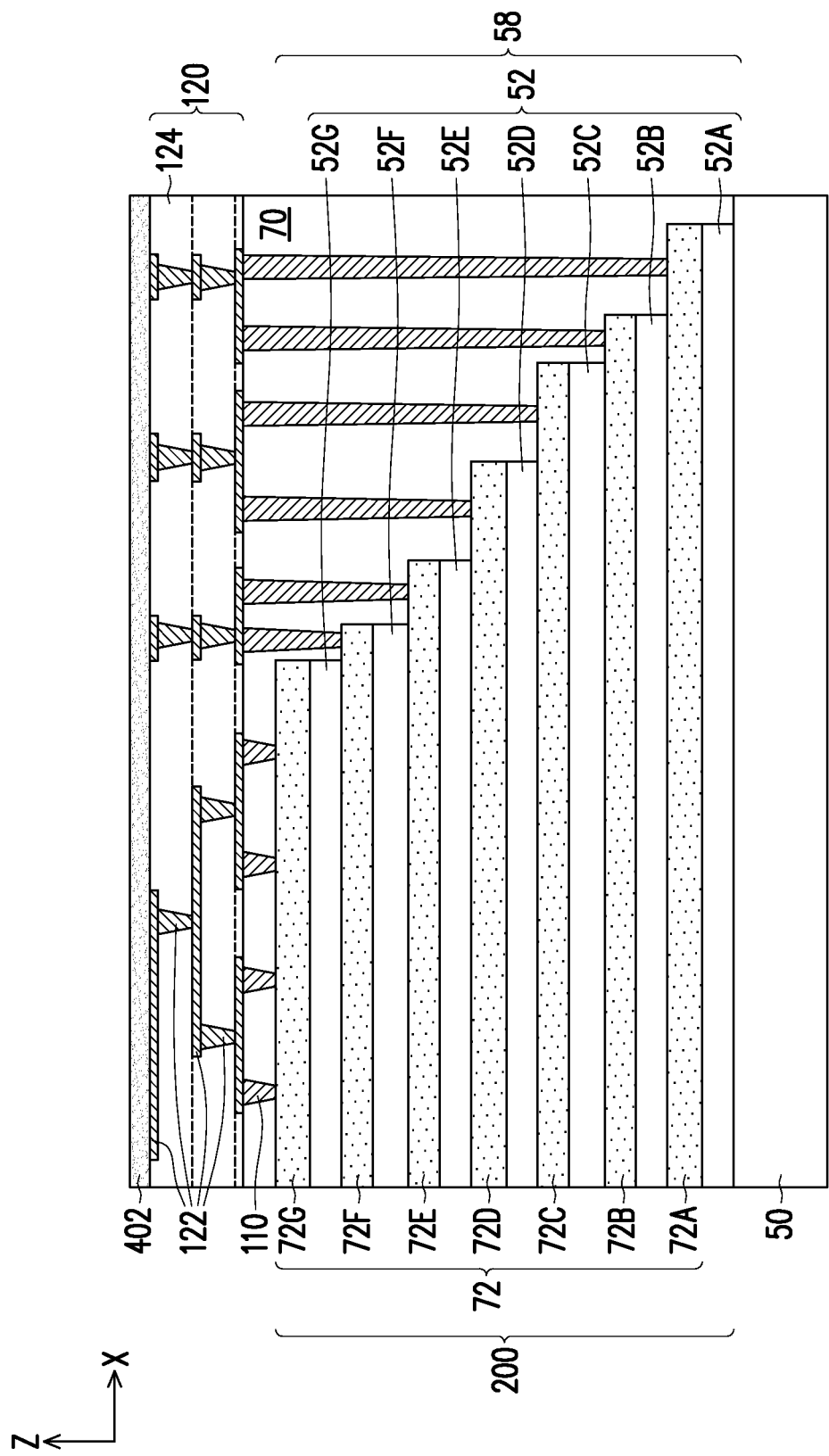
Figure 36:
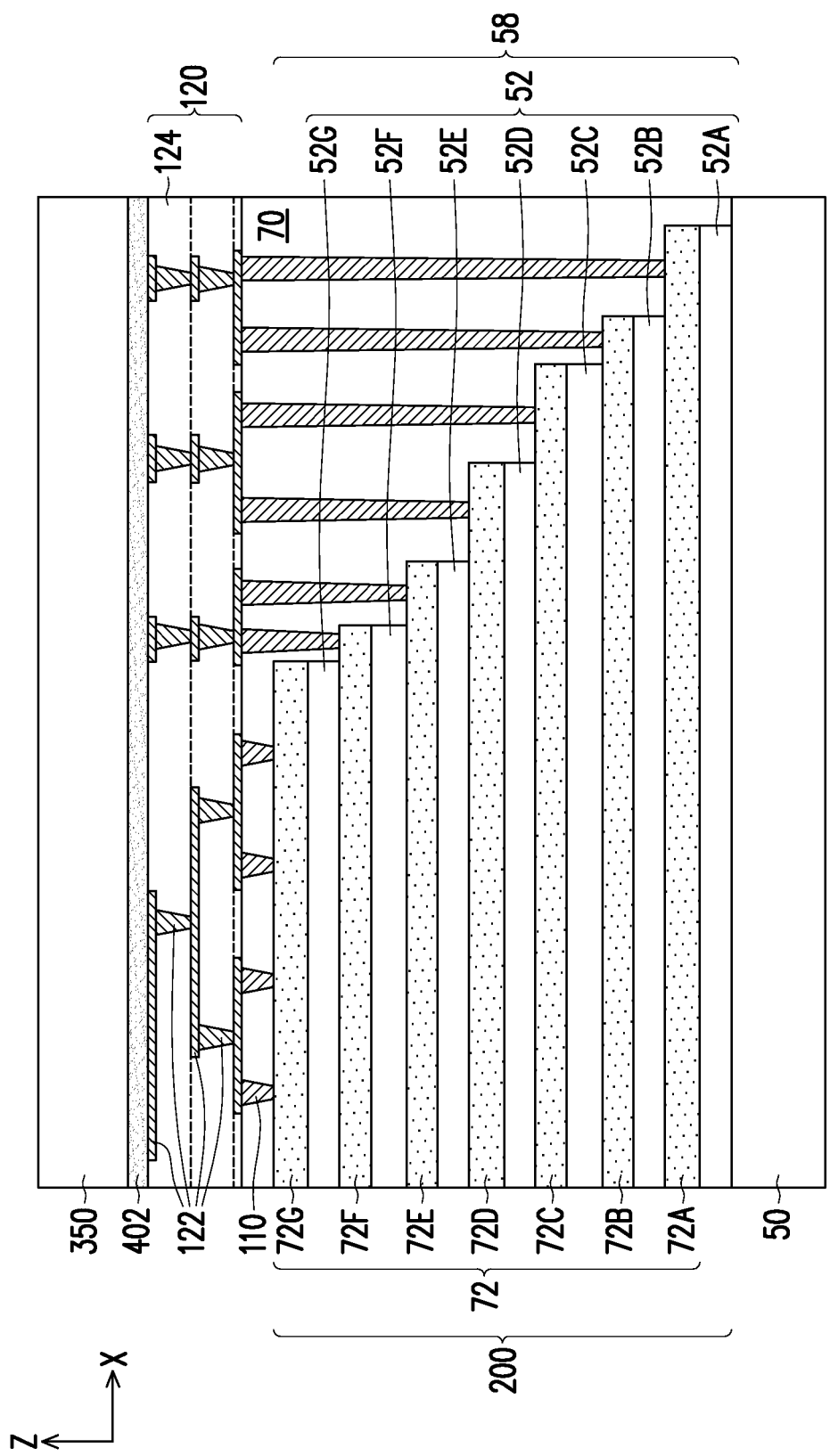
Figure 37:
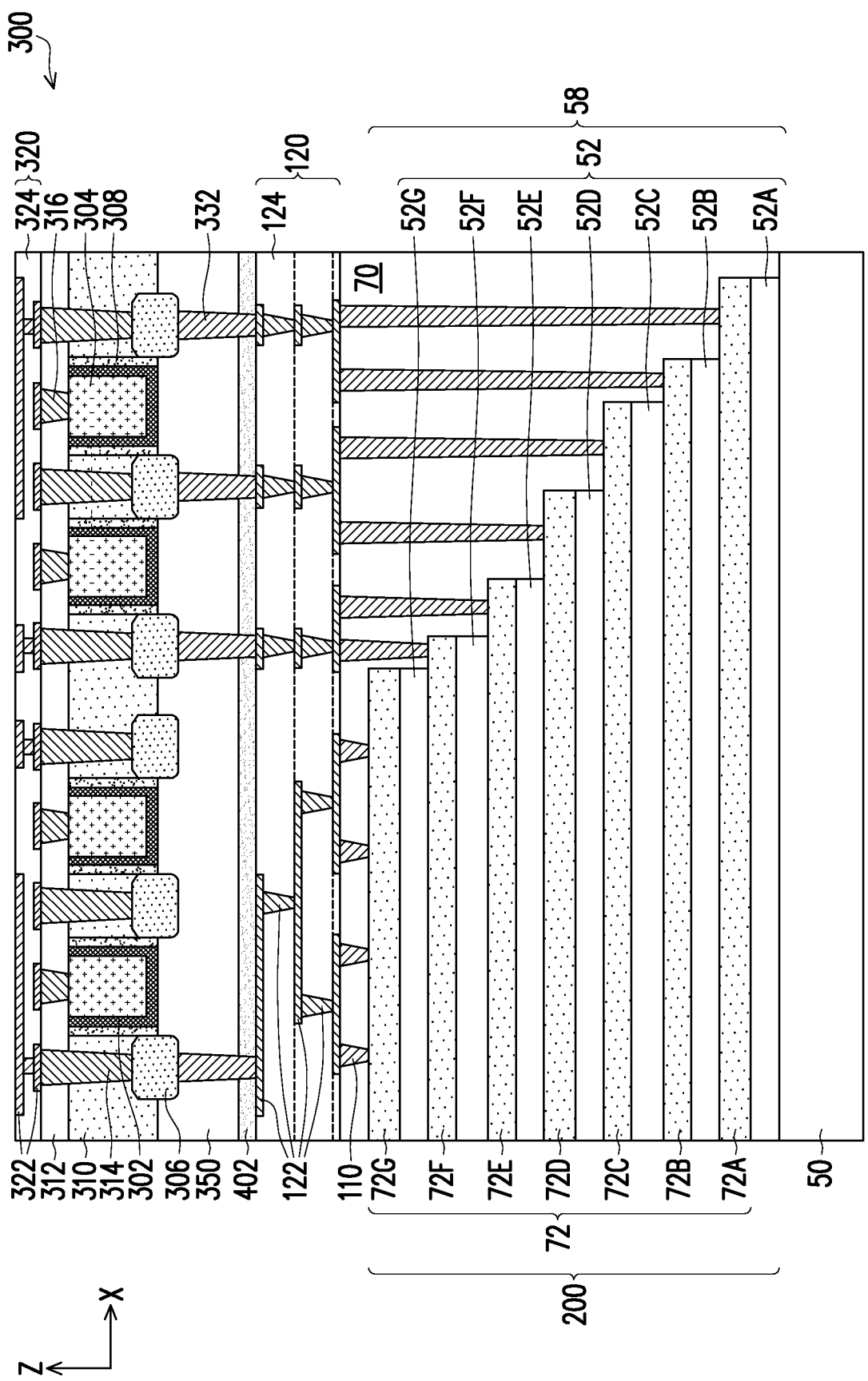

FIGS. 35 through 37 illustrate an embodiment in which a bonding layer 402 is formed over the interconnect structure 120 of the memory array 200, the substrate 350 is bonded to the bonding layer 402, and the circuits of the semiconductor device 300 are formed in and on the substrate 350. In FIG. 35, a bonding layer 402 is formed over the interconnect structure 120 of the memory array 200. In some embodiments, the bonding layer 402 comprises silicon oxide (e.g., a high density plasma (HDP) oxide, or the like) that is deposited by CVD, ALD, PVD, or the like. Other suitable materials may be used for the bonding layer 402.

In FIG. 36, a substrate 350 is bonded to the bonding layer 402. The substrate 350 may be the same as described above with respect to FIG. 2. The substrate 350 may be bonded to the bonding layer 402 by fusion bonding or the like. In some embodiments, the substrate 350 may be bonded to the bonding layer 402 through dielectric-to-dielectric bonding, without using any adhesive material (e.g., die attach film). The bonding may include a pre-bonding and an annealing. During the pre-bonding, a small pressing force is applied to press the substrate 350 against the bonding layer 402. The pre-bonding is performed at a low temperature, such as room temperature (e.g., a temperature in the range of about 15° C. to about 30° C.). In some embodiments, an oxide, such as a native oxide, is formed at the back side of the substrate 350 and is used for the bonding. The bonding strength is then improved in a subsequent annealing step, in which the substrate 350 and the bonding layer 402 are annealed at a high temperature, such as a temperature in the range of about 100° C. to about 400° C. After the annealing, bonds, such as fusion bonds, are formed bonding the substrate 350 to the bonding layer 402. For example, the bonds can be covalent bonds between the substrate 350 and the bonding layer 402.

The substrate 350 may be singulated before or after bonding the substrate 350 to the memory array 200. For example, in some embodiments, the substrate 350 may be a wafer, which is bonded to the memory array 200 and subsequently singulated. The wafer may be singulated by sawing along scribe line regions and may separate individual substrates 350 from one another. In some embodiments, the substrate 350 may be a die which is singulated before being bonded to the memory array 200.

In FIG. 37, circuits are formed in and over the substrate 350 to form a semiconductor device 300. Processes the same as or similar to those described in FIGS. 3 through 8A may be performed in order to form the semiconductor device 300. As illustrated in FIG. 37, TSVs 332 may be formed extending through the substrate 350 and the bonding layer 402. The TSVs 332 may be electrically coupled with and in physical contact with the conductive features 122 of the interconnect structure 120. The TSVs 332 may taper and narrow in a direction towards the memory array 200.

As compared with conventional memory arrays which are formed over semiconductor dies and routed to the semiconductor dies through interconnect structures formed over and adjacent the memory arrays, bonding the substrate 350 to the interconnect structure 120 formed over the memory array 200 simplifies the routing between the memory array 200 and the semiconductor device 300, reduces the number of process steps required to form the routing, and shortens the length of connections between the memory array 200 and the semiconductor device 300. This reduces costs, reduces device defects, and improves device performance.

Embodiments may achieve various advantages. For example, forming an interconnect structure over a memory array and bonding semiconductor dies directly to the interconnect structure simplifies interconnections between the semiconductor dies and the memory array, reduces interconnect lengths, and reduces the steps required to form the interconnections. This reduces costs, reduces device defects, and improves device performance.

In accordance with an embodiment, a semiconductor device includes a memory array including a gate dielectric layer contacting a first word line and a second word line; and an oxide semiconductor (OS) layer contacting a source line and a bit line, the gate dielectric layer being disposed between the OS layer and each of the first word line and the second word line; an interconnect structure over the memory array, a distance between the second word line and the interconnect structure being less than a distance between the first word line and the interconnect structure; and an integrated circuit die bonded to the interconnect structure opposite the memory array, the integrated circuit die being bonded to the interconnect structure by dielectric-to-dielectric bonds and metal-to-metal bonds. In an embodiment, a length of the first word line is greater than a length of the second word line. In an embodiment, a front-side interconnect structure of the integrated circuit die is bonded to the interconnect structure. In an embodiment, a backside of the integrated circuit die is bonded to the interconnect structure. In an embodiment, the integrated circuit die includes a through substrate via extending through a semiconductor substrate, the through substrate via electrically coupling a source/drain region of the integrated circuit die to the interconnect structure. In an embodiment, the interconnect structure includes a first contact electrically coupling the first word line to the integrated circuit die, the first contact extending from the first word line to the integrated circuit die. In an embodiment, the semiconductor device further includes a second integrated circuit die hybrid bonded to the interconnect structure adjacent the integrated circuit die.

In accordance with another embodiment, a device includes a logic die including a semiconductor substrate; an interconnect structure over the logic die; and a memory array over the interconnect structure, the memory array including a first memory cell including a first portion of a gate dielectric layer contacting a first word line; and a second memory cell including a second portion of the gate dielectric layer contacting a second word line, the second memory cell being disposed further from the interconnect structure than the first memory cell in a first direction perpendicular to a major surface of the semiconductor substrate, the second word line having a length in a second direction perpendicular to the first direction greater than a length of the first word line in the second direction, and the logic die including circuits configured to perform read and write operations in the memory array. In an embodiment, the logic die is bonded to the interconnect structure by dielectric-to-dielectric and metal-to-metal bonds. In an embodiment, the logic die includes a front-side interconnect structure, and the front-side interconnect structure is bonded to the interconnect structure. In an embodiment, a backside of the logic die is bonded to the interconnect structure. In an embodiment, the logic die includes a through substrate via electrically coupled to a source/drain region, the through substrate via extends through a semiconductor substrate of the logic die, and the semiconductor substrate and the through substrate via are bonded to the interconnect structure. In an embodiment, the interconnect structure includes a contact extending from the through substrate via to the first word line.

In accordance with yet another embodiment, a method includes forming a memory array, forming the memory array including forming a multi-layer stack over a substrate, the multi-layer stack including alternating conductive layers and dielectric layers; patterning a first trench extending through the multi-layer stack; depositing a gate dielectric layer along sidewalls and a bottom surface of the first trench; and depositing an oxide semiconductor (OS) layer over the gate dielectric layer; forming a first interconnect structure over the memory array; and bonding an integrated circuit device to the first interconnect structure using dielectric-to-dielectric bonding and metal-to-metal bonding. In an embodiment, the method further includes performing a read/write operation in the memory array, and the integrated circuit device controls the read/write operation. In an embodiment, a backside of the integrated circuit device is bonded to the first interconnect structure. In an embodiment, a plurality of integrated circuit devices on a wafer are bonded to the first interconnect structure, the plurality of integrated circuit devices including the integrated circuit device, the method further including dicing the memory array and the wafer. In an embodiment, forming the memory array further includes etching the conductive layers and the dielectric layers to form a staircase structure, the conductive layers and the dielectric layers having decreasing lengths in a direction away from the substrate. In an embodiment, the first interconnect structure is formed over the memory array opposite the substrate. In an embodiment, bonding the integrated circuit device to the first interconnect structure includes bonding a front-side interconnect structure of the integrated circuit device to the first interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
  a memory array comprising:
    a gate dielectric layer contacting a first word line; and
    an oxide semiconductor (OS) layer contacting a source line and a bit line, wherein the gate dielectric layer is between the OS layer and the first word line, wherein a horizontal line intersects the first word line, the source line, and the bit line;
an interconnect structure on the memory array; and
an integrated circuit die bonded to the interconnect structure opposite the memory array, wherein the integrated circuit die is bonded to the interconnect structure by dielectric-to-dielectric bonds and metal-to-metal bonds.

2. The semiconductor device of claim 1, wherein the integrated circuit die comprises:
a first source/drain region on a semiconductor substrate; and
a backside via extending through the semiconductor substrate, wherein the interconnect structure is bonded to the backside via.

3. The semiconductor device of claim 1, wherein the integrated circuit die comprises:
a gate structure and a first source/drain region on a semiconductor substrate; and
a front-side interconnect structure on the gate structure and the first source/drain region opposite the semiconductor substrate, wherein the interconnect structure is bonded to the front-side interconnect structure.

4. The semiconductor device of claim 1, further comprising an inter-metal dielectric (IMD) on and in contact with the first word line.

5. The semiconductor device of claim 4, further comprising a first conductive feature and a second conductive feature extending through the IMD, wherein the first conductive feature is electrically coupled to and in physical contact with the first word line, wherein the second conductive feature is electrically coupled to and in physical contact with a second word line, and wherein the first conductive feature has a first height less than a second height of the second conductive feature.

6. The semiconductor device of claim 4, further comprising a first conductive feature and a second conductive feature extending through the IMD, wherein the first conductive feature is electrically coupled to and in physical contact with the first word line, wherein the second conductive feature is electrically coupled to and in physical contact with the source line, and wherein the first conductive feature has a first height equal to a second height of the second conductive feature.

7. The semiconductor device of claim 4, further comprising a first conductive feature and a second conductive feature extending through the IMD, wherein the first conductive feature is electrically coupled to and in physical contact with the first word line, wherein the second conductive feature is electrically coupled to and in physical contact with the source line, and wherein the first conductive feature has a first height greater than a second height of the second conductive feature.

8. A device comprising:
a logic die comprising a semiconductor substrate;
an interconnect structure on the logic die; and
a memory array on the interconnect structure, the memory array comprising:
a first word line contacting a gate dielectric layer, wherein the first word line is conductive; and
a second word line over the first word line and contacting the gate dielectric layer, wherein the second word line is conductive, wherein the gate dielectric layer extends continuously from the first word line to the second word line, wherein the second word line is disposed further from the interconnect structure than the first word line in a first direction perpendicular to a major surface of the semiconductor substrate, wherein the second word line has a length in a second direction perpendicular to the first direction greater than a length of the first word line in the second direction.

9. The device of claim 8, wherein the interconnect structure is bonded to the logic die by dielectric-to-dielectric bonds and metal-to-metal bonds.

10. The device of claim 8, wherein the memory array further comprises:
an inter-metal dielectric between the interconnect structure and each of the first word line and the second word line;
a first conductive feature electrically coupling the first word line to the interconnect structure, the first conductive feature having a first height; and
a second conductive feature electrically coupling the second word line to the interconnect structure, the second conductive feature having a second height greater than the first height.

11. The device of claim 8, wherein the logic die further comprises:
a source/drain region; and
a backside via extending through the semiconductor substrate and electrically coupled to the source/drain region, wherein the backside via is physically between the source/drain region and the memory array.

12. The device of claim 11, wherein the backside via is directly bonded to the interconnect structure.

13. The device of claim 8, wherein the logic die comprises circuits configured to perform read and write operations in the memory array.

14. A device comprising:
a first die comprising a semiconductor substrate;
a first interconnect structure on the first die; and
a memory array on the first interconnect structure, the memory array comprising a plurality of pairs of layers, wherein each pair of layers comprises a dielectric layer and a conductive layer, wherein a length of the pairs of layers closer to the first interconnect structure are shorter than a length of the pairs of layers further from first the interconnect structure, wherein the conductive layer of each pair of layers is electrically coupled to a respective conductive feature of the first interconnect structure, wherein the conductive layer of each pair of layers form a word line of the memory array, wherein the plurality of pairs of layers comprises an upper pair of layers and a lower pair of layers, wherein the memory array comprises a gate dielectric contacting and extending continuously from the conductive layer of the upper pair of lavers to the conductive layer of the lower pair of layers.

15. The device of claim 14, wherein the first die is bonded to the first interconnect structure with dielectric-to-dielectric bonds and metal-to-metal bonds.

16. The device of claim 14, wherein the first die comprises a backside via extending between a backside of the semiconductor substrate and a bottom of a source/drain region of a first transistor, wherein the bottom of the source/drain region faces the first interconnect structure, wherein the backside via is bonded to the first interconnect structure.

17. The device of claim 16, wherein the first die comprises a bonding layer on the semiconductor substrate adjacent the backside via, wherein the bonding layer is bonded to the first interconnect structure by dielectric-to-dielectric bonds.

18. The device of claim 14, wherein the first die comprises:
- a gate structure and a first source/drain region on a semiconductor substrate; and
- a front-side interconnect structure on the gate structure and the first source/drain region opposite the semiconductor substrate, wherein the first interconnect structure is bonded to the front-side interconnect structure.

19. The device of claim 14, wherein the memory array comprises a dielectric fill layer over the plurality of pairs of layers.

20. The device of claim 19, wherein the memory array comprises a word line contact extending from an upper surface of the dielectric fill layer to a bottom conductive layer of a bottom pair of the plurality of pairs of layers.

* * * * *